US010475379B2

(12) United States Patent
Chaji

(10) Patent No.: US 10,475,379 B2
(45) Date of Patent: Nov. 12, 2019

(54) CHARGED-BASED COMPENSATION AND PARAMETER EXTRACTION IN AMOLED DISPLAYS

(71) Applicant: Ignis Innovation Inc., Waterloo (CA)

(72) Inventor: Gholamreza Chaji, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 375 days.

(21) Appl. No.: 15/350,642

(22) Filed: Nov. 14, 2016

(65) Prior Publication Data

US 2017/0061881 A1 Mar. 2, 2017

Related U.S. Application Data

(63) Continuation of application No. 14/447,323, filed on Jul. 30, 2014, now Pat. No. 9,530,349, which is a (Continued)

(51) Int. Cl.

*G01R 31/00* (2006.01)
*G09G 3/3233* (2016.01)
*G09G 3/3258* (2016.01)

(52) U.S. Cl.

CPC ......... *G09G 3/3233* (2013.01); *G09G 3/3258* (2013.01); *G09G 2230/00* (2013.01);

(Continued)

(58) Field of Classification Search

CPC ............... G09G 3/3233; G09G 3/3258; G09G 2320/043; G09G 2330/10;

(Continued)

(56) References Cited

U.S. PATENT DOCUMENTS 3,506,851 A 4/1970 Polkinghorn
3,774,055 A 11/1973 Bapat (Continued)

FOREIGN PATENT DOCUMENTS

CA 1 294 034 1/1992
CA 2 109 951 11/1992

(Continued)

OTHER PUBLICATIONS

Ahnood : "Effect of threshold voltage instability on field effect mobility in thin film transistors deduced from constant current measurements"; dated Aug. 2009.

(Continued)

*Primary Examiner* — Melissa J Koval
*Assistant Examiner* — Courtney G McDonnough
(74) *Attorney, Agent, or Firm* — Stratford Managers Corporation

(57) ABSTRACT

A system reads a desired circuit parameter from a pixel circuit that includes a light emitting device, a drive device to provide a programmable drive current to the light emitting device, a programming input, and a storage device to store a programming signal. One embodiment of the extraction system turns off the drive device and supplies a predetermined voltage from an external source to the light emitting device, discharges the light emitting device until the light emitting device turns off, and then reads the voltage on the light emitting device while that device is turned off. The voltages on the light emitting devices in a plurality of pixel circuits may be read via the same external line, at different times. In-pixel, charge-based compensation schemes are also discussed, which can be used with the external parameter extraction implementations.

19 Claims, 44 Drawing Sheets

Related U.S. Application Data continuation-in-part of application No. 14/093,758, filed on Dec. 2, 2013, now Pat. No. 9,799,246, which is a continuation-in-part of application No. 13/835,124, filed on Mar. 15, 2013, now Pat. No. 8,599,191, which is a continuation-in-part of application No. 13/112,468, filed on May 20, 2011, now Pat. No. 8,576,217.

(60) Provisional application No. 61/869,327, filed on Aug. 23, 2013, provisional application No. 61/859,963, filed on Jul. 30, 2013, provisional application No. 61/912,352, filed on Dec. 5, 2013, provisional application No. 61/913,002, filed on Dec. 6, 2013, provisional application No. 61/947,105, filed on Mar. 3, 2014, provisional application No. 61/975,479, filed on Apr. 4, 2014.

(52) U.S. Cl.
CPC ... *G09G 2300/043* (2013.01); *G09G 2300/08* (2013.01); *G09G 2300/0819* (2013.01); *G09G 2300/0842* (2013.01); *G09G 2300/0861* (2013.01); *G09G 2310/0248* (2013.01); *G09G 2310/0289* (2013.01); *G09G 2310/0291* (2013.01); *G09G 2320/029* (2013.01); *G09G 2320/043* (2013.01); *G09G 2330/10* (2013.01)

(58) Field of Classification Search
CPC ... G09G 2300/0842; G09G 2310/0248; G09G 2300/08; G09G 2230/00; G09G 2300/0819; G09G 2300/0861; G09G 2310/0289; G09G 2310/0291; G09G 2320/029
USPC .......................................................... 324/537
See application file for complete search history.

(56) References Cited

U.S. PATENT DOCUMENTS

| | | | | |
|---|---|---|---|---|
| 4,090,096 | A | | 5/1978 | Nagami |
| 4,160,934 | A | | 7/1979 | Kirsch |
| 4,295,091 | A | | 10/1981 | Ponkala |
| 4,354,162 | A | | 10/1982 | Wright |
| 4,943,956 | A | | 7/1990 | Noro |
| 4,996,523 | A | | 2/1991 | Bell |
| 5,153,420 | A | | 10/1992 | Hack |
| 5,198,803 | A | | 3/1993 | Shie |
| 5,204,661 | A | | 4/1993 | Hack |
| 5,266,515 | A | | 11/1993 | Robb |
| 5,489,918 | A | | 2/1996 | Mosier |
| 5,498,880 | A | | 3/1996 | Lee |
| 5,557,342 | A | | 9/1996 | Eto |
| 5,561,381 | A | | 10/1996 | Jenkins et al. |
| 5,572,444 | A | | 11/1996 | Lentz |
| 5,589,847 | A | | 12/1996 | Lewis |
| 5,619,033 | A | | 4/1997 | Weisfield |
| 5,648,276 | A | | 7/1997 | Hara |
| 5,670,973 | A | | 9/1997 | Bassetti |
| 5,684,365 | A | | 11/1997 | Tang |
| 5,691,783 | A | | 11/1997 | Numao |
| 5,714,968 | A | | 2/1998 | Ikeda |
| 5,723,950 | A | | 3/1998 | Wei |
| 5,744,824 | A | | 4/1998 | Kousai |
| 5,745,660 | A | | 4/1998 | Kolpatzik |
| 5,748,160 | A | | 5/1998 | Shieh |
| 5,815,303 | A | | 9/1998 | Berlin |
| 5,870,071 | A | | 2/1999 | Kawahata |
| 5,874,803 | A | | 2/1999 | Garbuzov |
| 5,880,582 | A | | 3/1999 | Sawada |
| 5,903,248 | A | | 5/1999 | Irwin |
| 5,917,280 | A | | 6/1999 | Burrows |
| 5,923,794 | A | | 7/1999 | McGrath |
| 5,945,972 | A | | 8/1999 | Okumura |
| 5,949,398 | A | | 9/1999 | Kim |
| 5,952,789 | A | * | 9/1999 | Stewart ................ G09G 3/3233 315/169.1 |
| 5,952,991 | A | | 9/1999 | Akiyama |
| 5,982,104 | A | | 11/1999 | Sasaki |
| 5,990,629 | A | | 11/1999 | Yamada |
| 6,023,259 | A | | 2/2000 | Howard |
| 6,069,365 | A | | 5/2000 | Chow |
| 6,091,203 | A | | 7/2000 | Kawashima |
| 6,097,360 | A | | 8/2000 | Holloman |
| 6,144,222 | A | | 11/2000 | Ho |
| 6,177,915 | B1 | | 1/2001 | Beeteson |
| 6,229,506 | B1 | | 5/2001 | Dawson |
| 6,229,508 | B1 | | 5/2001 | Kane |
| 6,246,180 | B1 | | 6/2001 | Nishigaki |
| 6,252,248 | B1 | | 6/2001 | Sano |
| 6,259,424 | B1 | | 7/2001 | Kurogane |
| 6,262,589 | B1 | | 7/2001 | Tamukai |
| 6,271,825 | B1 | | 8/2001 | Greene |
| 6,288,696 | B1 | | 9/2001 | Holloman |
| 6,304,039 | B1 | | 10/2001 | Appelberg |
| 6,307,322 | B1 | | 10/2001 | Dawson |
| 6,310,962 | B1 | | 10/2001 | Chung |
| 6,320,325 | B1 | | 11/2001 | Cok |
| 6,323,631 | B1 | | 11/2001 | Juang |
| 6,329,971 | B2 | | 12/2001 | McKnight |
| 6,356,029 | B1 | | 3/2002 | Hunter |
| 6,373,454 | B1 | | 4/2002 | Knapp |
| 6,377,237 | B1 | | 4/2002 | Sojourner |
| 6,392,617 | B1 | | 5/2002 | Gleason |
| 6,404,139 | B1 | | 6/2002 | Sasaki et al. |
| 6,414,661 | B1 | | 7/2002 | Shen |
| 6,417,825 | B1 | | 7/2002 | Stewart |
| 6,433,488 | B1 | | 8/2002 | Bu |
| 6,437,106 | B1 | | 8/2002 | Stoner |
| 6,445,369 | B1 | | 9/2002 | Yang |
| 6,475,845 | B2 | | 11/2002 | Kimura |
| 6,501,098 | B2 | | 12/2002 | Yamazaki |
| 6,501,466 | B1 | | 12/2002 | Yamagishi |
| 6,518,962 | B2 | | 2/2003 | Kimura |
| 6,522,315 | B2 | | 2/2003 | Ozawa |
| 6,525,683 | B1 | | 2/2003 | Gu |
| 6,531,827 | B2 | | 3/2003 | Kawashima |
| 6,541,921 | B1 | | 4/2003 | Luciano, Jr. et al. |
| 6,542,138 | B1 | | 4/2003 | Shannon |
| 6,555,420 | B1 | | 4/2003 | Yamazaki |
| 6,577,302 | B2 | | 6/2003 | Hunter |
| 6,580,408 | B1 | | 6/2003 | Bae |
| 6,580,657 | B2 | | 6/2003 | Sanford |
| 6,583,398 | B2 | | 6/2003 | Harkin |
| 6,583,775 | B1 | | 6/2003 | Sekiya |
| 6,594,606 | B2 | | 7/2003 | Everitt |
| 6,618,030 | B2 | | 9/2003 | Kane |
| 6,639,244 | B1 | | 10/2003 | Yamazaki |
| 6,668,645 | B1 | | 12/2003 | Gilmour |
| 6,677,713 | B1 | | 1/2004 | Sung |
| 6,680,580 | B1 | | 1/2004 | Sung |
| 6,687,266 | B1 | | 2/2004 | Ma |
| 6,690,000 | B1 | | 2/2004 | Muramatsu |
| 6,690,344 | B1 | | 2/2004 | Takeuchi |
| 6,693,388 | B2 | | 2/2004 | Oomura |
| 6,693,610 | B2 | | 2/2004 | Shannon |
| 6,697,057 | B2 | | 2/2004 | Koyama |
| 6,720,942 | B2 | | 4/2004 | Lee |
| 6,724,151 | B2 | | 4/2004 | Yoo |
| 6,734,636 | B2 | | 5/2004 | Sanford |
| 6,738,034 | B2 | | 5/2004 | Kaneko |
| 6,738,035 | B1 | | 5/2004 | Fan |
| 6,753,655 | B2 | | 6/2004 | Shih |
| 6,753,834 | B2 | | 6/2004 | Mikami |
| 6,756,741 | B2 | | 6/2004 | Li |
| 6,756,952 | B1 | | 6/2004 | Decaux |
| 6,756,958 | B2 | | 6/2004 | Furuhashi |
| 6,765,549 | B1 | | 7/2004 | Yamazaki et al. |
| 6,771,028 | B1 | | 8/2004 | Winters |
| 6,777,712 | B2 | | 8/2004 | Sanford |
| 6,777,888 | B2 | | 8/2004 | Kondo |

(56) References Cited

U.S. PATENT DOCUMENTS

| | | | |
|---|---|---|---|
| 6,781,567 | B2 | 8/2004 | Kimura |
| 6,806,497 | B2 | 10/2004 | Jo |
| 6,806,638 | B2 | 10/2004 | Lih et al. |
| 6,806,857 | B2 | 10/2004 | Sempel |
| 6,809,706 | B2 | 10/2004 | Shimoda |
| 6,815,975 | B2 | 11/2004 | Nara |
| 6,828,950 | B2 | 12/2004 | Koyama |
| 6,853,371 | B2 | 2/2005 | Miyajima |
| 6,859,193 | B1 | 2/2005 | Yumoto |
| 6,873,117 | B2 | 3/2005 | Ishizuka |
| 6,876,346 | B2 | 4/2005 | Anzai |
| 6,885,356 | B2 | 4/2005 | Hashimoto |
| 6,900,485 | B2 | 5/2005 | Lee |
| 6,903,734 | B2 | 6/2005 | Eu |
| 6,909,243 | B2 | 6/2005 | Inukai |
| 6,909,419 | B2 | 6/2005 | Zavracky |
| 6,911,960 | B1 | 6/2005 | Yokoyama |
| 6,911,964 | B2 | 6/2005 | Lee |
| 6,914,448 | B2 | 7/2005 | Jinno |
| 6,919,871 | B2 | 7/2005 | Kwon |
| 6,924,602 | B2 | 8/2005 | Komiya |
| 6,937,215 | B2 | 8/2005 | Lo |
| 6,937,220 | B2 | 8/2005 | Kitaura |
| 6,940,214 | B1 | 9/2005 | Komiya |
| 6,943,500 | B2 | 9/2005 | LeChevalier |
| 6,947,022 | B2 | 9/2005 | McCartney |
| 6,954,194 | B2 | 10/2005 | Matsumoto |
| 6,956,547 | B2 | 10/2005 | Bae |
| 6,975,142 | B2 | 12/2005 | Azami |
| 6,975,332 | B2 | 12/2005 | Arnold |
| 6,995,510 | B2 | 2/2006 | Murakami |
| 6,995,519 | B2 | 2/2006 | Arnold |
| 7,023,408 | B2 | 4/2006 | Chen |
| 7,027,015 | B2 | 4/2006 | Booth, Jr. |
| 7,027,078 | B2 | 4/2006 | Reihl |
| 7,034,793 | B2 | 4/2006 | Sekiya |
| 7,038,392 | B2 | 5/2006 | Libsch |
| 7,053,875 | B2 | 5/2006 | Chou |
| 7,057,359 | B2 | 6/2006 | Hung |
| 7,061,451 | B2 | 6/2006 | Kimura |
| 7,064,733 | B2 | 6/2006 | Cok |
| 7,071,932 | B2 | 7/2006 | Libsch |
| 7,088,051 | B1 | 8/2006 | Cok |
| 7,088,052 | B2 | 8/2006 | Kimura |
| 7,102,378 | B2 | 9/2006 | Kuo |
| 7,106,285 | B2 | 9/2006 | Naugler |
| 7,112,820 | B2 | 9/2006 | Chang |
| 7,116,058 | B2 | 10/2006 | Lo |
| 7,119,493 | B2 | 10/2006 | Fryer |
| 7,122,835 | B1 | 10/2006 | Ikeda |
| 7,127,380 | B1 | 10/2006 | Iverson |
| 7,129,914 | B2 | 10/2006 | Knapp |
| 7,161,566 | B2 | 1/2007 | Cok |
| 7,164,417 | B2 | 1/2007 | Cok |
| 7,193,589 | B2 | 3/2007 | Yoshida |
| 7,224,332 | B2 | 5/2007 | Cok |
| 7,227,519 | B1 | 6/2007 | Kawase |
| 7,245,277 | B2 | 7/2007 | Ishizuka |
| 7,246,912 | B2 | 7/2007 | Burger et al. |
| 7,248,236 | B2 | 7/2007 | Nathan |
| 7,262,753 | B2 | 8/2007 | Tanghe |
| 7,274,363 | B2 | 9/2007 | Ishizuka |
| 7,310,092 | B2 | 12/2007 | Imamura |
| 7,315,295 | B2 | 1/2008 | Kimura |
| 7,321,348 | B2 | 1/2008 | Cok |
| 7,339,560 | B2 | 3/2008 | Sun |
| 7,355,574 | B1 | 4/2008 | Leon |
| 7,358,941 | B2 | 4/2008 | Ono |
| 7,368,868 | B2 | 5/2008 | Sakamoto |
| 7,397,485 | B2 | 7/2008 | Miller |
| 7,411,571 | B2 | 8/2008 | Huh |
| 7,414,600 | B2 | 8/2008 | Nathan |
| 7,423,617 | B2 | 9/2008 | Giraldo |
| 7,453,054 | B2 | 11/2008 | Lee |
| 7,474,285 | B2 | 1/2009 | Kimura |
| 7,502,000 | B2 | 3/2009 | Yuki |
| 7,528,812 | B2 | 5/2009 | Tsuge |
| 7,535,449 | B2 | 5/2009 | Miyazawa |
| 7,554,512 | B2 | 6/2009 | Steer |
| 7,569,849 | B2 | 8/2009 | Nathan |
| 7,576,718 | B2 | 8/2009 | Miyazawa |
| 7,580,012 | B2 | 8/2009 | Kim |
| 7,589,707 | B2 | 9/2009 | Chou |
| 7,605,792 | B2 | 10/2009 | Son |
| 7,609,239 | B2 | 10/2009 | Chang |
| 7,619,594 | B2 | 11/2009 | Hu |
| 7,619,597 | B2 | 11/2009 | Nathan |
| 7,633,470 | B2 | 12/2009 | Kane |
| 7,656,370 | B2 | 2/2010 | Schneider |
| 7,675,485 | B2 | 3/2010 | Steer |
| 7,800,558 | B2 | 9/2010 | Routley |
| 7,847,764 | B2 | 12/2010 | Cok |
| 7,859,492 | B2 | 12/2010 | Kohno |
| 7,868,859 | B2 | 1/2011 | Tomida |
| 7,876,294 | B2 | 1/2011 | Sasaki |
| 7,924,249 | B2 | 4/2011 | Nathan |
| 7,932,883 | B2 | 4/2011 | Klompenhouwer |
| 7,969,390 | B2 | 6/2011 | Yoshida |
| 7,978,187 | B2 | 7/2011 | Nathan |
| 7,994,712 | B2 | 8/2011 | Sung |
| 8,026,876 | B2 | 9/2011 | Nathan |
| 8,031,180 | B2 | 10/2011 | Miyamoto et al. |
| 8,049,420 | B2 | 11/2011 | Tamura |
| 8,077,123 | B2 | 12/2011 | Naugler, Jr. |
| 8,115,707 | B2 | 2/2012 | Nathan |
| 8,208,084 | B2 | 6/2012 | Lin |
| 8,223,177 | B2 | 7/2012 | Nathan |
| 8,232,939 | B2 | 7/2012 | Nathan |
| 8,259,044 | B2 | 9/2012 | Nathan |
| 8,264,431 | B2 | 9/2012 | Bulovic |
| 8,279,143 | B2 | 10/2012 | Nathan |
| 8,294,696 | B2 | 10/2012 | Min et al. |
| 8,314,783 | B2 | 11/2012 | Sambandan et al. |
| 8,339,386 | B2 | 12/2012 | Leon |
| 8,441,206 | B2 | 5/2013 | Myers |
| 8,493,296 | B2 | 7/2013 | Ogawa |
| 8,581,809 | B2 | 11/2013 | Nathan et al. |
| 9,125,278 | B2 | 9/2015 | Nathan et al. |
| 2001/0002703 | A1 | 6/2001 | Koyama |
| 2001/0009283 | A1 | 7/2001 | Arao |
| 2001/0024181 | A1 | 9/2001 | Kubota |
| 2001/0024186 | A1 | 9/2001 | Kane |
| 2001/0026257 | A1 | 10/2001 | Kimura |
| 2001/0030323 | A1 | 10/2001 | Ikeda |
| 2001/0035863 | A1 | 11/2001 | Kimura |
| 2001/0038367 | A1 | 11/2001 | Inukai |
| 2001/0040541 | A1 | 11/2001 | Yoneda |
| 2001/0043173 | A1 | 11/2001 | Troutman |
| 2001/0045929 | A1 | 11/2001 | Prache |
| 2001/0052606 | A1 | 12/2001 | Sempel |
| 2001/0052940 | A1 | 12/2001 | Hagihara |
| 2002/0000576 | A1 | 1/2002 | Inukai |
| 2002/0011796 | A1 | 1/2002 | Koyama |
| 2002/0011799 | A1 | 1/2002 | Kimura |
| 2002/0012057 | A1 | 1/2002 | Kimura |
| 2002/0014851 | A1 | 2/2002 | Tai |
| 2002/0018034 | A1 | 2/2002 | Ohki |
| 2002/0030190 | A1 | 3/2002 | Ohtani |
| 2002/0047565 | A1 | 4/2002 | Nara |
| 2002/0052086 | A1 | 5/2002 | Maeda |
| 2002/0067134 | A1 | 6/2002 | Kawashima |
| 2002/0084463 | A1 | 7/2002 | Sanford |
| 2002/0101152 | A1 | 8/2002 | Kimura |
| 2002/0101172 | A1 | 8/2002 | Bu |
| 2002/0105279 | A1 | 8/2002 | Kimura |
| 2002/0117722 | A1 | 8/2002 | Osada |
| 2002/0122308 | A1 | 9/2002 | Ikeda |
| 2002/0158587 | A1 | 10/2002 | Komiya |
| 2002/0158666 | A1 | 10/2002 | Azami |
| 2002/0158823 | A1 | 10/2002 | Zavracky |
| 2002/0167471 | A1 | 11/2002 | Everitt |
| 2002/0167474 | A1 | 11/2002 | Everitt |
| 2002/0169575 | A1 | 11/2002 | Everitt |
| 2002/0180369 | A1 | 12/2002 | Koyama |

(56) References Cited

U.S. PATENT DOCUMENTS

| | | | |
|---|---|---|---|
| 2002/0180721 | A1 | 12/2002 | Kimura |
| 2002/0181276 | A1 | 12/2002 | Yamazaki |
| 2002/0183945 | A1 | 12/2002 | Everitt |
| 2002/0186214 | A1 | 12/2002 | Siwinski |
| 2002/0190924 | A1 | 12/2002 | Asano |
| 2002/0190971 | A1 | 12/2002 | Nakamura |
| 2002/0195967 | A1 | 12/2002 | Kim |
| 2002/0195968 | A1 | 12/2002 | Sanford |
| 2003/0020413 | A1 | 1/2003 | Oomura |
| 2003/0030603 | A1 | 2/2003 | Shimoda |
| 2003/0043088 | A1 | 3/2003 | Booth |
| 2003/0057895 | A1 | 3/2003 | Kimura |
| 2003/0058226 | A1 | 3/2003 | Bertram |
| 2003/0062524 | A1 | 4/2003 | Kimura |
| 2003/0063081 | A1 | 4/2003 | Kimura |
| 2003/0071821 | A1 | 4/2003 | Sundahl |
| 2003/0076048 | A1 | 4/2003 | Rutherford |
| 2003/0090447 | A1 | 5/2003 | Kimura |
| 2003/0090481 | A1 | 5/2003 | Kimura |
| 2003/0107560 | A1 | 6/2003 | Yumoto |
| 2003/0111966 | A1 | 6/2003 | Mikami |
| 2003/0122745 | A1 | 7/2003 | Miyazawa |
| 2003/0122749 | A1 | 7/2003 | Booth, Jr. et al. |
| 2003/0122813 | A1 | 7/2003 | Ishizuki |
| 2003/0142088 | A1 | 7/2003 | LeChevalier |
| 2003/0146897 | A1 | 8/2003 | Hunter |
| 2003/0151569 | A1 | 8/2003 | Lee |
| 2003/0156101 | A1 | 8/2003 | Le Chevalier |
| 2003/0169241 | A1 | 9/2003 | LeChevalier |
| 2003/0174152 | A1 | 9/2003 | Noguchi |
| 2003/0179626 | A1 | 9/2003 | Sanford |
| 2003/0185438 | A1 | 10/2003 | Osawa |
| 2003/0197663 | A1 | 10/2003 | Lee |
| 2003/0210256 | A1 | 11/2003 | Mori |
| 2003/0230141 | A1 | 12/2003 | Gilmour |
| 2003/0230980 | A1 | 12/2003 | Forrest |
| 2003/0231148 | A1 | 12/2003 | Lin |
| 2004/0032382 | A1 | 2/2004 | Cok |
| 2004/0041750 | A1 | 3/2004 | Abe |
| 2004/0066357 | A1 | 4/2004 | Kawasaki |
| 2004/0070557 | A1 | 4/2004 | Asano |
| 2004/0070565 | A1 | 4/2004 | Nayar |
| 2004/0090186 | A1 | 5/2004 | Kanauchi |
| 2004/0090400 | A1 | 5/2004 | Yoo |
| 2004/0095297 | A1 | 5/2004 | Libsch |
| 2004/0100427 | A1 | 5/2004 | Miyazawa |
| 2004/0108518 | A1 | 6/2004 | Jo |
| 2004/0135749 | A1 | 7/2004 | Kondakov |
| 2004/0140982 | A1 | 7/2004 | Pate |
| 2004/0145547 | A1 | 7/2004 | Oh |
| 2004/0150592 | A1 | 8/2004 | Mizukoshi |
| 2004/0150594 | A1 | 8/2004 | Koyama |
| 2004/0150595 | A1 | 8/2004 | Kasai |
| 2004/0155841 | A1 | 8/2004 | Kasai |
| 2004/0174347 | A1 | 9/2004 | Sun |
| 2004/0174349 | A1 | 9/2004 | Libsch |
| 2004/0174354 | A1 | 9/2004 | Ono |
| 2004/0178743 | A1 | 9/2004 | Miller |
| 2004/0183759 | A1 | 9/2004 | Stevenson |
| 2004/0196275 | A1 | 10/2004 | Hattori |
| 2004/0207615 | A1 | 10/2004 | Yumoto |
| 2004/0227697 | A1 | 11/2004 | Mori |
| 2004/0233125 | A1 | 11/2004 | Tanghe |
| 2004/0239596 | A1 | 12/2004 | Ono |
| 2004/0246246 | A1 | 12/2004 | Tobita |
| 2004/0252089 | A1 | 12/2004 | Ono |
| 2004/0257313 | A1 | 12/2004 | Kawashima |
| 2004/0257353 | A1 | 12/2004 | Imamura |
| 2004/0257355 | A1 | 12/2004 | Naugler |
| 2004/0263437 | A1 | 12/2004 | Hattori |
| 2004/0263444 | A1 | 12/2004 | Kimura |
| 2004/0263445 | A1 | 12/2004 | Inukai |
| 2004/0263541 | A1 | 12/2004 | Takeuchi |
| 2005/0007355 | A1 | 1/2005 | Miura |
| 2005/0007357 | A1 | 1/2005 | Yamashita |
| 2005/0007392 | A1 | 1/2005 | Kasai |
| 2005/0017650 | A1 | 1/2005 | Fryer |
| 2005/0024081 | A1 | 2/2005 | Kuo |
| 2005/0024393 | A1 | 2/2005 | Kondo |
| 2005/0030267 | A1 | 2/2005 | Tanghe |
| 2005/0057484 | A1 | 3/2005 | Diefenbaugh |
| 2005/0057580 | A1 | 3/2005 | Yamano |
| 2005/0067970 | A1 | 3/2005 | Libsch |
| 2005/0067971 | A1 | 3/2005 | Kane |
| 2005/0068270 | A1 | 3/2005 | Awakura |
| 2005/0068275 | A1 | 3/2005 | Kane |
| 2005/0073264 | A1 | 4/2005 | Matsumoto |
| 2005/0083323 | A1 | 4/2005 | Suzuki |
| 2005/0088103 | A1 | 4/2005 | Kageyama |
| 2005/0105031 | A1 | 5/2005 | Shih |
| 2005/0110420 | A1 | 5/2005 | Arnold |
| 2005/0110807 | A1 | 5/2005 | Chang |
| 2005/0122294 | A1 | 6/2005 | Ben-David |
| 2005/0140598 | A1 | 6/2005 | Kim |
| 2005/0140610 | A1 | 6/2005 | Smith |
| 2005/0145891 | A1 | 7/2005 | Abe |
| 2005/0156831 | A1 | 7/2005 | Yamazaki |
| 2005/0162079 | A1 | 7/2005 | Sakamoto |
| 2005/0168416 | A1 | 8/2005 | Hashimoto |
| 2005/0179626 | A1 | 8/2005 | Yuki |
| 2005/0179628 | A1 | 8/2005 | Kimura |
| 2005/0185200 | A1 | 8/2005 | Tobol |
| 2005/0200575 | A1 | 9/2005 | Kim |
| 2005/0206590 | A1 | 9/2005 | Sasaki |
| 2005/0212787 | A1 | 9/2005 | Noguchi |
| 2005/0219184 | A1 | 10/2005 | Zehner |
| 2005/0225683 | A1 | 10/2005 | Nozawa |
| 2005/0248515 | A1 | 11/2005 | Naugler |
| 2005/0269959 | A1 | 12/2005 | Uchino |
| 2005/0269960 | A1 | 12/2005 | Ono |
| 2005/0280615 | A1 | 12/2005 | Cok |
| 2005/0280766 | A1 | 12/2005 | Johnson |
| 2005/0285822 | A1 | 12/2005 | Reddy |
| 2005/0285825 | A1 | 12/2005 | Eom |
| 2006/0001613 | A1 | 1/2006 | Routley |
| 2006/0007072 | A1 | 1/2006 | Choi |
| 2006/0007206 | A1 | 1/2006 | Reddy et al. |
| 2006/0007249 | A1 | 1/2006 | Reddy |
| 2006/0012310 | A1 | 1/2006 | Chen |
| 2006/0012311 | A1 | 1/2006 | Ogawa |
| 2006/0015272 | A1 | 1/2006 | Giraldo et al. |
| 2006/0022305 | A1 | 2/2006 | Yamashita |
| 2006/0022907 | A1 | 2/2006 | Uchino et al. |
| 2006/0027807 | A1 | 2/2006 | Nathan |
| 2006/0030084 | A1 | 2/2006 | Young |
| 2006/0038501 | A1 | 2/2006 | Koyama et al. |
| 2006/0038758 | A1 | 2/2006 | Routley |
| 2006/0038762 | A1 | 2/2006 | Chou |
| 2006/0044227 | A1 | 3/2006 | Hadcock |
| 2006/0061248 | A1 | 3/2006 | Cok |
| 2006/0066533 | A1 | 3/2006 | Sato |
| 2006/0077134 | A1 | 4/2006 | Hector et al. |
| 2006/0077135 | A1 | 4/2006 | Cok |
| 2006/0077142 | A1 | 4/2006 | Kwon |
| 2006/0082523 | A1 | 4/2006 | Guo |
| 2006/0092185 | A1 | 5/2006 | Jo |
| 2006/0097628 | A1 | 5/2006 | Suh |
| 2006/0097631 | A1 | 5/2006 | Lee |
| 2006/0103324 | A1 | 5/2006 | Kim et al. |
| 2006/0103611 | A1 | 5/2006 | Choi |
| 2006/0125740 | A1 | 6/2006 | Shirasaki et al. |
| 2006/0149493 | A1 | 7/2006 | Sambandan |
| 2006/0158402 | A1 * | 7/2006 | Nathan ................ G09G 3/3233 345/82 |
| 2006/0170623 | A1 | 8/2006 | Naugler, Jr. |
| 2006/0176250 | A1 | 8/2006 | Nathan |
| 2006/0208961 | A1 | 9/2006 | Nathan |
| 2006/0208971 | A1 | 9/2006 | Deane |
| 2006/0214888 | A1 | 9/2006 | Schneider |
| 2006/0231740 | A1 | 10/2006 | Kasai |
| 2006/0232522 | A1 | 10/2006 | Roy |
| 2006/0244697 | A1 | 11/2006 | Lee |
| 2006/0256048 | A1 | 11/2006 | Fish et al. |
| 2006/0261841 | A1 | 11/2006 | Fish |

(56) References Cited

U.S. PATENT DOCUMENTS

| | | | | |
|---|---|---|---|---|
| 2006/0273997 | A1 | 12/2006 | Nathan | |
| 2006/0279481 | A1 | 12/2006 | Haruna | |
| 2006/0284801 | A1 | 12/2006 | Yoon | |
| 2006/0284802 | A1 | 12/2006 | Kohno | |
| 2006/0284895 | A1 | 12/2006 | Marcu | |
| 2006/0290614 | A1 | 12/2006 | Nathan | |
| 2006/0290618 | A1 | 12/2006 | Goto | |
| 2007/0001937 | A1 | 1/2007 | Park | |
| 2007/0001939 | A1 | 1/2007 | Hashimoto | |
| 2007/0008251 | A1 | 1/2007 | Kohno | |
| 2007/0008268 | A1 | 1/2007 | Park | |
| 2007/0008297 | A1 | 1/2007 | Bassetti | |
| 2007/0057873 | A1 | 3/2007 | Uchino | |
| 2007/0057874 | A1 | 3/2007 | Le Roy | |
| 2007/0069998 | A1 | 3/2007 | Naugler | |
| 2007/0075727 | A1 | 4/2007 | Nakano | |
| 2007/0076226 | A1 | 4/2007 | Klompenhouwer | |
| 2007/0080905 | A1 | 4/2007 | Takahara | |
| 2007/0080906 | A1 | 4/2007 | Tanabe | |
| 2007/0080908 | A1 | 4/2007 | Nathan | |
| 2007/0097038 | A1 | 5/2007 | Yamazaki | |
| 2007/0097041 | A1 | 5/2007 | Park | |
| 2007/0103411 | A1 | 5/2007 | Cok et al. | |
| 2007/0103419 | A1 | 5/2007 | Uchino | |
| 2007/0115221 | A1 | 5/2007 | Buchhauser | |
| 2007/0126672 | A1 | 6/2007 | Tada et al. | |
| 2007/0164664 | A1 | 7/2007 | Ludwicki | |
| 2007/0164937 | A1 | 7/2007 | Jung et al. | |
| 2007/0164938 | A1 | 7/2007 | Shin | |
| 2007/0182671 | A1 | 8/2007 | Nathan | |
| 2007/0236134 | A1 | 10/2007 | Ho | |
| 2007/0236440 | A1 | 10/2007 | Wacyk | |
| 2007/0236517 | A1 | 10/2007 | Kimpe | |
| 2007/0241999 | A1 | 10/2007 | Lin | |
| 2007/0273294 | A1 | 11/2007 | Nagayama | |
| 2007/0285359 | A1 | 12/2007 | Ono | |
| 2007/0290957 | A1 | 12/2007 | Cok | |
| 2007/0290958 | A1 | 12/2007 | Cok | |
| 2007/0296672 | A1 | 12/2007 | Kim | |
| 2008/0001525 | A1 | 1/2008 | Chao | |
| 2008/0001544 | A1 | 1/2008 | Murakami | |
| 2008/0030518 | A1 | 2/2008 | Higgins | |
| 2008/0036706 | A1 | 2/2008 | Kitazawa | |
| 2008/0036708 | A1 | 2/2008 | Shirasaki | |
| 2008/0042942 | A1 | 2/2008 | Takahashi | |
| 2008/0042948 | A1 | 2/2008 | Yamashita | |
| 2008/0048951 | A1 | 2/2008 | Naugler, Jr. | |
| 2008/0055209 | A1 | 3/2008 | Cok | |
| 2008/0055211 | A1 | 3/2008 | Ogawa | |
| 2008/0074413 | A1 | 3/2008 | Ogura | |
| 2008/0088549 | A1 * | 4/2008 | Nathan | ................ G09G 3/3233 345/80 |
| 2008/0088648 | A1 | 4/2008 | Nathan | |
| 2008/0111766 | A1 | 5/2008 | Uchino | |
| 2008/0116787 | A1 | 5/2008 | Hsu | |
| 2008/0117144 | A1 | 5/2008 | Nakano et al. | |
| 2008/0136770 | A1 | 6/2008 | Peker et al. | |
| 2008/0150845 | A1 | 6/2008 | Ishii | |
| 2008/0150847 | A1 | 6/2008 | Kim | |
| 2008/0158115 | A1 | 7/2008 | Cordes | |
| 2008/0158648 | A1 | 7/2008 | Cummings | |
| 2008/0191976 | A1 | 8/2008 | Nathan | |
| 2008/0198103 | A1 | 8/2008 | Toyomura | |
| 2008/0211749 | A1 | 9/2008 | Weitbruch | |
| 2008/0218451 | A1 | 9/2008 | Miyamoto | |
| 2008/0231558 | A1 | 9/2008 | Naugler | |
| 2008/0231562 | A1 | 9/2008 | Kwon | |
| 2008/0231625 | A1 | 9/2008 | Minami | |
| 2008/0246713 | A1 | 10/2008 | Lee | |
| 2008/0252223 | A1 | 10/2008 | Toyoda | |
| 2008/0252571 | A1 | 10/2008 | Hente | |
| 2008/0259020 | A1 | 10/2008 | Fisekovic | |
| 2008/0290805 | A1 | 11/2008 | Yamada | |
| 2008/0297055 | A1 | 12/2008 | Miyake | |
| 2009/0033598 | A1 | 2/2009 | Suh | |
| 2009/0058772 | A1 | 3/2009 | Lee | |
| 2009/0109142 | A1 | 4/2009 | Takahara | |
| 2009/0121994 | A1 | 5/2009 | Miyata | |
| 2009/0146926 | A1 | 6/2009 | Sung | |
| 2009/0160743 | A1 | 6/2009 | Tomida | |
| 2009/0174628 | A1 | 7/2009 | Wang | |
| 2009/0184901 | A1 | 7/2009 | Kwon | |
| 2009/0195483 | A1 | 8/2009 | Naugler, Jr. | |
| 2009/0201281 | A1 | 8/2009 | Routley | |
| 2009/0206764 | A1 | 8/2009 | Schemmann | |
| 2009/0207160 | A1 | 8/2009 | Shirasaki et al. | |
| 2009/0213046 | A1 | 8/2009 | Nam | |
| 2009/0244046 | A1 | 10/2009 | Seto | |
| 2009/0262047 | A1 | 10/2009 | Yamashita | |
| 2010/0004891 | A1 | 1/2010 | Ahlers | |
| 2010/0026725 | A1 | 2/2010 | Smith | |
| 2010/0039422 | A1 | 2/2010 | Seto | |
| 2010/0039458 | A1 | 2/2010 | Nathan | |
| 2010/0045646 | A1 | 2/2010 | Kishi | |
| 2010/0045650 | A1 | 2/2010 | Fish et al. | |
| 2010/0060911 | A1 | 3/2010 | Marcu | |
| 2010/0073335 | A1 | 3/2010 | Min et al. | |
| 2010/0073357 | A1 | 3/2010 | Min et al. | |
| 2010/0079419 | A1 | 4/2010 | Shibusawa | |
| 2010/0085282 | A1 | 4/2010 | Yu | |
| 2010/0103160 | A1 | 4/2010 | Jeon | |
| 2010/0134469 | A1 | 6/2010 | Ogura et al. | |
| 2010/0134475 | A1 | 6/2010 | Ogura et al. | |
| 2010/0165002 | A1 | 7/2010 | Ahn | |
| 2010/0194670 | A1 | 8/2010 | Cok | |
| 2010/0207960 | A1 | 8/2010 | Kimpe | |
| 2010/0225630 | A1 | 9/2010 | Levey | |
| 2010/0251295 | A1 | 9/2010 | Amento | |
| 2010/0277400 | A1 | 11/2010 | Jeong | |
| 2010/0315319 | A1 | 12/2010 | Cok | |
| 2011/0050870 | A1 | 3/2011 | Hanari | |
| 2011/0063197 | A1 | 3/2011 | Chung | |
| 2011/0069051 | A1 | 3/2011 | Nakamura | |
| 2011/0069089 | A1 | 3/2011 | Kopf | |
| 2011/0069096 | A1 | 3/2011 | Li | |
| 2011/0074750 | A1 | 3/2011 | Leon | |
| 2011/0074762 | A1 | 3/2011 | Shirasaki et al. | |
| 2011/0109610 | A1 | 5/2011 | Yamamoto | |
| 2011/0149166 | A1 | 6/2011 | Botzas | |
| 2011/0169798 | A1 | 7/2011 | Lee | |
| 2011/0175895 | A1 | 7/2011 | Hayakawa | |
| 2011/0181630 | A1 | 7/2011 | Smith | |
| 2011/0199395 | A1 | 8/2011 | Nathan | |
| 2011/0227964 | A1 | 9/2011 | Chaji | |
| 2011/0242074 | A1 | 10/2011 | Bert et al. | |
| 2011/0273399 | A1 | 11/2011 | Lee | |
| 2011/0279488 | A1 | 11/2011 | Nathan et al. | |
| 2011/0292006 | A1 | 12/2011 | Kim | |
| 2011/0293480 | A1 | 12/2011 | Mueller | |
| 2012/0056558 | A1 | 3/2012 | Toshiya | |
| 2012/0062565 | A1 | 3/2012 | Fuchs | |
| 2012/0262184 | A1 | 10/2012 | Shen | |
| 2012/0299970 | A1 | 11/2012 | Bae | |
| 2012/0299978 | A1 | 11/2012 | Chaji | |
| 2013/0027381 | A1 | 1/2013 | Nathan | |
| 2013/0057595 | A1 | 3/2013 | Nathan | |
| 2013/0112960 | A1 | 5/2013 | Chaji | |
| 2013/0135272 | A1 | 5/2013 | Park | |
| 2013/0162617 | A1 | 6/2013 | Yoon | |
| 2013/0201223 | A1 | 8/2013 | Li et al. | |
| 2013/0241813 | A1 | 9/2013 | Tanaka | |
| 2013/0309821 | A1 | 11/2013 | Yoo | |
| 2013/0321671 | A1 | 12/2013 | Cote | |
| 2014/0015824 | A1 | 1/2014 | Chaji et al. | |
| 2014/0022289 | A1 | 1/2014 | Lee | |
| 2014/0043316 | A1 | 2/2014 | Chaji et al. | |
| 2014/0055500 | A1 | 2/2014 | Lai | |
| 2014/0111567 | A1 | 4/2014 | Nathan et al. | |
| 2016/0275860 | A1 | 9/2016 | Wu | |

FOREIGN PATENT DOCUMENTS

| | | |
|---|---|---|
| CA | 2 249 592 | 7/1998 |
| CA | 2 368 386 | 9/1999 |

(56) References Cited

FOREIGN PATENT DOCUMENTS

| | | | |
|---|---|---|---|
| CA | 2 242 720 | | 1/2000 |
| CA | 2 354 018 | | 6/2000 |
| CA | 2 432 530 | | 7/2002 |
| CA | 2 436 451 | | 8/2002 |
| CA | 2 438 577 | | 8/2002 |
| CA | 2 463 653 | | 1/2004 |
| CA | 2 498 136 | | 3/2004 |
| CA | 2 522 396 | | 11/2004 |
| CA | 2 443 206 | | 3/2005 |
| CA | 2 472 671 | | 12/2005 |
| CA | 2 567 076 | | 1/2006 |
| CA | 2 526 436 | | 2/2006 |
| CA | 2 526 782 | | 4/2006 |
| CA | 2 541 531 | | 7/2006 |
| CA | 2 550 102 | | 4/2008 |
| CA | 2 773 699 | | 10/2013 |
| CN | 1381032 | | 11/2002 |
| CN | 1448908 | | 10/2003 |
| CN | 1682267 | A | 10/2005 |
| CN | 1760945 | | 4/2006 |
| CN | 1886774 | | 12/2006 |
| CN | 101286298 | A | 10/2008 |
| CN | 101449311 | | 6/2009 |
| CN | 101656043 | A | 2/2010 |
| CN | 102656621 | | 9/2012 |
| EP | 0 158 366 | | 10/1985 |
| EP | 1 028 471 | | 8/2000 |
| EP | 1 111 577 | | 6/2001 |
| EP | 1 130 565 | A1 | 9/2001 |
| EP | 1 194 013 | | 4/2002 |
| EP | 1 335 430 | A1 | 8/2003 |
| EP | 1 372 136 | | 12/2003 |
| EP | 1 381 019 | | 1/2004 |
| EP | 1 418 566 | | 5/2004 |
| EP | 1 429 312 | A | 6/2004 |
| EP | 145 0341 | A | 8/2004 |
| EP | 1 465 143 | A | 10/2004 |
| EP | 1 469 448 | A | 10/2004 |
| EP | 1 521 203 | A2 | 4/2005 |
| EP | 1 594 347 | | 11/2005 |
| EP | 1 784 055 | A2 | 5/2007 |
| EP | 1854338 | A1 | 11/2007 |
| EP | 1 879 169 | A1 | 1/2008 |
| EP | 1 879 172 | | 1/2008 |
| EP | 2395499 | A1 | 12/2011 |
| GB | 2 389 951 | | 12/2003 |
| JP | 1272298 | | 10/1989 |
| JP | 4-042619 | | 2/1992 |
| JP | 6-314977 | | 11/1994 |
| JP | 8-340243 | | 12/1996 |
| JP | 09-090405 | | 4/1997 |
| JP | 10-254410 | | 9/1998 |
| JP | 11-202295 | | 7/1999 |
| JP | 11-219146 | | 8/1999 |
| JP | 11 231805 | | 8/1999 |
| JP | 11-282419 | | 10/1999 |
| JP | 2000-056847 | | 2/2000 |
| JP | 2000-81607 | | 3/2000 |
| JP | 2001-134217 | | 5/2001 |
| JP | 2001-195014 | | 7/2001 |
| JP | 2002-055654 | | 2/2002 |
| JP | 2002-91376 | | 3/2002 |
| JP | 2002-514320 | | 5/2002 |
| JP | 2002-229513 | | 8/2002 |
| JP | 2002-278513 | | 9/2002 |
| JP | 2002-333862 | | 11/2002 |
| JP | 2003-076331 | | 3/2003 |
| JP | 2003-124519 | | 4/2003 |
| JP | 2003-177709 | | 6/2003 |
| JP | 2003-271095 | | 9/2003 |
| JP | 2003-308046 | | 10/2003 |
| JP | 2003-317944 | | 11/2003 |
| JP | 2004-004675 | | 1/2004 |
| JP | 2004-045648 | | 2/2004 |
| JP | 2004-145197 | | 5/2004 |
| JP | 2004-287345 | | 10/2004 |
| JP | 2005-057217 | | 3/2005 |
| JP | 2007-065015 | | 3/2007 |
| JP | 2007-155754 | | 6/2007 |
| JP | 2008-102335 | | 5/2008 |
| JP | 4-158570 | | 10/2008 |
| JP | 2003-195813 | | 7/2013 |
| KR | 2004-0100887 | | 12/2004 |
| KR | 20080080753 | A | 9/2008 |
| TW | 342486 | | 10/1998 |
| TW | 473622 | | 1/2002 |
| TW | 485337 | | 5/2002 |
| TW | 502233 | | 9/2002 |
| TW | 538650 | | 6/2003 |
| TW | 1221268 | | 9/2004 |
| TW | 1223092 | | 11/2004 |
| TW | 200727247 | | 7/2007 |
| WO | WO 1998/48403 | | 10/1998 |
| WO | WO 1999/48079 | | 9/1999 |
| WO | WO 2001/06484 | | 1/2001 |
| WO | WO 2001/27910 | A1 | 4/2001 |
| WO | WO 2001/63587 | A2 | 8/2001 |
| WO | WO 2002/067327 | A | 8/2002 |
| WO | WO 2003/001496 | A1 | 1/2003 |
| WO | WO 2003/034389 | A | 4/2003 |
| WO | WO 2003/058594 | A1 | 7/2003 |
| WO | WO 2003/063124 | | 7/2003 |
| WO | WO 2003/077231 | | 9/2003 |
| WO | WO 2004/003877 | | 1/2004 |
| WO | WO 2004/025615 | A | 3/2004 |
| WO | WO 2004/034364 | | 4/2004 |
| WO | WO 2004/047058 | | 6/2004 |
| WO | WO 2004/104975 | A1 | 12/2004 |
| WO | WO 2005/022498 | | 3/2005 |
| WO | WO 2005/022500 | A | 3/2005 |
| WO | WO 2005/029455 | | 3/2005 |
| WO | WO 2005/029456 | | 3/2005 |
| WO | WO 2005/034072 | A1 | 4/2005 |
| WO | WO 2005/055185 | | 6/2005 |
| WO | WO 2006/000101 | A1 | 1/2006 |
| WO | WO 2006/053424 | | 5/2006 |
| WO | WO 2006/063448 | A | 6/2006 |
| WO | WO 2006/084360 | | 8/2006 |
| WO | WO 2007/003877 | A | 1/2007 |
| WO | WO 2007/079572 | | 7/2007 |
| WO | WO2007/090287 | | 8/2007 |
| WO | WO 2007/120849 | A2 | 10/2007 |
| WO | WO 2009/048618 | | 4/2009 |
| WO | WO 2009/055920 | | 5/2009 |
| WO | WO 2010/023270 | | 3/2010 |
| WO | WO 2010/146707 | A1 | 12/2010 |
| WO | WO 2011/041224 | A1 | 4/2011 |
| WO | WO 2011/064761 | A1 | 6/2011 |
| WO | WO 2011/067729 | | 6/2011 |
| WO | WO 2012/160424 | A1 | 11/2012 |
| WO | WO 2012/160471 | | 11/2012 |
| WO | WO 2012/164474 | A2 | 12/2012 |
| WO | WO 2012/164475 | A2 | 12/2012 |

OTHER PUBLICATIONS

Alexander : "Pixel circuits and drive schemes for glass and elastic AMOLED displays"; dated Jul. 2005 (9 pages).

Alexander : "Unique Electrical Measurement Technology for Compensation, Inspection, and Process Diagnostics of AMOLED HDTV"; dated May 2010 (4 pages).

Ashtiani : "AMOLED Pixel Circuit With Electronic Compensation of Luminance Degradation"; dated Mar. 2007 (4 pages).

Chaji : "A Current-Mode Comparator for Digital Calibration of Amorphous Silicon AMOLED Displays"; dated Jul. 2008 (5 pages).

Chaji : "A fast settling current driver based on the CCII for AMOLED displays"; dated Dec. 2009 (6 pages).

Chaji : "A Low-Cost Stable Amorphous Silicon AMOLED Display with Full V~T-and V~O~L~E~D Shift Compensation"; dated May 2007 (4 pages).

Chaji : "A low-power driving scheme for a-Si:H active-matrix organic light-emitting diode displays"; dated Jun. 2005 (4 pages).

(56) References Cited

OTHER PUBLICATIONS

Chaji : "A low-power high-performance digital circuit for deep submicron technologies"; dated Jun. 2005 (4 pages).
Chaji : "A novel a-Si:H AMOLED pixel circuit based on short-term stress stability of a-Si:H TFTs"; dated Oct. 2005 (3 pages).
Chaji : "A Novel Driving Scheme and Pixel Circuit for AMOLED Displays"; dated Jun. 2006 (4 pages).
Chaji : "A Novel Driving Scheme for High Resolution Large-area a-Si:H AMOLED displays"; dated Aug. 2005 (3 pages).
Chaji : "A Stable Voltage-Programmed Pixel Circuit for a-Si:H AMOLED Displays"; dated Dec. 2006 (12 pages).
Chaji : "A Sub-μA fast-settling current-programmed pixel circuit for AMOLED displays"; dated Sep. 2007.
Chaji : "An Enhanced and Simplified Optical Feedback Pixel Circuit for AMOLED Displays"; dated Oct. 2006.
Chaji : "Compensation technique for DC and transient instability of thin film transistor circuits for large-area devices"; dated Aug. 2008.
Chaji : "Driving scheme for stable operation of 2-TFT a-Si AMOLED pixel"; dated Apr. 2005 (2 pages).
Chaji : "Dynamic-effect compensating technique for stable a-Si:H AMOLED displays"; dated Aug. 2005 (4 pages).
Chaji : "Electrical Compensation of OLED Luminance Degradation"; dated Dec. 2007 (3 pages).
Chaji : "eUTDSP: a design study of a new VLIW-based DSP architecture"; dated My 2003 (4 pages).
Chaji : "Fast and Offset-Leakage Insensitive Current-Mode Line Driver for Active Matrix Displays and Sensors"; dated Feb. 2009 (8 pages).
Chaji : "High Speed Low Power Adder Design With a New Logic Style: Pseudo Dynamic Logic (SDL)"; dated Oct. 2001 (4 pages).
Chaji : "High-precision, fast current source for large-area current-programmed a-Si flat panels"; dated Sep. 2006 (4 pages).
Chaji : "Low-Cost AMOLED Television with IGNIS Compensating Technology"; dated May 2008 (4 pages).
Chaji : "Low-Cost Stable a-Si:H AMOLED Display for Portable Applications"; dated Jun. 2006 (4 pages).
Chaji : "Low-Power Low-Cost Voltage-Programmed a-Si:H AMOLED Display"; dated Jun. 2008 (5 pages).
Chaji : "Merged phototransistor pixel with enhanced near infrared response and flicker noise reduction for biomolecular imaging"; dated Nov. 2008 (3 pages).
Chaji : "Parallel Addressing Scheme for Voltage-Programmed Active-Matrix OLED Displays"; dated May 2007 (6 pages).
Chaji : "Pseudo dynamic logic (SDL): a high-speed and low-power dynamic logic family"; dated 2002 (4 pages).
Chaji : "Stable a-Si:H circuits based on short-term stress stability of amorphous silicon thin film transistors"; dated May 2006 (4 pages).
Chaji : "Stable Pixel Circuit for Small-Area High-Resolution a-Si:H AMOLED Displays"; dated Oct. 2008 (6 pages).
Chaji : "Stable RGBW AMOLED display with OLED degradation compensation using electrical feedback"; dated Feb. 2010 (2 pages).
Chaji : "Thin-Film Transistor Integration for Biomedical Imaging and AMOLED Displays"; dated 2008 (177 pages).
European Search Report for Application No. EP 04 78 6661 dated Mar. 9, 2009.
European Search Report for Application No. EP 05 75 9141 dated Oct. 30, 2009 (2 pages).
European Search Report for Application No. EP 05 81 9617 dated Jan. 30, 2009.
European Search Report for Application No. EP 06 70 5133 dated Jul. 18, 2008.
European Search Report for Application No. EP 06 72 1798 dated Nov. 12, 2009 (2 pages).
European Search Report for Application No. EP 07 71 0608.6 dated Mar. 19, 2010 (7 pages).
European Search Report for Application No. EP 07 71 9579 dated May 20, 2009.
European Search Report for Application No. EP 07 81 5784 dated Jul. 20, 2010 (2 pages).
European Search Report for Application No. EP 10 16 6143, dated Sep. 3, 2010 (2 pages).
European Search Report for Application No. EP 10 83 4294.0-1903, dated Apr. 8, 2013, (9 pages).
European Supplementary Search Report for Application No. EP 04 78 6662 dated Jan. 19, 2007 (2 pages).
Extended European Search Report for Application No. 11 73 9485.8 dated Aug. 6, 2013 (14 pages).
Extended European Search Report for Application No. EP 09 73 3076.5, dated Apr. 27, (13 pages).
Extended European Search Report for Application No. EP 11 16 8677.0, dated Nov. 29, 2012, (13 page).
Extended European Search Report for Application No. EP 11 19 1641.7 dated Jul. 11, 2012 (14 pages).
Extended European Search Report for Application No. EP 10834297 dated Oct. 27, 2014 (6 pages).
Fossum, Eric R.. "Active Pixel Sensors: Are CCD's Dinosaurs?" SPIE: Symposium on Electronic Imaging. Feb. 1, 1993 (13 pages).
Goh , "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
International Preliminary Report on Patentability for Application No. PCT/CA2005/001007 dated Oct. 16, 2006, 4 pages.
International Search Report for Application No. PCT/CA2004/001741 dated Feb. 21, 2005.
International Search Report for Application No. PCT/CA2004/001742, Canadian Patent Office, dated Feb. 21, 2005 (2 pages).
International Search Report for Application No. PCT/CA2005/001007 dated Oct. 18, 2005.
International Search Report for Application No. PCT/CA2005/001897, dated Mar. 21, 2006 (2 pages).
International Search Report for Application No. PCT/CA2007/000652 dated Jul. 25, 2007.
International Search Report for Application No. PCT/CA2009/000501, dated Jul. 30, 2009 (4 pages).
International Search Report for Application No. PCT/CA2009/001769, dated Apr. 8, 2010 (3 pages).
International Search Report for Application No. PCT/IB2010/055481, dated Apr. 7, 2011, 3 pages.
International Search Report for Application No. PCT/IB2010/055486, dated Apr. 19, 2011, 5 pages.
International Search Report for Application No. PCT/M2014/060959, dated Aug. 28, 2014, 5 pages.
International Search Report for Application No. PCT/IB2010/055541 filed Dec. 1, 2010, dated May 26, 2011; 5 pages.
International Search Report for Application No. PCT/IB2011/050502, dated Jun. 27, 2011 (6 pages).
International Search Report for Application No. PCT/IB2011/051103, dated Jul. 8, 2011, 3 pages.
International Search Report for Application No. PCT/IB2011/055135, Canadian Patent Office, dated Apr. 16, 2012 (5 pages).
International Search Report for Application No. PCT/IB2012/052372, dated Sep. 12, 2012 (3 pages).
International Search Report for Application No. PCT/IB2013/054251, Canadian Intellectual Property Office, dated Sep. 11, 2013; (4 pages).
International Search Report for Application No. PCT/JP02/09668, dated Dec. 3, 2002, (4 pages).
International Written Opinion for Application No. PCT/CA2004/001742, Canadian Patent Office, dated Feb. 21, 2005 (5 pages).
International Written Opinion for Application No. PCT/CA2005/001897, dated Mar. 21, 2006 (4 pages).
International Written Opinion for Application No. PCT/CA2009/000501 dated Jul. 30, 2009 (6 pages).
International Written Opinion for Application No. PCT/IB2010/055481, dated Apr. 7, 2011, 6 pages.
International Written Opinion for Application No. PCT/IB2010/055486, dated Apr. 19, 2011, 8 pages.
International Written Opinion for Application No. PCT/IB2010/055541, dated May 26, 2011; 6 pages.
International Written Opinion for Application No. PCT/IB2011/050502, dated Jun. 27, 2011 (7 pages).

(56) References Cited

OTHER PUBLICATIONS

International Written Opinion for Application No. PCT/IB2011/051103, dated Jul. 8, 2011, 6 pages.
International Written Opinion for Application No. PCT/IB2011/055135, Canadian Patent Office, dated Apr. 16, 2012 (5 pages).
International Written Opinion for Application No. PCT/IB2012/052372, dated Sep. 12, 2012 (6 pages).
International Written Opinion for Application No. PCT/IB2013/054251, Canadian Intellectual Property Office, dated Sep. 11, 2013; (5 pages).
Jafarabadiashtiani : "A New Driving Method for a-Si AMOLED Displays Based on Voltage Feedback"; dated 2005 (4 pages).
Kanicki, J., "Amorphous Silicon Thin-Film Transistors Based Active-Matrix Organic Light-Emitting Displays." Asia Display: International Display Workshops, Sep. 2001 (pp. 315-318).
Karim, K. S., "Amorphous Silicon Active Pixel Sensor Readout Circuit for Digital Imaging." IEEE: Transactions on Electron Devices. vol. 50, No. 1, Jan. 2003 (pp. 200-208).
Lee : "Ambipolar Thin-Film Transistors Fabricated by PECVD Nanocrystalline Silicon"; dated 2006.
Lee, Wonbok: "Thermal Management in Microprocessor Chips and Dynamic Backlight Control in Liquid Crystal Displays", Ph.D. Dissertation, University of Southern California (124 pages).
Liu, P. et al., Innovative Voltage Driving Pixel Circuit Using Organic Thin-Film Transistor for AMOLEDs, Journal of Display Technology, vol. 5, Issue 6, Jun. 2009 (pp. 224-227).
Ma E Y: "organic light emitting diode/thin film transistor integration for foldable displays" dated Sep. 15, 1997(4 pages).
Matsueda y : "35.1: 2.5-in. AMOLED with Integrated 6-bit Gamma Compensated Digital Data Driver"; dated May 2004.
Mendes E., "A High Resolution Switch-Current Memory Base Cell." IEEE: Circuits and Systems. vol. 2, Aug. 1999 (pp. 718-721).
Nathan A. , "Thin Film imaging technology on glass and plastic" ICM 2000, proceedings of the 12 international conference on microelectronics, dated Oct. 31, 2001 (4 pages).
Nathan , "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Nathan : "Backplane Requirements for active Matrix Organic Light Emitting Diode Displays,"; dated 2006 (16 pages).
Nathan : "Call for papers second international workshop on compact thin-film transistor (TFT) modeling for circuit simulation"; dated Sep. 2009 (1 page).
Nathan : "Driving schemes for a-Si and LTPS AMOLED displays"; dated Dec. 2005 (11 pages).
Nathan : "Invited Paper: a-Si for AMOLED—Meeting the Performance and Cost Demands of Display Applications (Cell Phone to HDTV)"; dated 2006 (4 pages).
Office Action in Japanese patent application No. JP2012-541612 dated Jul. 15, 2014. (3 pages).
Partial European Search Report for Application No. EP 11 168 677.0, dated Sep. 22, 2011 (5 pages).
Partial European Search Report for Application No. EP 11 19 1641.7, dated Mar. 20, 2012 (8 pages).
Philipp: "Charge transfer sensing" Sensor Review, vol. 19, No. 2, Dec. 31, 1999 (Dec. 31, 1999), 10 pages.
Rafati : "Comparison of a 17 b multiplier in Dual-rail domino and in Dual-rail D L (D L) logic styles"; dated 2002 (4 pages).
Safavian : "3-TFT active pixel sensor with correlated double sampling readout circuit for real-time medical x-ray imaging"; dated Jun. 2006 (4 pages).
Safavian : "A novel current scaling active pixel sensor with correlated double sampling readout circuit for real time medical x-ray imaging"; dated May 2007 (7 pages).
Safavian : "A novel hybrid active-passive pixel with correlated double sampling CMOS readout circuit for medical x-ray imaging"; dated May 2008 (4 pages).
Safavian : "Self-compensated a-Si:H detector with current-mode readout circuit for digital X-ray fluoroscopy"; dated Aug. 2005 (4 pages).
Safavian : "TFT active image sensor with current-mode readout circuit for digital x-ray fluoroscopy [5969D-82]"; dated Sep. 2005 (9 pages).
Safavian : "Three-TFT image sensor for real-time digital X-ray imaging"; dated Feb. 2, 2006 (2 pages).
Singh, , "Current Conveyor: Novel Universal Active Block", Samriddhi, S-JPSET vol. I, Issue 1, 2010, pp. 41-48 (12EPPT).
Smith, Lindsay I., "A tutorial on Principal Components Analysis," dated Feb. 26, 2001 (27 pages).
Spindler , System Considerations for RGBW OLED Displays, Journal of the SID 14/1, 2006, pp. 37-48.
Stewart M. , "polysilicon TFT technology for active matrix oled displays" IEEE transactions on electron devices, vol. 48, No. 5, dated May 2001 (7 pages).
Vygranenko : "Stability of indium-oxide thin-film transistors by reactive ion beam assisted deposition"; dated 2009.
Wang : "Indium oxides by reactive ion beam assisted evaporation: From material study to device application"; dated Mar. 2009 (6 pages).
Yi He , "Current-Source a-Si:H Thin Film Transistor Circuit for Active-Matrix Organic Light-Emitting Displays", IEEE Electron Device Letters, vol. 21, No. 12, Dec. 2000, pp. 590-592.
Yu, Jennifer: "Improve OLED Technology for Display", Ph.D. Dissertation, Massachusetts Institute of Technology, Sep. 2008 (151 pages).
International Search Report for Application No. PCT/IB2014/058244, Canadian Intellectual Property Office, dated Apr. 11, 2014; (6 pages).
International Search Report for Application No. PCT/IB2014/059753, Canadian Intellectual Property Office, dated Jun. 23, 2014; (6 pages).
Written Opinion for Application No. PCT/IB2014/059753, Canadian Intellectual Property Office, dated Jun. 12, 2014 (6 pages).
International Search Report for Application No. PCT/IB2014/060879, Canadian Intellectual Property Office, dated Jul. 17, 2014 (3 pages).
Extended European Search Report for Application No. EP 14158051.4, dated Jul. 29, 2014, (4 pages).
Office Action in Chinese Patent Invention No. 201180008188.9, dated Jun. 4, 2014 (17 pages).
International Search Report for Application No. PCT/IB/2014/066932 dated Mar. 24, 2015.
Written Opinion for Application No. PCT/IB/2014/066932 dated Mar. 24, 2015.
Extended European Search Report for Application No. EP 11866291.5, dated Mar. 9, 2015, (9 pages).
Extended European Search Report for Application No. EP 14181848.4, dated Mar. 5, 2015, (8 pages).
Office Action in Chinese Patent Invention No. 201280022957.5, dated Jun. 26, 2015 (7 pages).
Extended European Search Report for Application No. EP 13794695.0, dated Dec. 18, 2015, (9 pages).
Extended European Search Report for Application No. EP 16157746.5, dated Apr. 8, 2016, (11 pages).
Extended European Search Report for Application No. EP 16192749.6, dated Dec. 15, 2016, (17 pages).
International Search Report for Application No. PCT/IB/2016/054763 dated Nov. 25, 2016 (4 pages).
Written Opinion for Application No. PCT/IB/2016/054763 dated Nov. 25, 2016 (9 pages).
Snorre Aunet: "switched capacitor circuits", University of Oslo, Mar. 7, 2011 (Mar. 7, 2011), XP002729694, http://www.uio.no/studier/emner/matnat/ifi/INF4420/v11/undervisningsmateriale/INF4420_V11_0308_1.pdf. Retrieved on Sep. 9, 2014 (13 pages).
Office Action for Application No. 12789753.6, dated Oct. 20, 2017, (11 pages).

* cited by examiner

CHARGED-BASED COMPENSATION AND PARAMETER EXTRACTION IN AMOLED DISPLAYS

CROSS-REFERENCE TO RELATED APPLICATIONS

This application is a continuation of U.S. patent application Ser. No. 14/447,323, filed Jul. 30, 2014, now allowed, which claims the benefit of U.S. Provisional Application No. 61/869,327, filed Aug. 23, 2013 and the benefit of U.S. Provisional Application No. 61/859,963, filed Jul. 30, 2013, and the benefit of U.S. Provisional Application No. 61/912,352, filed Dec. 5, 2013, and the benefit of U.S. Provisional Application No. 61/913,002, filed Dec. 6, 2013, and the benefit of U.S. Provisional Application No. 61/947,105, filed Mar. 3, 2014, and the benefit of U.S. Provisional Application No. 61/975,479, filed Apr. 4, 2014, and this application is also a continuation-in-part of U.S. patent application Ser. No. 14/093,758, filed Dec. 2, 2013, which in turn is a continuation-in-part of U.S. patent application Ser. No. 13/835,124, filed Mar. 15, 2013, now U.S. Pat. No. 8,599,191, which in turn is a continuation-in-part of U.S. patent application Ser. No. 13/112,468, filed May 20, 2011, now U.S. Pat. No. 8,576,217, each of the foregoing of which is hereby incorporated by reference herein in their entirety.

FIELD OF THE INVENTION

The present invention generally relates to active matrix organic light emitting device (AMOLED) displays, and particularly extracting parameters of the pixel circuits and light emitting devices in such displays.

BACKGROUND

The advantages of active matrix organic light emitting device ("AMOLED") displays include lower power consumption, manufacturing flexibility and faster refresh rate over conventional liquid crystal displays. In contrast to conventional liquid crystal displays, there is no backlighting in an AMOLED display, and thus each pixel consists of different colored OLEDs emitting light independently. The OLEDs emit light based on current supplied through drive transistors controlled by programming voltages. The power consumed in each pixel has a relation with the magnitude of the generated light in that pixel.

The quality of output in an OLED-based pixel is affected by the properties of the drive transistor, which is typically fabricated from materials including but not limited to amorphous silicon, polysilicon, or metal oxide, as well as the OLED itself. In particular, threshold voltage and mobility of the drive transistor tend to change as the pixel ages. In order to maintain image quality, changes in these parameters must be compensated for by adjusting the programming voltage. In order to do so, such parameters must be extracted from the driver circuit. The addition of components to extract such parameters in a simple driver circuit requires more space on a display substrate for the drive circuitry and thereby reduces the amount of aperture or area of light emission from the OLED.

When biased in saturation, the I-V characteristic of a thin film drive transistor depends on mobility and threshold voltage which are a function of the materials used to fabricate the transistor. Thus different thin film transistor devices implemented across the display panel may demonstrate non-uniform behavior due to aging and process variations in mobility and threshold voltage. Accordingly, for a constant voltage, each device may have a different drain current. An extreme example may be where one device could have low threshold-voltage and low mobility compared to a second device with high threshold-voltage and high mobility.

Thus with very few electronic components available to maintain a desired aperture, extraction of non-uniformity parameters (i.e. threshold voltage, $V_{th}$, and mobility, μ) of the drive TFT and the OLED becomes challenging. It would be desirable to extract such parameters in a driver circuit for an OLED pixel with as few components as possible to maximize pixel aperture. It would also be desirable to combine parameter extraction with in-pixel compensation for optimum lifetime performance.

SUMMARY

One embodiment disclosed reads a desired circuit parameter from a pixel circuit that includes a light emitting device, a drive device to provide a programmable drive current to the light emitting device, a programming input, and a storage device to store a programming signal. The extraction method comprises turning off the drive device and supplying a predetermined voltage from an external source to the light emitting device, discharging the light emitting device until the light emitting device turns off, and then reading the voltage on the light emitting device while that device is turned off. In one implementation, the voltages on the light emitting devices in a plurality of pixel circuits are read via the same external line, at different times. The reading of the desired parameter may be effected by coupling the pixel circuit to a charge-pump amplifier, isolating the charge-pump amplifier from the pixel circuit to provide a voltage output either proportional to the charge level or integrating the current from the pixel circuit, reading the voltage output of the charge-pump amplifier; and determining at least one pixel circuit parameter from the voltage output of the charge-pump amplifier.

Another embodiment extracts a circuit parameter from a pixel circuit by turning on the drive device so that the voltage of the light emitting device rises to a level higher than its turn-on voltage, turning off the drive device so that the voltage on the light emitting device is discharged through the light emitting device until the light emitting device turns off, and then reading the voltage on the light emitting device while that device is turned off.

A further embodiment extracts a circuit parameter from a pixel circuit by programming the pixel circuit, turning on the drive device, and extracting a parameter of the drive device by either (i) reading the current passing through the drive device while applying a predetermined voltage to the drive device, or (ii) reading the voltage on the drive device while passing a predetermined current through the drive device.

Another embodiment extracts a circuit parameter from a pixel circuit by turning on the drive device and measuring the current and voltage of the drive transistor while changing the voltage between the gate and the source or drain of the drive transistor to operate the drive transistor in the linear regime during one time interval and in the saturated regime during a second time interval, and extracting a parameter of the light emitting device from the relationship of the currents and voltages measured with the drive transistor operating in the two regimes.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
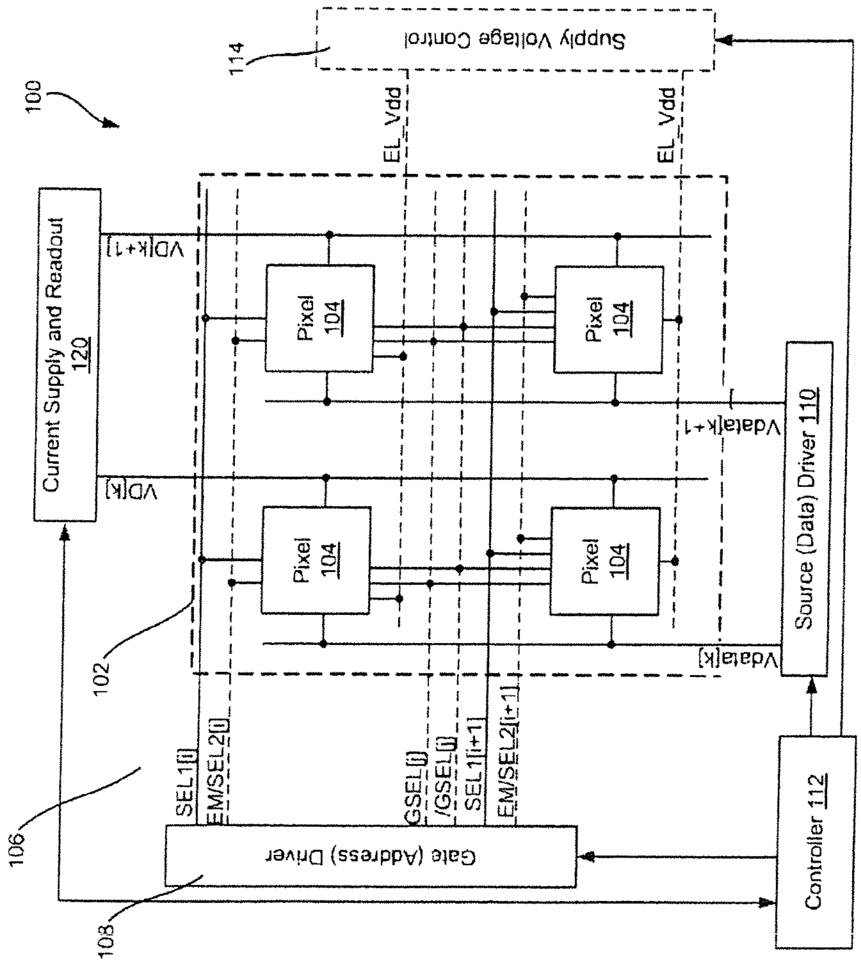
FIG. 1 is a block diagram of an AMOLED display with compensation control.

While the present disclosure is susceptible to various modifications and alternative forms, specific embodiments have been shown by way of example in the drawings and will be described in detail herein. It should be understood, however, that the present disclosure is not intended to be limited to the particular forms disclosed. Rather, this disclosure is to cover all modifications, equivalents, and alternatives falling within the spirit and scope of the invention as defined by the appended claims.

DETAILED DESCRIPTION

FIG. 1 is an electronic display system 100 having an active matrix area or pixel array 102 in which an n×m array of pixels 104 are arranged in a row and column configuration. For ease of illustration, only two rows and two columns are shown. External to the active matrix area of the pixel array 102 is a peripheral area 106 where peripheral circuitry for driving and controlling the pixel array 102 are disposed. The peripheral circuitry includes an address or gate driver circuit 108, a data or source driver circuit 110, a controller 112, and an optional supply voltage (e.g., Vdd) driver 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. In pixel sharing configurations described below, the gate or address driver circuit 108 can also optionally operate on global select lines GSEL [j] and optionally/GSEL[j], which operate on multiple rows of pixels 104 in the pixel array 102, such as every two rows of pixels 104. The source driver circuit 110, under control of the controller 112, operates on voltage data lines Vdata[k], Vdata[k+1], and so forth, one for each column of pixels 104 in the pixel array 102. The voltage data lines carry voltage programming information to each pixel 104 indicative of the brightness of each light emitting device in the pixel 104. A storage element, such as a capacitor, in each pixel 104 stores the voltage programming information until an emission or driving cycle turns on the light emitting device. The optional supply voltage driver 114, under control of the controller 112, controls a supply voltage (EL Vdd) line, one for each row or column of pixels 104 in the pixel array 102.

The display system 100 further includes a current supply and readout circuit 120, which reads output data from data output lines, VD [k], VD [k+1], and so forth, one for each column of pixels 104 in the pixel array 102.

As is known, each pixel 104 in the display system 100 needs to be programmed with information indicating the brightness of the light emitting device in the pixel 104. A frame defines the time period that includes: (i) a programming cycle or phase during which each and every pixel in the display system 100 is programmed with a programming voltage indicative of a brightness; and (ii) a driving or emission cycle or phase during which each light emitting device in each pixel is turned on to emit light at a brightness commensurate with the programming voltage stored in a storage element. A frame is thus one of many still images that compose a complete moving picture displayed on the display system 100. There are at least schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all rows of pixels are driven at once. Either scheme can employ a brief vertical blanking time at the beginning or end of each frame during which the pixels are neither programmed nor driven.

The components located outside of the pixel array 102 may be disposed in a peripheral area 106 around the pixel array 102 on the same physical substrate on which the pixel array 102 is disposed. These components include the gate driver 108, the source driver 110, the optional supply voltage driver 114, and a current supply and readout circuit 120. Alternately, some of the components in the peripheral area 106 may be disposed on the same substrate as the pixel array 102 while other components are disposed on a different substrate, or all of the components in the peripheral area can be disposed on a substrate different from the substrate on which the pixel array 102 is disposed. Together, the gate driver 108, the source driver 110, and the supply voltage driver 114 make up a display driver circuit. The display driver circuit in some configurations can include the gate driver 108 and the source driver 110 but not the supply voltage control 114.

When biased in saturation, the first order I-V characteristic of a metal oxide semiconductor (MOS) transistor (a thin film transistor in this case of interest) is modeled as:

$$I_D = \frac{1}{2}\mu C_{ox}\frac{W}{L}(V_{GS} - V_{th})^2$$

where $I_D$ is the drain current and $V_{GS}$ is the voltage difference applied between gate and source terminals of the transistor. The thin film transistor devices implemented across the display system 100 demonstrate non-uniform behavior due to aging and process variations in mobility (μ) and threshold voltage ($V_{th}$). Accordingly, for a constant voltage difference applied between gate and source, $V_{GS}$, each transistor on the pixel matrix 102 may have a different drain current based on a non-deterministic mobility and threshold voltage:

$$I_{D(i,j)}=f(\mu_{i,j}V_{th\ i,j})$$

where i and j are the coordinates (row and column) of a pixel in an n×m array of pixels such as the array of pixels 102 in FIG. 1.

Figure 2:
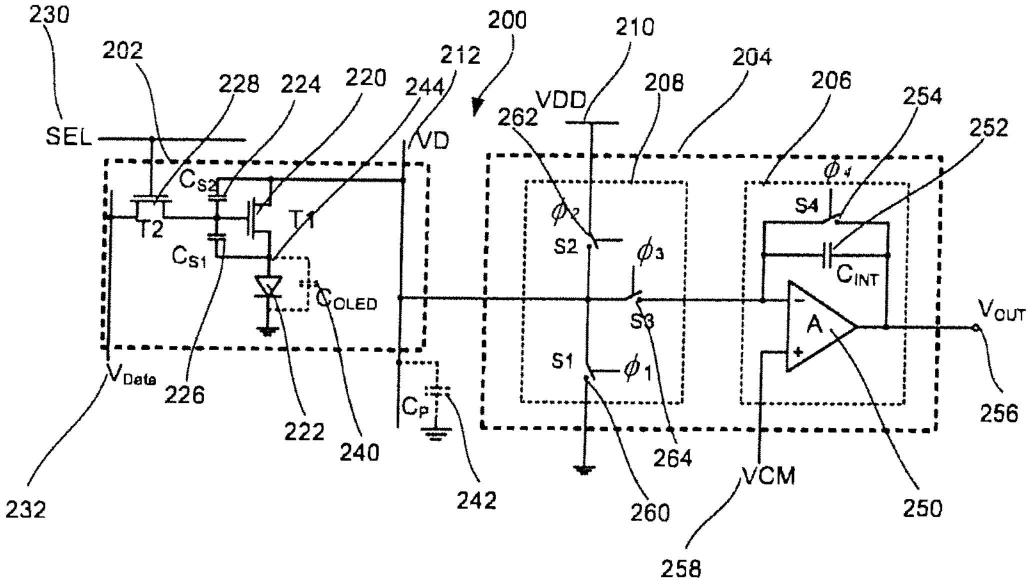
FIG. 2 is a circuit diagram of a data extraction circuit for a two-transistor pixel in the AMOLED display in FIG. 1.

FIG. 2 shows a data extraction system 200 including a two-transistor (2T) driver circuit 202 and a readout circuit 204. The supply voltage control 114 is optional in a display system with 2T pixel circuit 104. The readout circuit 204 is part of the current supply and readout circuit 120 and gathers data from a column of pixels 104 as shown in FIG. 1. The readout circuit 204 includes a charge pump circuit 206 and a switch-box circuit 208. A voltage source 210 provides the supply voltage to the driver circuit 202 through the switch-box circuit 208. The charge-pump and switch-box circuits 206 and 208 are implemented on the top or bottom side of the array 102 such as in the voltage drive 114 and the current supply and readout circuit 120 in FIG. 1. This is achieved by either direct fabrication on the same substrate as the pixel array 102 or by bonding a microchip on the substrate or a flex as a hybrid solution.

The driver circuit 202 includes a drive transistor 220, an organic light emitting device 222, a drain storage capacitor 224, a source storage capacitor 226, and a select transistor 228. A supply line 212 provides the supply voltage and also a monitor path (for the readout circuit 204) to a column of driver circuits such as the driver circuit 202. A select line input 230 is coupled to the gate of the select transistor 228. A programming data input 232 is coupled to the gate of the drive transistor 220 through the select transistor 228. The drain of the drive transistor 220 is coupled to the supply voltage line 212 and the source of the drive transistor 220 is coupled to the OLED 222. The select transistor 228 controls the coupling of the programming input 230 to the gate of the drive transistor 220. The source storage capacitor 226 is coupled between the gate and the source of the drive transistor 220. The drain storage capacitor 224 is coupled between the gate and the drain of the drive transistor 220. The OLED 222 has a parasitic capacitance that is modeled as a capacitor 240. The supply voltage line 212 also has a parasitic capacitance that is modeled as a capacitor 242. The drive transistor 220 in this example is a thin film transistor that is fabricated from amorphous silicon. Of course other materials such as polysilicon or metal oxide may be used. A node 244 is the circuit node where the source of the drive transistor 220 and the anode of the OLED 222 are coupled together. In this example, the drive transistor 220 is an n-type transistor. The system 200 may be used with a p-type drive transistor in place of the n-type drive transistor 220 as will be explained below.

The readout circuit 204 includes the charge-pump circuit 206 and the switch-box circuit 208. The charge-pump circuit 206 includes an amplifier 250 having a positive and negative input. The negative input of the amplifier 250 is coupled to a capacitor 252 ($C_{int}$) in parallel with a switch 254 in a negative feedback loop to an output 256 of the amplifier 250. The switch 254 (S4) is utilized to discharge the capacitor 252 $C_{int}$ during the pre-charge phase. The positive input of the amplifier 250 is coupled to a common mode voltage input 258 (VCM). The output 256 of the amplifier 250 is indicative of various extracted parameters of the drive transistor 220 and OLED 222 as will be explained below.

The switch-box circuit 208 includes several switches 260, 262 and 264 (S1, S2 and S3) to steer current to and from the pixel driver circuit 202. The switch 260 (S1) is used during the reset phase to provide a discharge path to ground. The switch 262 (S2) provides the supply connection during normal operation of the pixel 104 and also during the integration phase of readout. The switch 264 (S3) is used to isolate the charge-pump circuit 206 from the supply line voltage 212 (VD).

The general readout concept for the two transistor pixel driver circuit 202 for each of the pixels 104, as shown in FIG. 2, comes from the fact that the charge stored on the parasitic capacitance represented by the capacitor 240 across the OLED 222 has useful information of the threshold voltage and mobility of the drive transistor 220 and the turn-on voltage of the OLED 222. The extraction of such parameters may be used for various applications. For example, such parameters may be used to modify the programming data for the pixels 104 to compensate for pixel variations and maintain image quality. Such parameters may also be used to pre-age the pixel array 102. The parameters may also be used to evaluate the process yield for the fabrication of the pixel array 102.

Assuming that the capacitor 240 ($C_{OLED}$) is initially discharged, it takes some time for the capacitor 240 ($C_{OLED}$) to charge up to a voltage level that turns the drive transistor 220 off. This voltage level is a function of the threshold voltage of the drive transistor 220. The voltage applied to the programming data input 232 ($V_{Data}$) must be low enough such that the settled voltage of the OLED 222 ($V_{OLED}$) is less than the turn-on threshold voltage of the OLED 222 itself. In this condition, $V_{Data}-V_{OLED}$ is a linear function of the threshold voltage ($V_{th}$) of the drive transistor 220. In order to extract the mobility of a thin film transistor device such as the drive transistor 220, the transient settling of such devices, which is a function of both the threshold voltage and mobility, is considered. Assuming that the threshold voltage deviation among the TFT devices such as the drive transistor 220 is compensated, the voltage of the node 244 sampled at a constant interval after the beginning of integration is a function of mobility only of the TFT device such as the drive transistor 220 of interest.

Figure 3A:
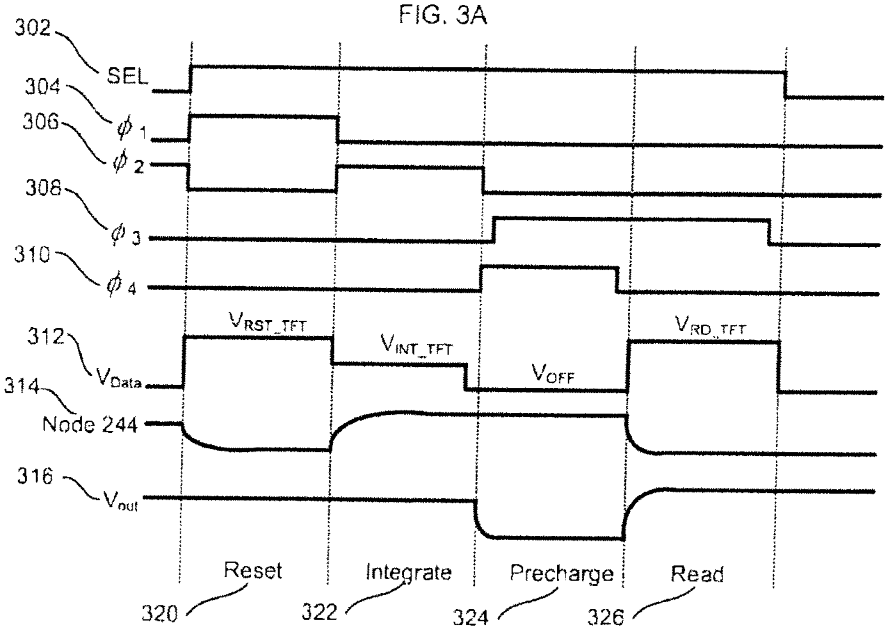
FIG. 3A is a signal timing diagram of the signals to the data extraction circuit to extract the threshold voltage and mobility of an n-type drive transistor in FIG. 2.
Figure 3B:
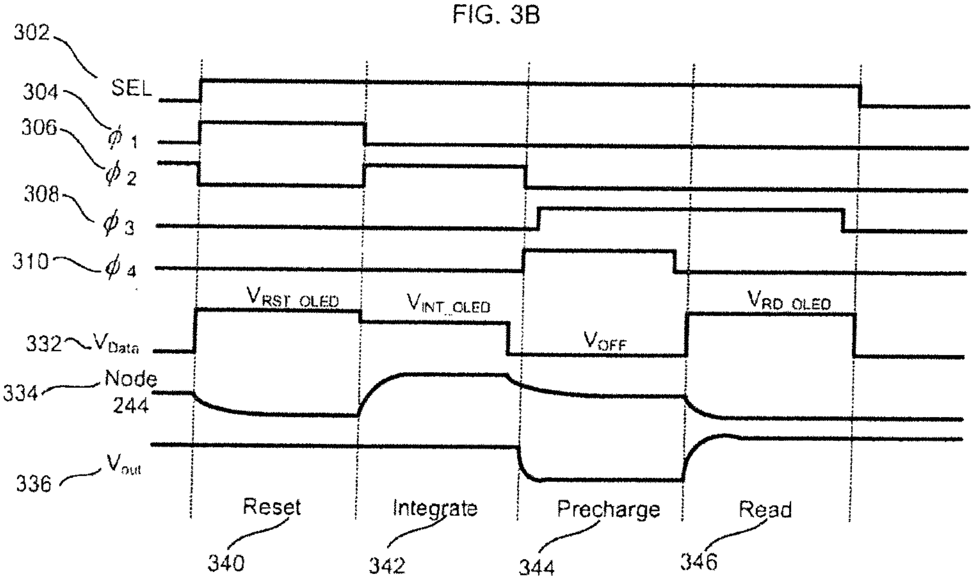
FIG. 3B is a signal timing diagram of the signals to the data extraction circuit to extract the characteristic voltage of the OLED in FIG. 2 with an n-type drive transistor.
Figure 3C:
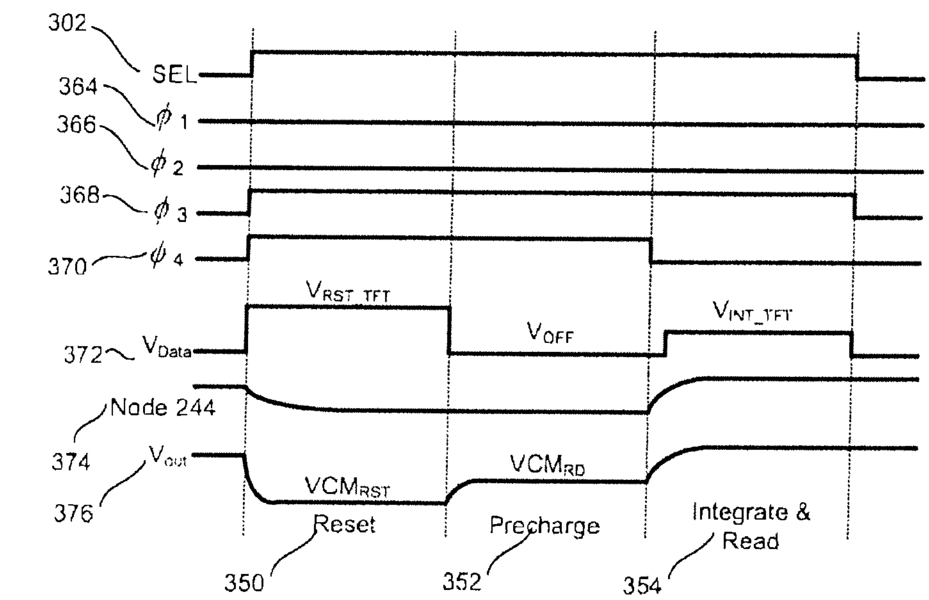
FIG. 3C is a signal timing diagram of the signals to the data extraction circuit for a direct read to extract the threshold voltage of an n-type drive transistor in FIG. 2.

FIG. 3A-3C are signal timing diagrams of the control signals applied to the components in FIG. 2 to extract parameters such as voltage threshold and mobility from the drive transistor 220 and the turn on voltage of the OLED 222 in the drive circuit 200 assuming the drive transistor 220 is an n-type transistor. Such control signals could be applied by the controller 112 to the source driver 110, the gate driver 108 and the current supply and readout circuit 120 in FIG. 1. FIG. 3A is a timing diagram showing the signals applied to the extraction circuit 200 to extract the threshold voltage and mobility from the drive transistor 220. FIG. 3A includes a signal 302 for the select input 230 in FIG. 2, a signal 304 ($\phi_1$) to the switch 260, a signal 306 ($\phi_2$) for the switch 262, a signal 308 ($\phi_3$) for the switch 264, a signal 310 ($\phi_4$) for the switch 254, a programming voltage signal 312 for the programming data input 232 in FIG. 2, a voltage 314 of the node 244 in FIG. 2 and an output voltage signal 316 for the output 256 of the amplifier 250 in FIG. 2.

FIG. 3A shows the four phases of the readout process, a reset phase 320, an integration phase 322, a pre-charge phase 324 and a read phase 326. The process starts by activating a high select signal 302 to the select input 230. The select signal 302 will be kept high throughout the readout process as shown in FIG. 3A.

During the reset phase 320, the input signal 304 ($\phi_1$) to the switch 260 is set high in order to provide a discharge path to ground. The signals 306, 308 and 310 ($\phi_2$, $\phi_3$, $\phi$4) to the switches 262, 264 and 250 are kept low in this phase. A high enough voltage level ($V_{RST\_TFT}$) is applied to the programming data input 232 ($V_{Data}$) to maximize the current flow through the drive transistor 220. Consequently, the voltage at the node 244 in FIG. 2 is discharged to ground to get ready for the next cycle.

During the integration phase 322, the signal 304 ($\phi_2$) to the switch 262 stays high which provides a charging path from the voltage source 210 through the switch 262. The signals 304, 308 and 310 ($\phi_1$, $\phi_3$, $\phi_4$) to the switches 260, 264 and 250 are kept low in this phase. The programming voltage input 232 ($V_{Data}$) is set to a voltage level ($V_{INT\_TFT}$) such that once the capacitor 240 ($C_{oled}$) is fully charged, the voltage at the node 244 is less than the turn-on voltage of the OLED 222. This condition will minimize any interference from the OLED 222 during the reading of the drive transistor 220. Right before the end of integration time, the signal 312 to the programming voltage input 232 ($V_{Data}$) is lowered to $V_{OFF}$ in order to isolate the charge on the capacitor 240 ($C_{oled}$) from the rest of the circuit.

When the integration time is long enough, the charge stored on capacitor 240 ($C_{oled}$) will be a function of the threshold voltage of the drive transistor 220. For a shortened integration time, the voltage at the node 244 will experience an incomplete settling and the stored charge on the capacitor 240 ($C_{oled}$) will be a function of both the threshold voltage and mobility of the drive transistor 220. Accordingly, it is feasible to extract both parameters by taking two separate readings with short and long integration phases.

During the pre-charge phase 324, the signals 304 and 306 ($\phi_1$, $\phi_2$) to switches 260 and 262 are set low. Once the input signal 310 ($\phi_4$) to the switch 254 is set high, the amplifier 250 is set in a unity feedback configuration. In order to protect the output stage of the amplifier 250 against short-circuit current from the supply voltage 210, the signal 308 ($\phi_3$) to the switch 264 goes high when the signal 306 ($\phi_2$) to the switch 262 is set low. When the switch 264 is closed, the parasitic capacitance 242 of the supply line is precharged to the common mode voltage, VCM. The common mode voltage, VCM, is a voltage level which must be lower than the ON voltage of the OLED 222. Right before the end of pre-charge phase, the signal 310 ($\phi_4$) to the switch 254 is set low to prepare the charge pump amplifier 250 for the read cycle.

During the read phase 336, the signals 304, 306 and 310 ($\phi_1$, $\phi_2$, $\phi_4$) to the switches 260, 262 and 254 are set low. The signal 308 ($\phi_3$) to the switch 264 is kept high to provide a charge transfer path from the drive circuit 202 to the charge-pump amplifier 250. A high enough voltage 312 ($V_{RD\_TFT}$) is applied to the programming voltage input 232 ($V_{Data}$) to minimize the channel resistance of the drive transistor 220. If the integration cycle is long enough, the accumulated charge on the capacitor 252 ($C_{int}$) is not a function of integration time. Accordingly, the output voltage of the charge-pump amplifier 250 in this case is equal to:

$$V_{out} = -\frac{C_{oled}}{C_{int}}(V_{Data} - V_{th})$$

For a shortened integration time, the accumulated charge on the capacitor 252 ($C_{int}$) is given by:

$$Q_{int} = \int^{T_{int}} i_D(V_{GS}, V_{th}, \mu) \cdot dt$$

Consequently, the output voltage 256 of the charge-pump amplifier 250 at the end of read cycle equals:

$$V_{out} = -\frac{1}{C_{int}} \cdot \int^{T_{int}} i_D(V_{GS}, V_{th}, \mu) \cdot dt$$

Hence, the threshold voltage and the mobility of the drive transistor 220 may be extracted by reading the output voltage 256 of the amplifier 250 in the middle and at the end of the read phase 326.

FIG. 3B is a timing diagram for the reading process of the threshold turn-on voltage parameter of the OLED 222 in FIG. 2. The reading process of the OLED 222 also includes four phases, a reset phase 340, an integration phase 342, a pre-charge phase 344 and a read phase 346. Just like the reading process for the drive transistor 220 in FIG. 3A, the reading process for OLED starts by activating the select input 230 with a high select signal 302. The timing of the signals 304, 306, 308, and 310 ($\phi_1$, $\phi_2$, $\phi_3$, $\phi_4$) to the switches 260, 262, 264 and 254 is the same as the read process for the drive transistor 220 in FIG. 3A. A programming signal 332 for the programming input 232, a signal 334 for the node 244 and an output signal 336 for the output of the amplifier 250 are different from the signals in FIG. 3A.

During the reset phase 340, a high enough voltage level 332 ($V_{RST\_OLED}$) is applied to the programming data input 232 ($V_{Data}$) to maximize the current flow through the drive transistor 220. Consequently, the voltage at the node 244 in FIG. 2 is discharged to ground through the switch 260 to get ready for the next cycle.

During the integration phase 342, the signal 306 ($\phi_2$) to the switch 262 stays high which provides a charging path from the voltage source 210 through the switch 262. The programming voltage input 232 ($V_{Data}$) is set to a voltage level 332 ($V_{INT\_OLED}$) such that once the capacitor 240 ($C_{oled}$) is fully charged, the voltage at the node 244 is greater than the turn-on voltage of the OLED 222. In this case, by the end of the integration phase 342, the drive transistor 220 is driving a constant current through the OLED 222.

During the pre-charge phase 344, the drive transistor 220 is turned off by the signal 332 to the programming input 232. The capacitor 240 ($C_{oled}$) is allowed to discharge until it reaches the turn-on voltage of OLED 222 by the end of the pre-charge phase 344.

During the read phase 346, a high enough voltage 332 ($V_{RD\_OLED}$) is applied to the programming voltage input 232 ($V_{Data}$) to minimize the channel resistance of the drive transistor 220. If the pre-charge phase is long enough, the settled voltage across the capacitor 252 ($C_{int}$) will not be a function of pre-charge time. Consequently, the output voltage 256 of the charge-pump amplifier 250 at the end of the read phase is given by:

$$V_{out} = -\frac{C_{oled}}{C_{int}} \cdot V_{ON,oled}$$

The signal 308 ($\phi_3$) to the switch 264 is kept high to provide a charge transfer path from the drive circuit 202 to the charge-pump amplifier 250. Thus the output voltage signal 336 may be used to determine the turn-on voltage of the OLED 220.

FIG. 3C is a timing diagram for the direct reading of the drive transistor 220 using the extraction circuit 200 in FIG.

2. The direct reading process has a reset phase 350, a pre-charge phase 352 and an integrate/read phase 354. The readout process is initiated by activating the select input 230 in FIG. 2. The select signal 302 to the select input 230 is kept high throughout the readout process as shown in FIG. 3C. The signals 364 and 366 ($\phi_1$, $\phi_2$) for the switches 260 and 262 are inactive in this readout process.

During the reset phase 350, the signals 368 and 370 ($\phi_3$, $\phi_4$) for the switches 264 and 254 are set high in order to provide a discharge path to virtual ground. A high enough voltage 372 ($V_{RST\_TFT}$) is applied to the programming input 232 ($V_{Data}$) to maximize the current flow through the drive transistor 220. Consequently, the node 244 is discharged to the common-mode voltage 374 ($VCM_{RST}$) to get ready for the next cycle.

During the pre-charge phase 354, the drive transistor 220 is turned off by applying an off voltage 372 ($V_{OFF}$) to the programming input 232 in FIG. 2. The common-mode voltage input 258 to the positive input of the amplifier 250 is raised to $VCM_{RD}$ in order to precharge the line capacitance. At the end of the pre-charge phase 354, the signal 370 ($\phi_4$) to the switch 254 is turned off to prepare the charge-pump amplifier 250 for the next cycle.

At the beginning of the read/integrate phase 356, the programming voltage input 232 ($V_{Data}$) is raised to $V_{INT\_TFT}$ 372 to turn the drive transistor 220 on. The capacitor 240 ($C_{OLED}$) starts to accumulate the charge until $V_{Data}$ minus the voltage at the node 244 is equal to the threshold voltage of the drive transistor 220. In the meantime, a proportional charge is accumulated in the capacitor 252 ($C_{INT}$). Accordingly, at the end of the read cycle 356, the output voltage 376 at the output 256 of the amplifier 250 is a function of the threshold voltage which is given by:

$$V_{out} = \frac{C_{oled}}{C_{int}} \cdot (V_{Data} - V_{th})$$

As indicated by the above equation, in the case of the direct reading, the output voltage has a positive polarity. Thus, the threshold voltage of the drive transistor 220 may be determined by the output voltage of the amplifier 250.

Figure 4A:
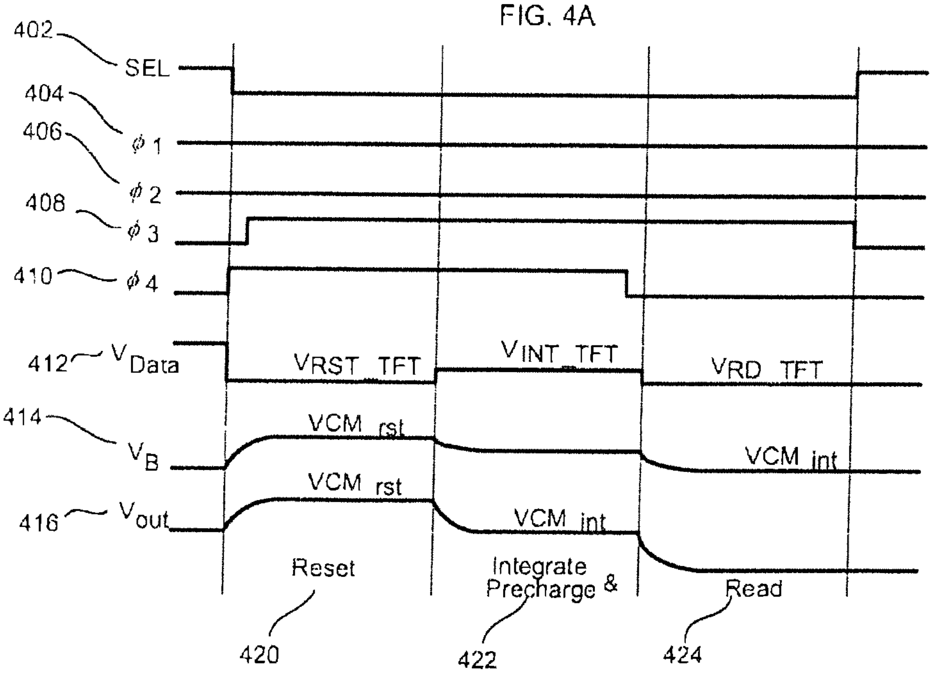
FIG. 4A is a signal timing diagram of the signals to the data extraction circuit to extract the threshold voltage and mobility of a p-type drive transistor in FIG. 2.
Figure 4B:
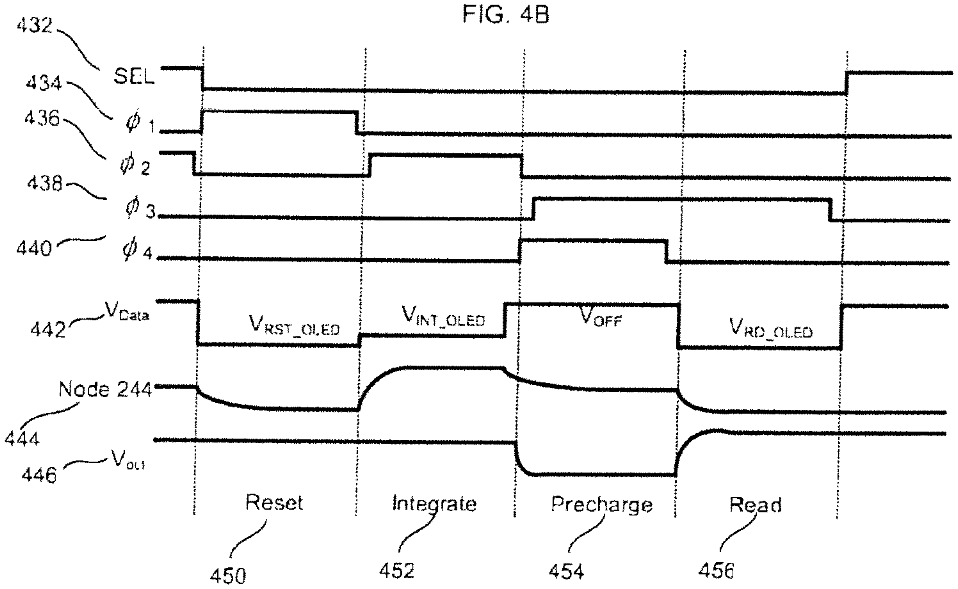
FIG. 4B is a signal timing diagram of the signals to the data extraction circuit to extract the characteristic voltage of the OLED in FIG. 2 with a p-type drive transistor.
Figure 4C:
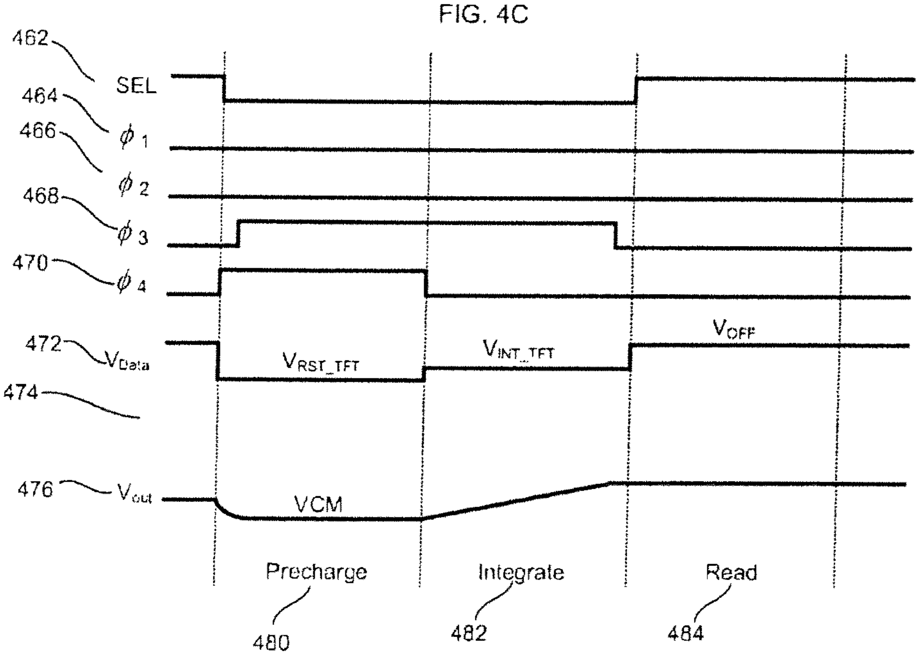
FIG. 4C is a signal timing diagram of the signals to the data extraction circuit for a direct read to extract the threshold voltage of a p-type drive transistor in FIG. 2.

As explained above, the drive transistor 220 in FIG. 2 may be a p-type transistor. FIG. 4A-4C are signal timing diagrams of the signals applied to the components in FIG. 2 to extract voltage threshold and mobility from the drive transistor 220 and the OLED 222 when the drive transistor 220 is a p-type transistor. In the example where the drive transistor 220 is a p-type transistor, the source of the drive transistor 220 is coupled to the supply line 212 (VD) and the drain of the drive transistor 220 is coupled to the OLED 222. FIG. 4A is a timing diagram showing the signals applied to the extraction circuit 200 to extract the threshold voltage and mobility from the drive transistor 220 when the drive transistor 220 is a p-type transistor. FIG. 4A shows voltage signals 402-416 for the select input 232, the switches 260, 262, 264 and 254, the programming data input 230, the voltage at the node 244 and the output voltage 256 in FIG. 2. The data extraction is performed in three phases, a reset phase 420, an integrate/pre-charge phase 422, and a read phase 424.

As shown in FIG. 4A, the select signal 402 is active low and kept low throughout the readout phases 420, 422 and 424. Throughout the readout process, the signals 404 and 406 ($\phi_1$, $\phi_2$) to the switches 260 and 262 are kept low (inactive). During the reset phase, the signals 408 and 410 ($\phi_3$, $\phi_4$) at the switches 264 and 254 are set to high in order to charge the node 244 to a reset common mode voltage level $VCM_{rst}$. The common-mode voltage input 258 on the charge-pump input 258 ($VCM_{rst}$) should be low enough to keep the OLED 222 off. The programming data input 232 $V_{Data}$ is set to a low enough value 412 ($V_{RST\_TFT}$) to provide maximum charging current through the driver transistor 220.

During the integrate/pre-charge phase 422, the common-mode voltage on the common voltage input 258 is reduced to $VCM_{int}$ and the programming input 232 ($V_{Data}$) is increased to a level 412 ($V_{INT\_TFT}$) such that the drive transistor 220 will conduct in the reverse direction. If the allocated time for this phase is long enough, the voltage at the node 244 will decline until the gate to source voltage of the drive transistor 220 reaches the threshold voltage of the drive transistor 220. Before the end of this cycle, the signal 410 ($\phi_4$) to the switch 254 goes low in order to prepare the charge-pump amplifier 250 for the read phase 424.

The read phase 424 is initiated by decreasing the signal 412 at the programming input 232 ($V_{Data}$) to $V_{RD\_TFT}$ so as to turn the drive transistor 220 on. The charge stored on the capacitor 240 ($C_{OLED}$) is now transferred to the capacitor 254 ($C_{INT}$). At the end of the read phase 424, the signal 408 ($\phi_3$) to the switch 264 is set to low in order to isolate the charge-pump amplifier 250 from the drive circuit 202. The output voltage signal 416 $V_{out}$ from the amplifier output 256 is now a function of the threshold voltage of the drive transistor 220 given by:

$$V_{out} = -\frac{C_{oled}}{C_{int}}(V_{INT\_TFT} - V_{th})$$

FIG. 4B is a timing diagram for the in-pixel extraction of the threshold voltage of the OLED 222 in FIG. 2 assuming that the drive transistor 220 is a p-type transistor. The extraction process is very similar to the timing of signals to the extraction circuit 200 for an n-type drive transistor in FIG. 3A. FIG. 4B shows voltage signals 432-446 for the select input 230, the switches 260, 262, 264 and 254, the programming data input 232, the voltage at the node 244 and the amplifier output 256 in FIG. 2. The extraction process includes a reset phase 450, an integration phase 452, a pre-charge phase 454 and a read phase 456. The major difference in this readout cycle in comparison to the readout cycle in FIG. 4A is the voltage levels of the signal 442 to the programming data input 232 ($V_{Data}$) that are applied to the driver circuit 210 in each readout phase. For a p-type thin film transistor that may be used for the drive transistor 220, the select signal 430 to the select input 232 is active low. The select input 232 is kept low throughout the readout process as shown in FIG. 4B.

The readout process starts by first resetting the capacitor 240 ($C_{OLED}$) in the reset phase 450. The signal 434 ($\phi_1$) to the switch 260 is set high to provide a discharge path to ground. The signal 442 to the programming input 232 ($V_{Data}$) is lowered to $V_{RST\_OLED}$ in order to turn the drive transistor 220 on.

In the integrate phase 452, the signals 434 and 436 ($\phi_1$, $\phi_2$) to the switches 260 and 262 are set to off and on states respectively, to provide a charging path to the OLED 222. The capacitor 240 ($C_{OLED}$) is allowed to charge until the voltage 444 at node 244 goes beyond the threshold voltage of the OLED 222 to turn it on. Before the end of the integration phase 452, the voltage signal 442 to the programming input 232 ($V_{Data}$) is raised to $V_{OFF}$ to turn the drive transistor 220 off.

During the pre-charge phase 454, the accumulated charge on the capacitor 240 ($C_{OLED}$) is discharged into the OLED 222 until the voltage 444 at the node 244 reaches the threshold voltage of the OLED 222. Also, in the pre-charge phase 454, the signals 434 and 436 ($\phi_1$, $\phi_2$) to the switches 260 and 262 are turned off while the signals 438 and 440 ($\phi_3$, $\phi_4$) to the switches 264 and 254 are set on. This provides the condition for the amplifier 250 to precharge the supply line 212 (VD) to the common mode voltage input 258 (VCM) provided at the positive input of the amplifier 250. At the end of the pre-charge phase, the signal 430 ($\phi_4$) to the switch 254 is turned off to prepare the charge-pump amplifier 250 for the read phase 456.

The read phase 456 is initiated by turning the drive transistor 220 on when the voltage 442 to the programming input 232 ($V_{Data}$) is lowered to $V_{RD\_OLED}$. The charge stored on the capacitor 240 ($C_{OLED}$) is now transferred to the capacitor 254 ($C_{INT}$) which builds up the output voltage 446 at the output 256 of the amplifier 250 as a function of the threshold voltage of the OLED 220.

FIG. 4C is a signal timing diagram for the direct extraction of the threshold voltage of the drive transistor 220 in the extraction system 200 in FIG. 2 when the drive transistor 220 is a p-type transistor. FIG. 4C shows voltage signals 462-476 for the select input 230, the switches 260, 262, 264 and 254, the programming data input 232, the voltage at the node 244 and the output voltage 256 in FIG. 2. The extraction process includes a pre-charge phase 480 and an integration phase 482. However, in the timing diagram in FIG. 4C, a dedicated final read phase 484 is illustrated which may be eliminated if the output of charge-pump amplifier 250 is sampled at the end of the integrate phase 482.

The extraction process is initiated by simultaneous pre-charging of the drain storage capacitor 224, the source storage capacitor 226, the capacitor 240 ($C_{OLED}$) and the capacitor 242 in FIG. 2. For this purpose, the signals 462, 468 and 470 to the select line input 230 and the switches 264 and 254 are activated as shown in FIG. 4C. Throughout the readout process, the signals 404 and 406 ($\phi_1$, $\phi_2$) to the switches 260 and 262 are kept low. The voltage level of common mode voltage input 258 (VCM) determines the voltage on the supply line 212 and hence the voltage at the node 244. The common mode voltage (VCM) should be low enough such that the OLED 222 does not turn on. The voltage 472 to the programming input 232 ($V_{Data}$) is set to a level ($V_{RST\_TFT}$) low enough to turn the transistor 220 on.

At the beginning of the integrate phase 482, the signal 470 ($\phi_4$) to the switch 254 is turned off in order to allow the charge-pump amplifier 250 to integrate the current through the drive transistor 220. The output voltage 256 of the charge-pump amplifier 250 will incline at a constant rate which is a function of the threshold voltage of the drive transistor 220 and its gate-to-source voltage. Before the end of the integrate phase 482, the signal 468 ($\phi_3$) to the switch 264 is turned off to isolate the charge-pump amplifier 250 from the driver circuit 220. Accordingly, the output voltage 256 of the amplifier 250 is given by:

$$V_{out} = I_{TFT} \cdot \frac{T_{int}}{C_{int}}$$

where $I_{TFT}$ is the drain current of the drive transistor 220 which is a function of the mobility and ($V_{CM}-V_{DATA}-|V_{th}|$) $T_{int}$ is the length of the integration time. In the optional read phase 484, the signal 468 ($\phi_3$) to the switch 264 is kept low to isolate the charge-pump amplifier 250 from the driver circuit 202. The output voltage 256, which is a function of the mobility and threshold voltage of the drive transistor 220, may be sampled any time during the read phase 484.

Figure 4D:
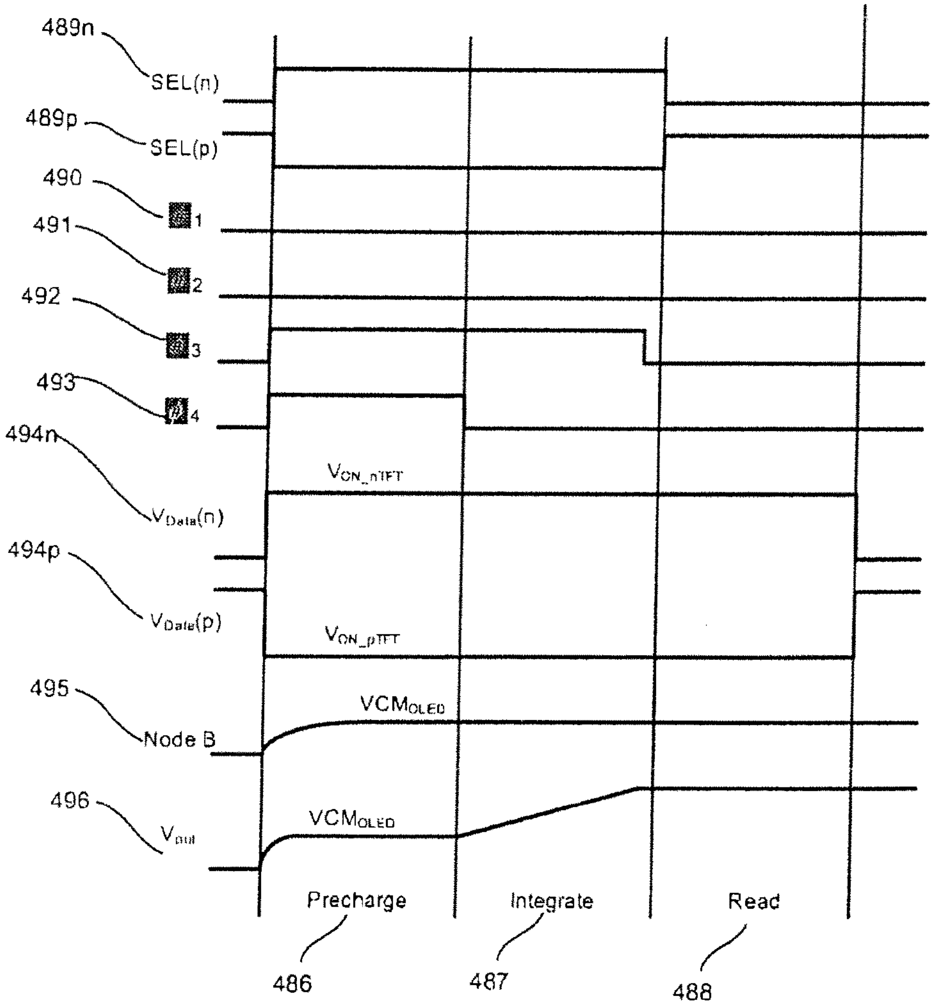
FIG. 4D is a signal timing diagram of the signals to the data extraction circuit for a direct read of the OLED turn-on voltage using either an n-type or p-type drive transistor in FIG. 2.

FIG. 4D is a timing diagram for the direct reading of the OLED 222 in FIG. 2. When the drive transistor 220 is turned on with a high enough gate-to-source voltage it may be utilized as an analog switch to access the anode terminal of the OLED 222. In this case, the voltage at the node 244 is essentially equal to the voltage on the supply line 212 (VD). Accordingly, the drive current through the drive transistor 220 will only be a function of the turn-on voltage of the OLED 222 and the voltage that is set on the supply line 212. The drive current may be provided by the charge-pump amplifier 250. When integrated over a certain time period, the output voltage 256 of the integrator circuit 206 is a measure of how much the OLED 222 has aged.

FIG. 4D is a timing diagram showing the signals applied to the extraction circuit 200 to extract the turn-on voltage from the OLED 222 via a direct read. FIG. 4D shows the three phases of the readout process, a pre-charge phase 486, an integrate phase 487 and a read phase 488. FIG. 4D includes a signal 489*n* or 489*p* for the select input 230 in FIG. 2, a signal 490 ($\phi_1$) to the switch 260, a signal 491 ($\phi_2$) for the switch 262, a signal 492 ($\phi_3$) for the switch 264, a signal 493 ($\phi_4$) for the switch 254, a programming voltage signal 494*n* or 494*p* for the programming data input 232 in FIG. 2, a voltage 495 of the node 244 in FIG. 2 and an output voltage signal 496 for the output 256 of the amplifier 250 in FIG. 2.

The process starts by activating the select signal corresponding to the desired row of pixels in array 102. As illustrated in FIG. 4D, the select signal 489*n* is active high for an n-type select transistor and active low for a p-type select transistor. A high select signal 489*n* is applied to the select input 230 in the case of an n-type drive transistor. A low signal 489*p* is applied to the select input 230 in the case of a p-type drive transistor for the drive transistor 220.

The select signal 489*n* or 489*p* will be kept active during the pre-charge and integrate cycles 486 and 487. The $\phi_1$ and $\phi_2$ inputs 490 and 491 are inactive in this readout method. During the pre-charge cycle, the switch signals 492 $\phi_3$ and 493 $\phi_4$ are set high in order to provide a signal path such that the parasitic capacitance 242 of the supply line ($C_P$) and the voltage at the node 244 are pre-charged to the common-mode voltage ($VCM_{OLED}$) provided to the non-inverting terminal of the amplifier 250. A high enough drive voltage signal 494*n* or 494*p* ($V_{ON\_nTFT}$ or $V_{ON\_PTFT}$) is applied to the data input 232 ($V_{Data}$) to operate the drive transistor 220 as an analog switch. Consequently, the supply voltage 212 VD and the node 244 are pre-charged to the common-mode voltage ($VCM_{OLED}$) to get ready for the next cycle. At the beginning of the integrate phase 487, the switch input 493 $\phi_4$ is turned off in order to allow the charge-pump module 206 to integrate the current of the OLED 222. The output voltage 496 of the charge-pump module 206 will incline at a constant rate which is a function of the turn-on voltage of the OLED 222 and the voltage 495 set on the node 244, i.e. $VCM_{OLED}$. Before the end of the integrate phase 487, the switch signal 492 $\phi_3$ is turned off to isolate the charge-pump module 206 from the pixel circuit 202. From this instant beyond, the output voltage is constant until the charge-pump module 206 is reset for another reading. When integrated over a certain time period, the output voltage of the integrator is given by:

$$V_{out} = I_{OLED} \cdot \frac{T_{int}}{C_{int}}$$

which is a measure of how much the OLED has aged. $T_{int}$ in this equation is the time interval between the falling edge of the switch signal 493 ($\phi_4$) to the falling edge of the switch signal 492 ($\phi_3$).

Figure 5:
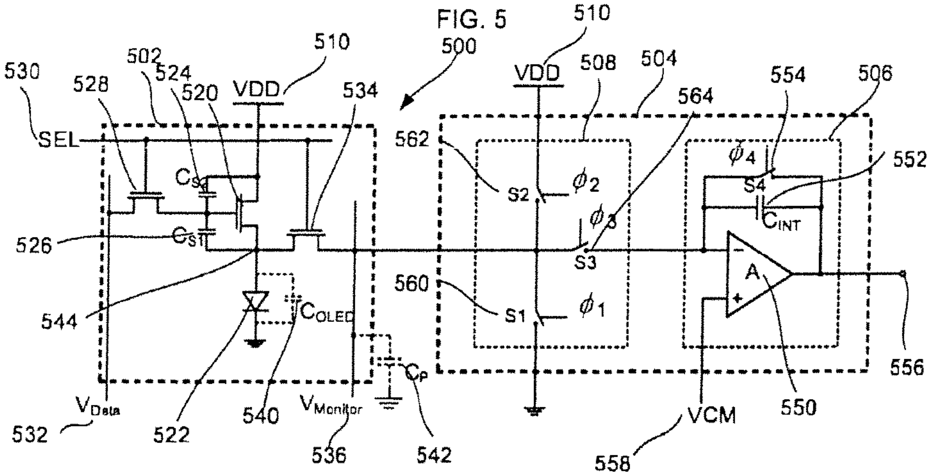
FIG. 5 is a circuit diagram of a data extraction circuit for a three-transistor drive circuit for a pixel in the AMOLED display in FIG. 1 for extraction of parameters.

Similar extraction processes of a two transistor type driver circuit such as that in FIG. 2 may be utilized to extract non-uniformity and aging parameters such as threshold voltages and mobility of a three transistor type driver circuit as part of the data extraction system 500 as shown in FIG. 5. The data extraction system 500 includes a drive circuit 502 and a readout circuit 504. The readout circuit 504 is part of the current supply and readout circuit 120 and gathers data from a column of pixels 104 as shown in FIG. 1 and includes a charge pump circuit 506 and a switch-box circuit 508. A voltage source 510 provides the supply voltage (VDD) to the drive circuit 502. The charge-pump and switch-box circuits 506 and 508 are implemented on the top or bottom side of the array 102 such as in the voltage drive 114 and the current supply and readout circuit 120 in FIG. 1. This is achieved by either direct fabrication on the same substrate as for the array 102 or by bonding a microchip on the substrate or a flex as a hybrid solution.

The drive circuit 502 includes a drive transistor 520, an organic light emitting device 522, a drain storage capacitor 524, a source storage capacitor 526 and a select transistor 528. A select line input 530 is coupled to the gate of the select transistor 528. A programming input 532 is coupled through the select transistor 528 to the gate of the drive transistor 220. The select line input 530 is also coupled to the gate of an output transistor 534. The output transistor 534 is coupled to the source of the drive transistor 520 and a voltage monitoring output line 536. The drain of the drive transistor 520 is coupled to the supply voltage source 510 and the source of the drive transistor 520 is coupled to the OLED 522. The source storage capacitor 526 is coupled between the gate and the source of the drive transistor 520. The drain storage capacitor 524 is coupled between the gate and the drain of the drive transistor 520. The OLED 522 has a parasitic capacitance that is modeled as a capacitor 540. The monitor output voltage line 536 also has a parasitic capacitance that is modeled as a capacitor 542. The drive transistor 520 in this example is a thin film transistor that is fabricated from amorphous silicon. A voltage node 544 is the point between the source terminal of the drive transistor 520 and the OLED 522. In this example, the drive transistor 520 is an n-type transistor. The system 500 may be implemented with a p-type drive transistor in place of the drive transistor 520.

The readout circuit 504 includes the charge-pump circuit 506 and the switch-box circuit 508. The charge-pump circuit 506 includes an amplifier 550 which has a capacitor 552 ($C_{int}$) in a negative feedback loop. A switch 554 (S4) is utilized to discharge the capacitor 552 $C_{int}$ during the pre-charge phase. The amplifier 550 has a negative input coupled to the capacitor 552 and the switch 554 and a positive input coupled to a common mode voltage input 558 (VCM). The amplifier 550 has an output 556 that is indicative of various extracted factors of the drive transistor 520 and OLED 522 as will be explained below.

The switch-box circuit 508 includes several switches 560, 562 and 564 to direct the current to and from the drive circuit 502. The switch 560 is used during the reset phase to provide the discharge path to ground. The switch 562 provides the supply connection during normal operation of the pixel 104 and also during the integration phase of the readout process. The switch 564 is used to isolate the charge-pump circuit 506 from the supply line voltage source 510.

In the three transistor drive circuit 502, the readout is normally performed through the monitor line 536. The readout can also be taken through the voltage supply line from the supply voltage source 510 similar to the process of timing signals in FIG. 3A-3C. Accurate timing of the input signals ($\phi_1$-$\phi_4$) to the switches 560, 562, 564 and 554, the select input 530 and the programming voltage input 532 ($V_{Data}$) is used to control the performance of the readout circuit 500. Certain voltage levels are applied to the programming data input 532 ($V_{Data}$) and the common mode voltage input 558 (VCM) during each phase of readout process.

The three transistor drive circuit 502 may be programmed differentially through the programming voltage input 532 and the monitoring output 536. Accordingly, the reset and pre-charge phases may be merged together to form a reset/pre-charge phase and which is followed by an integrate phase and a read phase.

Figure 6A:
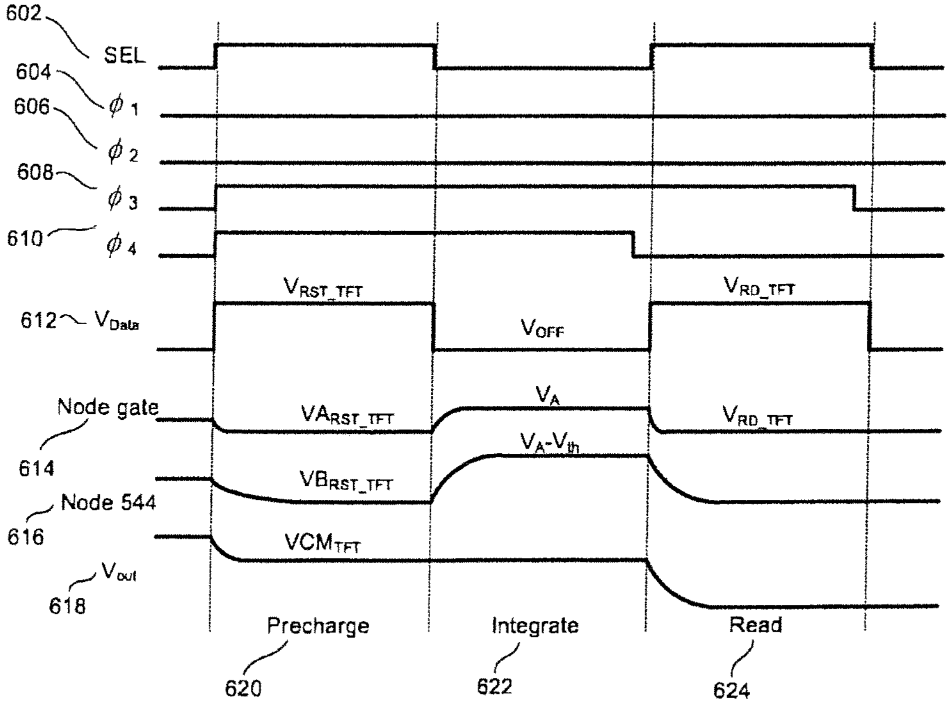
FIG. 6A is a signal timing diagram of the signals to the data extraction circuit to extract the threshold voltage and mobility of the drive transistor in FIG. 5.

FIG. 6A is a timing diagram of the signals involving the extraction of the threshold voltage and mobility of the drive transistor 520 in FIG. 5. The timing diagram includes voltage signals 602-618 for the select input 530, the switches 560, 562, 564 and 554, the programming voltage input 532, the voltage at the gate of the drive transistor 520, the voltage at the node 544 and the output voltage 556 in FIG. 5. The readout process in FIG. 6A has a pre-charge phase 620, an integrate phase 622 and a read phase 624. The readout process initiates by simultaneous precharging of the drain capacitor 524, the source capacitor 526, and the parasitic capacitors 540 and 542. For this purpose, the select line voltage 602 and the signals 608 and 610 ($\phi_3$, $\phi_4$) to the switches 564 and 554 are activated as shown in FIG. 6A. The signals 604 and 606 ($\phi_1$, $\phi_2$) to the switches 560 and 562 remain low throughout the readout cycle.

The voltage level of the common mode input 558 (VCM) determines the voltage on the output monitor line 536 and hence the voltage at the node 544. The voltage to the common mode input 558 ($VCM_{TFT}$) should be low enough such that the OLED 522 does not turn on. In the pre-charge phase 620, the voltage signal 612 to the programming voltage input 532 ($V_{Data}$) is high enough ($V_{RST\_TFT}$) to turn the drive transistor 520 on, and also low enough such that the OLED 522 always stays off.

At the beginning of the integrate phase 622, the voltage 602 to the select input 530 is deactivated to allow a charge to be stored on the capacitor 540 ($C_{OLED}$). The voltage at the node 544 will start to rise and the gate voltage of the drive transistor 520 will follow that with a ratio of the capacitance value of the source capacitor 526 over the capacitance of the source capacitor 526 and the drain capacitor 524 [$C_{S1}/(C_{S1}+C_{S2})$]. The charging will complete once the difference between the gate voltage of the drive transistor 520 and the voltage at node 544 is equal to the threshold voltage of the drive transistor 520. Before the end of the integration phase 622, the signal 610 ($\phi_4$) to the switch 554 is turned off to prepare the charge-pump amplifier 550 for the read phase 624.

For the read phase 624, the signal 602 to the select input 530 is activated once more. The voltage signal 612 on the programming input 532 ($V_{RD\_TFT}$) is low enough to keep the drive transistor 520 off. The charge stored on the capacitor 240 ($C_{OLED}$) is now transferred to the capacitor 254 ($C_{INT}$) and creates an output voltage 618 proportional to the threshold voltage of the drive transistor 520:

$$V_{out} = -\frac{C_{oled}}{C_{int}}(V_G - V_{th})$$

Before the end of the read phase 624, the signal 608 ($\phi_3$) to the switch 564 turns off to isolate the charge-pump circuit 506 from the drive circuit 502.

Figure 6B:
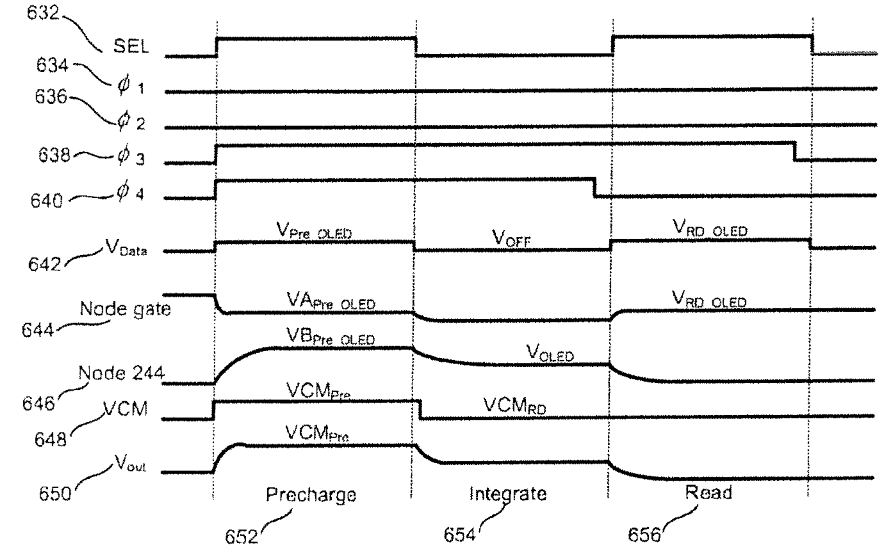
FIG. 6B is a signal timing diagram of the signals to the data extraction circuit to extract the characteristic voltage of the OLED in FIG. 5.

FIG. 6B is a timing diagram for the input signals for extraction of the turn-on voltage of the OLED 522 in FIG. 5. FIG. 6B includes voltage signals 632-650 for the select input 530, the switches 560, 562, 564 and 554, the programming voltage input 532, the voltage at the gate of the drive transistor 520, the voltage at the node 544, the common mode voltage input 558, and the output voltage 556 in FIG. 5. The readout process in FIG. 6B has a pre-charge phase 652, an integrate phase 654 and a read phase 656. Similar to the readout for the drive transistor 220 in FIG. 6A, the readout process starts with simultaneous precharging of the drain capacitor 524, the source capacitor 526, and the parasitic capacitors 540 and 542 in the pre-charge phase 652. For this purpose, the signal 632 to the select input 530 and the signals 638 and 640 ($\phi_3$, $\phi_4$) to the switches 564 and 554 are activated as shown in FIG. 6B. The signals 634 and 636 ($\phi_1$, $\phi_2$) remain low throughout the readout cycle. The input voltage 648 ($VCM_{Pre}$) to the common mode voltage input 258 should be high enough such that the OLED 522 is turned on. The voltage 642 ($V_{Pre\_OLED}$) to the programming input 532 ($V_{Data}$) is low enough to keep the drive transistor 520 off.

At the beginning of the integrate phase 654, the signal 632 to the select input 530 is deactivated to allow a charge to be stored on the capacitor 540 ($C_{OLED}$). The voltage at the node 544 will start to fall and the gate voltage of the drive transistor 520 will follow with a ratio of the capacitance value of the source capacitor 526 over the capacitance of the source capacitor 526 and the drain capacitor 524 [$C_{S1}/(C_{S1}+C_{S2})$]. The discharging will complete once the voltage at node 544 reaches the ON voltage ($V_{OLED}$) of the OLED 522. Before the end of the integration phase 654, the signal 640 ($\phi_4$) to the switch 554 is turned off to prepare the charge-pump circuit 506 for the read phase 656.

For the read phase 656, the signal 632 to the select input 530 is activated once more. The voltage 642 on the ($V_{RD\_OLED}$) programming input 532 should be low enough to keep the drive transistor 520 off. The charge stored on the capacitor 540 ($C_{OLED}$) is then transferred to the capacitor 552 ($C_{INT}$) creating an output voltage 650 at the amplifier output 556 proportional to the ON voltage of the OLED 522.

$$V_{out} = -\frac{C_{oled}}{C_{int}} \cdot V_{ON,oled}$$

The signal 638 ($\phi_3$) turns off before the end of the read phase 656 to isolate the charge-pump circuit 508 from the drive circuit 502.

Figure 6C:
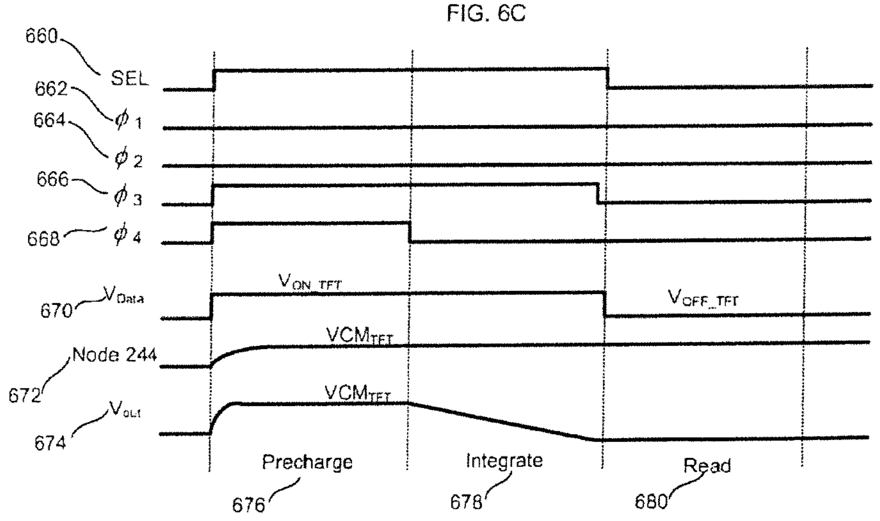
FIG. 6C is a signal timing diagram of the signals to the data extraction circuit for a direct read to extract the threshold voltage of the drive transistor in FIG. 5.

As shown, the monitor output transistor 534 provides a direct path for linear integration of the current for the drive transistor 520 or the OLED 522. The readout may be carried out in a pre-charge and integrate cycle. However, FIG. 6C shows timing diagrams for the input signals for an additional final read phase which may be eliminated if the output of charge-pump circuit 508 is sampled at the of the integrate phase. FIG. 6C includes voltage signals 660-674 for the select input 530, the switches 560, 562, 564 and 554, the programming voltage input 532, the voltage at the node 544, and the output voltage 556 in FIG. 5. The readout process in FIG. 6C therefore has a pre-charge phase 676, an integrate phase 678 and an optional read phase 680.

The direct integration readout process of the n-type drive transistor 520 in FIG. 5 as shown in FIG. 6C is initiated by simultaneous precharging of the drain capacitor 524, the source capacitor 526, and the parasitic capacitors 540 and 542. For this purpose, the signal 660 to the select input 530 and the signals 666 and 668 ($\phi_3$, $\phi_4$) to the switches 564 and 554 are activated as shown in FIG. 6C. The signals 662 and 664 ($\phi_1$, $\phi_2$) to the switches 560 and 562 remain low throughout the readout cycle. The voltage level of the common mode voltage input 558 (VCM) determines the voltage on the monitor output line 536 and hence the voltage at the node 544. The voltage signal ($VCM_{TFT}$) of the common mode voltage input 558 is low enough such that the OLED 522 does not turn on. The signal 670 ($V_{ON\_TFT}$) to the programming input 532 ($V_{Data}$) is high enough to turn the drive transistor 520 on.

At the beginning of the integrate phase 678, the signal 668 ($\phi_4$) to the switch 554 is turned off in order to allow the charge-pump amplifier 550 to integrate the current from the drive transistor 520. The output voltage 674 of the charge-pump amplifier 550 declines at a constant rate which is a function of the threshold voltage, mobility and the gate-to-source voltage of the drive transistor 520. Before the end of the integrate phase, the signal 666 ($\phi_3$) to the switch 564 is turned off to isolate the charge-pump circuit 508 from the drive circuit 502. Accordingly, the output voltage is given by:

$$V_{out} = -I_{TFT} \cdot \frac{T_{int}}{C_{int}}$$

where $I_{TFT}$ is the drain current of drive transistor 520 which is a function of the mobility and ($V_{Data}-V_{CM}-V_{th}$). $T_{int}$ is the length of the integration time. The output voltage 674, which is a function of the mobility and threshold voltage of the drive transistor 520, may be sampled any time during the read phase 680.

Figure 6D:
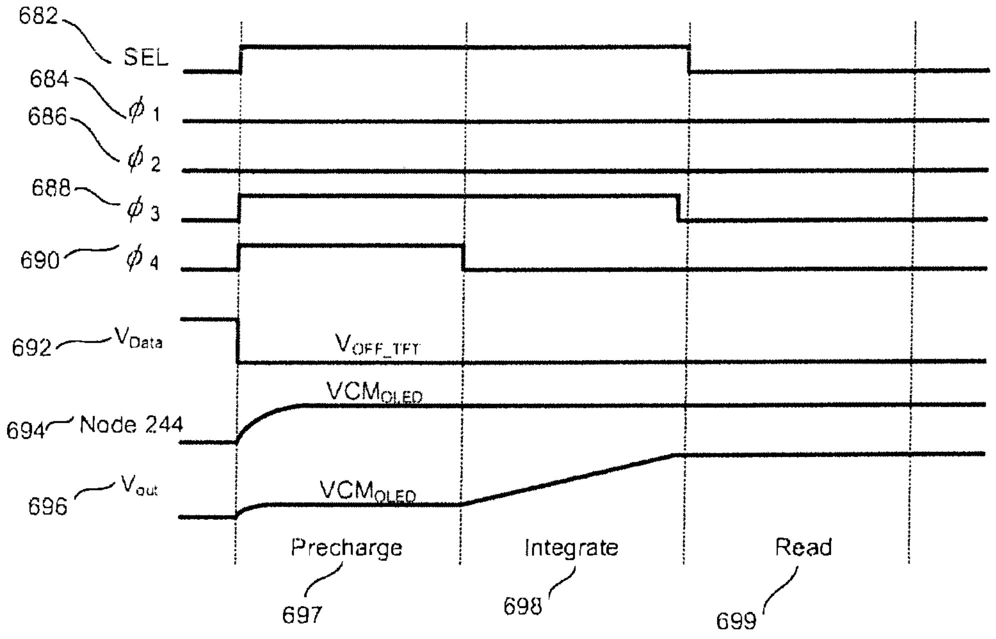
FIG. 6D is a signal timing diagram of the signals to the data extraction circuit for a direct read to extract the characteristic voltage of the OLED in FIG. 5.

FIG. 6D shows a timing diagram of input signals for the direct reading of the on (threshold) voltage of the OLED 522 in FIG. 5. FIG. 6D includes voltage signals 682-696 for the select input 530, the switches 560, 562, 564 and 554, the programming voltage input 532, the voltage at the node 544, and the output voltage 556 in FIG. 5. The readout process in FIG. 6C has a pre-charge phase 697, an integrate phase 698 and an optional read phase 699.

The readout process in FIG. 6D is initiated by simultaneous precharging of the drain capacitor 524, the source capacitor 526, and the parasitic capacitors 540 and 542. For this purpose, the signal 682 to the select input 530 and the signals 688 and 690 ($\phi_3$, $\phi_4$) to the switches 564 and 554 are activated as shown in FIG. 6D. The signals 684 and 686 ($\phi_1$, $\phi_2$) remain low throughout the readout cycle. The voltage level of the common mode voltage input 558 (VCM) determines the voltage on the monitor output line 536 and hence the voltage at the node 544. The voltage signal ($VCM_{OLED}$) of the common mode voltage input 558 is high enough such to turn the OLED 522 on. The signal 692 ($V_{OFF\_TFT}$) of the programming input 532 ($V_{Data}$) is low enough to keep the drive transistor 520 off.

At the beginning of the integrate phase 698, the signal 690 ($\phi_4$) to the switch 552 is turned off in order to allow the charge-pump amplifier 550 to integrate the current from the OLED 522. The output voltage 696 of the charge-pump amplifier 550 will incline at a constant rate which is a function of the threshold voltage and the voltage across the OLED 522.

Before the end of the integrate phase 698, the signal 668 ($\phi_3$) to the switch 564 is turned off to isolate the charge-pump circuit 508 from the drive circuit 502. Accordingly, the output voltage is given by:

$$V_{out} = I_{OLED} \cdot \frac{T_{int}}{C_{int}}$$

where $I_{OLED}$ is the OLED current which is a function of ($V_{CM}$-$V_{th}$), and $T_{int}$ is the length of the integration time. The output voltage, which is a function of the threshold voltage of the OLED 522, may be sampled any time during the read phase 699.

The controller 112 in FIG. 1 may be conveniently implemented using one or more general purpose computer systems, microprocessors, digital signal processors, micro-controllers, application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein. The controllers may also be implemented on a computer system or systems that extend across any network environment using any suitable interface mechanisms and communications technologies including, for example telecommunications in any suitable form (e.g., voice, modem, and the like), Public Switched Telephone Network (PSTNs), Packet Data Networks (PDNs), the Internet, intranets, a combination thereof, and the like.

Figure 7:
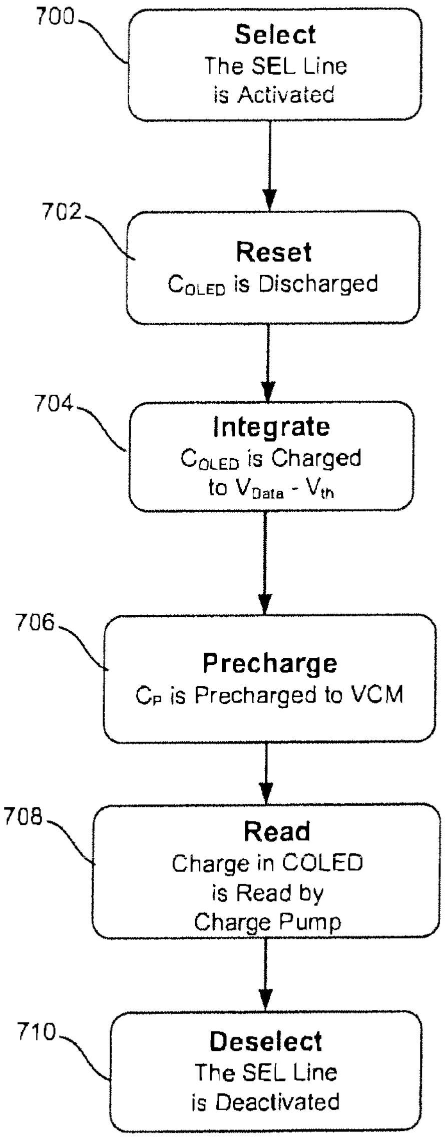
FIG. 7 is a flow diagram of the extraction cycle to readout the characteristics of the drive transistor and the OLED of a pixel circuit in an AMOLED display.

The operation of the example data extraction process, will now be described with reference to the flow diagram shown in FIG. 7. The flow diagram in FIG. 7 is representative of example machine readable instructions for determining the threshold voltages and mobility of a simple driver circuit that allows maximum aperture for a pixel 104 in FIG. 1. In this example and any other flow diagram examples herein, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the extraction sequence could be implemented by software, hardware, and/or firmware. Also, some or all of the machine readable instructions represented by the flowcharts herein, including FIG. 7, may be implemented manually. Further, although the example algorithm is described with reference to the flowcharts illustrated herein, including in FIG. 7, persons of ordinary skill in the art will readily appreciate that many other methods of implementing the example machine readable instructions may alternatively be used. For example, the order of execution of the blocks may be changed, and/or some of the blocks described may be changed, eliminated, or combined.

A pixel 104 under study is selected by turning the corresponding select and programming lines on (700). Once the pixel 104 is selected, the readout is performed in four phases. The readout process begins by first discharging the parasitic capacitance across the OLED ($C_{oled}$) in the reset phase (702). Next, the drive transistor is turned on for a certain amount of time which allows some charge to be accumulated on the capacitance across the OLED $C_{oled}$ (704). In the integrate phase, the select transistor is turned off to isolate the charge on the capacitance across the OLED $C_{oled}$ and then the line parasitic capacitance ($C_P$) is precharged to a known voltage level (706). Finally, the drive transistor is turned on again to allow the charge on the capacitance across the OLED $C_{oled}$ to be transferred to the charge-pump amplifier output in a read phase (708). The amplifier's output represent a quantity which is a function of mobility and threshold voltage. The readout process is completed by deselecting the pixel to prevent interference while other pixels are being calibrated (710).

Figure 8:
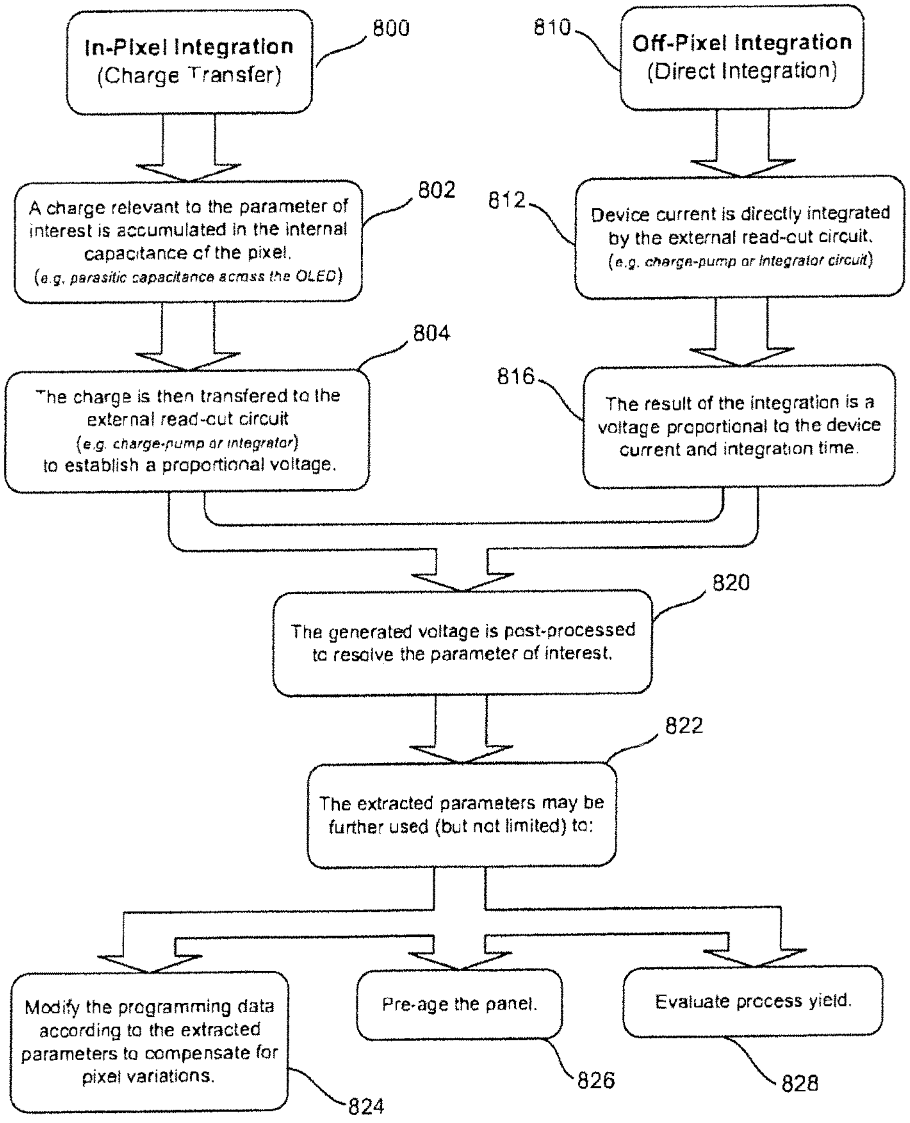
FIG. 8 is a flow diagram of different parameter extraction cycles and final applications.

FIG. 8 is a flow diagram of different extraction cycles and parameter applications for pixel circuits such as the two transistor circuit in FIG. 2 and the three transistor circuit in FIG. 5. One process is an in-pixel integration that involves charge transfer (800). A charge relevant to the parameter of interest is accumulated in the internal capacitance of the pixel (802). The charge is then transferred to the external read-out circuit such as the charge-pump or integrator to establish a proportional voltage (804). Another process is an off-pixel integration or direct integration (810). The device current is directly integrated by the external read-out circuit such as the charge-pump or integrator circuit (812).

In both processes, the generated voltage is post-processed to resolve the parameter of interest such as threshold voltage or mobility of the drive transistor or the turn-on voltage of the OLED (820). The extracted parameters may be then used for various applications (822). Examples of using the parameters include modifying the programming data according to the extracted parameters to compensate for pixel variations (824). Another example is to pre-age the panel of pixels (826). Another example is to evaluate the process yield of the panel of pixels after fabrication (828).

Figure 9:
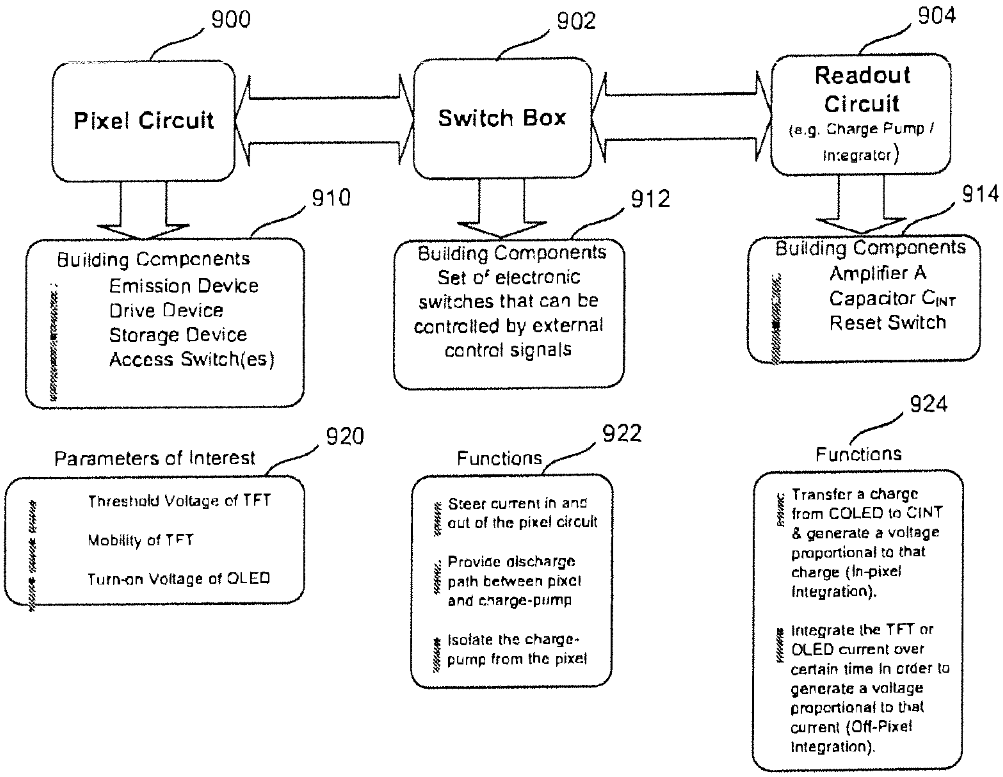
FIG. 9 is a block diagram and chart of the components of a data extraction system.

FIG. 9 is a block diagram and chart of the components of a data extraction system that includes a pixel circuit 900, a switch box 902 and a readout circuit 904 that may be a charge pump/integrator. The building components (910) of the pixel circuit 900 include an emission device such as an OLED, a drive device such as a drive transistor, a storage device such as a capacitor and access switches such as a select switch. The building components 912 of the switch box 902 include a set of electronic switches that may be controlled by external control signals. The building components 914 of the readout circuit 904 include an amplifier, a capacitor and a reset switch.

The parameters of interest may be stored as represented by the box 920. The parameters of interest in this example may include the threshold voltage of the drive transistor, the mobility of the drive transistor and the turn-on voltage of the OLED. The functions of the switch box 902 are represented by the box 922. The functions include steering current in and out of the pixel circuit 900, providing a discharge path between the pixel circuit 900 and the charge-pump of the readout circuit 904 and isolating the charge-pump of the readout circuit 904 from the pixel circuit 900. The functions of the readout circuit 904 are represented by the box 924. One function includes transferring a charge from the internal capacitance of the pixel circuit 900 to the capacitor of the readout circuit 904 to generate a voltage proportional to that charge in the case of in-pixel integration as in steps 800-804 in FIG. 8. Another function includes integrating the current of the drive transistor or the OLED of the pixel circuit 900 over a certain time in order to generate a voltage proportional to the current as in steps 810-814 of FIG. 8.

Figure 10:
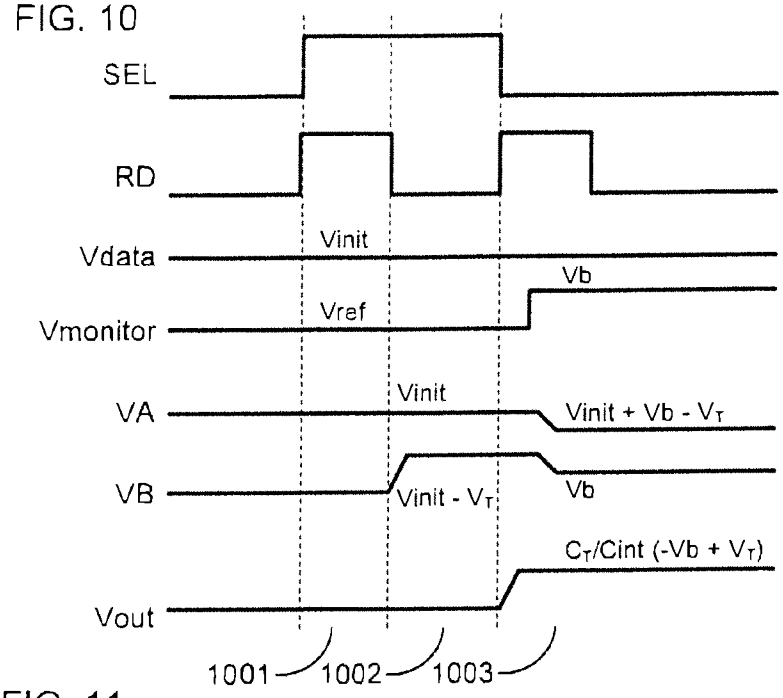
FIG. 10 is a signal timing diagram of the signals to the data extraction circuit to extract the threshold voltage and mobility of the drive transistor in a modified version of the circuit in FIG. 5.

FIG. 10 is a timing diagram of the signals involving the extraction of the threshold voltage and mobility of the drive transistor 520 in a modified version of the circuit of FIG. 5 in which the output transistor 534 has its gate connected to a separate control signal line RD rather than the SEL line. The readout process in FIG. 10 has a pre-charge phase 1001, an integrate phase 1002 and a read phase 1003. During the pre-charge phase 1001, the voltages $V_A$ and $V_B$ at the gate and source of the drive transistor 520 are reset to initial voltages by having both the SEL and RD signals high.

During the integrate phase 1002, the signal RD goes low, the gate voltage $V_A$ remains at $V_{init}$, and the voltage $V_B$ at the source (node 544) is charged back to a voltage which is a function of TFT characteristics (including mobility and threshold voltage), e.g., $(V_{init}-V_T)$. If the integrate phase 1002 is long enough, the voltage $V_B$ will be a function of threshold voltage $(V_T)$ only.

During the read phase 1003, the signal SEL is low, $V_A$ drops to $(V_{init}+Vb-Vt)$ and $V_B$ drops to Vb. The charge is transferred from the total capacitance $C_T$ at node 544 to the integrated capacitor $(C_{int})$ 552 in the readout circuit 504. The output voltage $V_{out}$ can be read using an Analog-to-Digital Convertor (ADC) at the output of the charge amplifier 550. Alternatively, a comparator can be used to compare the output voltage with a reference voltage while adjusting $V_{init}$ until the two voltages become the same. The reference voltage may be created by sampling the line without any pixel connected to the line during one phase and sampling the pixel charge in another phase.

Figure 11:
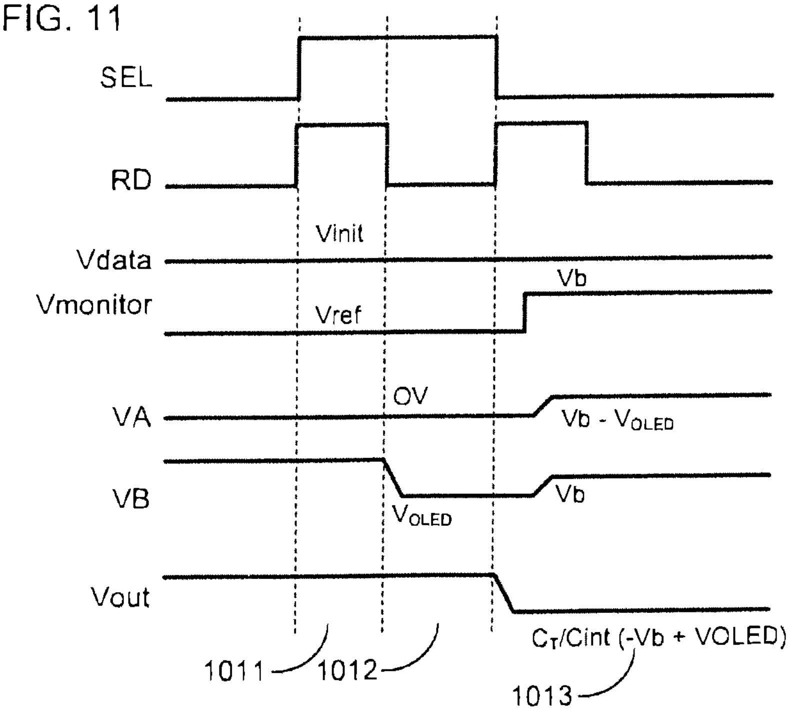
FIG. 11 is a signal timing diagram of the signals to the data extraction circuit to extract the characteristic voltage of the OLED in a modified version of the circuit in FIG. 5.

FIG. 11 is a timing diagram for the input signals for extraction of the turn-on voltage of the OLED 522 in the modified version of the circuit of FIG. 5.

Figure 12:
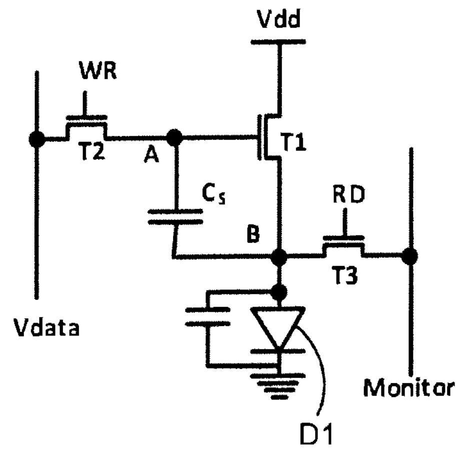
FIG. 12 is a circuit diagram of a data extraction circuit for reading the pixel charge from a drive circuit for a pixel in the AMOLED display in FIG. 1.

FIG. 12 is a circuit diagram of a pixel circuit for reading the pixel status by initializing the nodes externally. The drive transistor T1 has a drain connected to a supply voltage Vdd, a source connected to an OLED D1, and a gate connected to a Vdata line via a switching transistor T2. The gate of the transistor T2 is connected to a write line WR. A storage capacitor Cs is connected between a node A (between the gate of the drive transistor T1 and the transistor T2) and a node B (between the source of the drive transistor T1 and the OLED). A read transistor T3 couples the node B to a Monitor line and is controlled by the signal on a read line RD.

Figure 13:
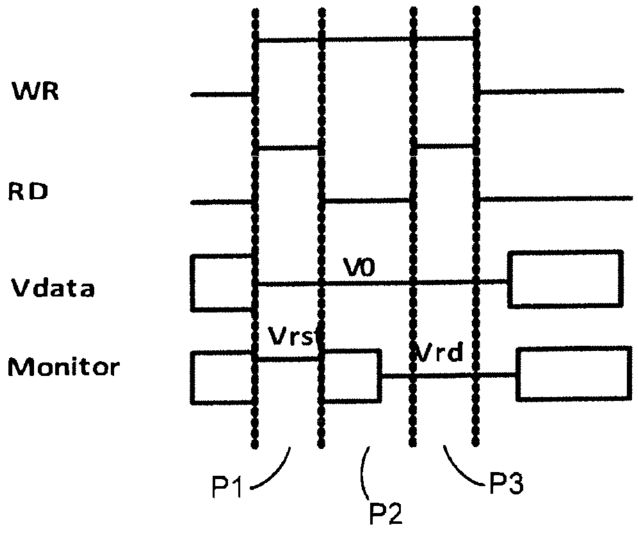
FIG. 13 is a signal timing diagram of the signals to the data extraction circuit of FIG. 12 for reading pixel status by initializing the nodes externally.

FIG. 13 is a timing diagram that illustrates an operation of the circuit of FIG. 12 that initializes the nodes externally. During a first phase P1, the drive transistor T1 is programmed with an OFF voltage V0, and the OLED voltage is set externally to Vrst via the Monitor line. During a second phase P2, the read signal RD turns off the transistor T3, and so the OLED voltage is discharged through the OLED D1 until the OLED turns off (creating the OLED on voltage threshold). During a third phase P3, the OFF voltage of the OLED is transferred to an external readout circuit (e.g., using a charge amplifier) via the Monitor line.

Figure 14:
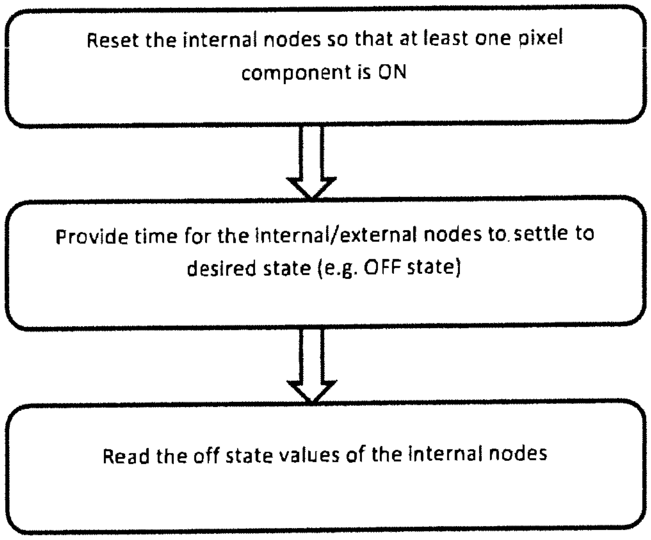
FIG. 14 is a flow diagram for reading the pixel status in the circuit of FIG. 12 by initializing the nodes externally.

FIG. 14 is a flow chart illustrating the reading of the pixel status by initializing the nodes externally. In the first step, the internal nodes are reset so that at least one pixel component is ON. The second step provides time for the internal/external nodes to settle to a desired state, e.g., the OFF state. The third step reads the OFF state values of the internal nodes.

Figure 15:
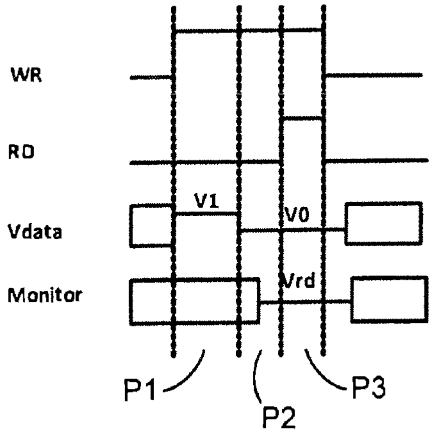
FIG. 15 is a signal timing diagram of the signals to the data extraction circuit of FIG. 12 for reading pixel status by initializing the nodes internally.

FIG. 15 is a timing diagram that illustrates a modified operation of the circuit of FIG. 12, still initializing the nodes internally. During a first phase P1, the drive transistor T1 is programmed with an ON voltage V1. Thus, the OLED voltage rises to a voltage higher than its ON voltage threshold. During a second phase P2, the drive transistor T1 is programmed with an OFF voltage V0, and so the OLED voltage is discharged through the OLED D1 until the OLED turns off (creating the OLED ON voltage threshold). During a third phase P3, the OLED ON voltage threshold is transferred to an external readout circuit (e.g., using a charge amplifier).

Figure 16:
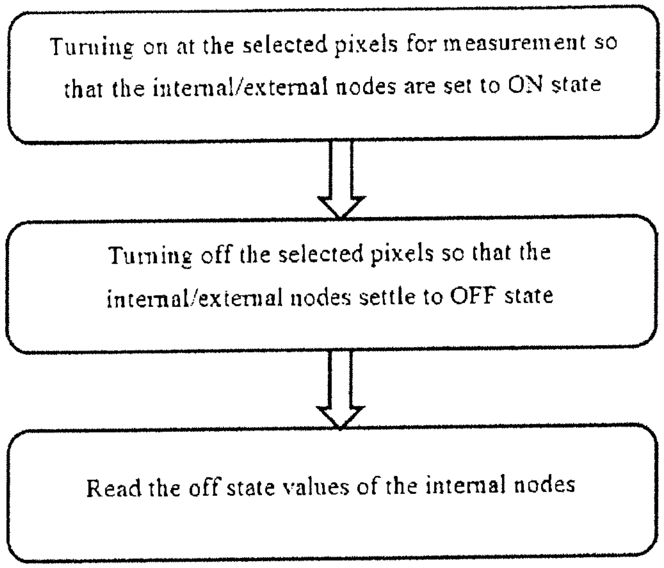
FIG. 16 is a flow diagram for reading the pixel status in the circuit of FIG. 12 by initializing the nodes internally.

FIG. 16 is a flow chart illustrating the reading of the pixel status by initializing the nodes internally. The first step turns on the selected pixels for measurement so that the internal/external nodes settle to the ON state. The second step turns off the selected pixels so that the internal/external nodes settle to the OFF state. The third step reads the OFF state values of the internal nodes.

Figure 17:
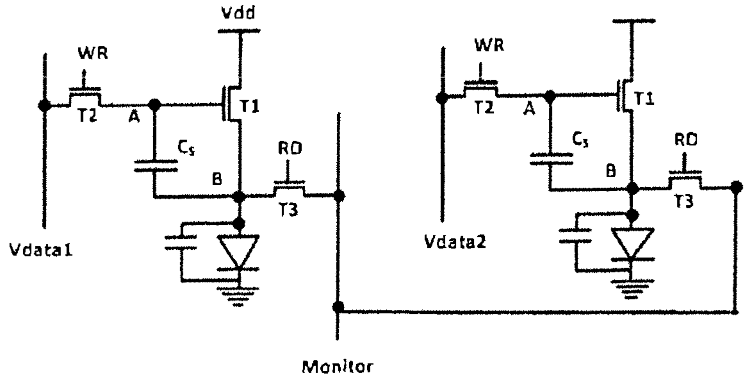
FIG. 17 is a circuit diagram of a pair of circuits like the circuit of FIG. 12 used with a common monitor line for reading the pixel charge from two different pixels in the AMOLED display in FIG. 1.
Figure 18:
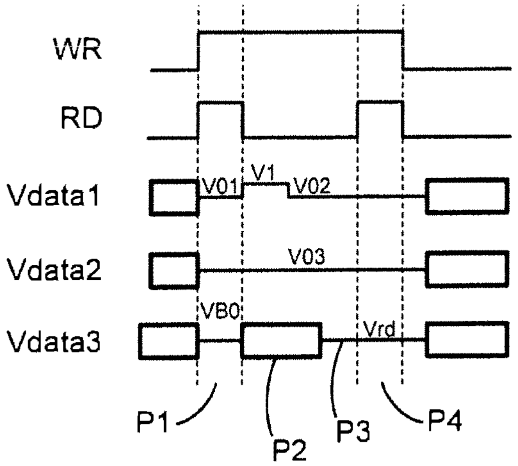
FIG. 18 is a signal timing diagram of the signals to the data extraction circuit of FIG. 17 for reading pixel charge when the monitor line is shared.

FIG. 17 is a circuit diagram illustrating two of the pixel circuits shown in FIG. 12 connected to a common Monitor line via the respective read transistors T3 of the two circuits, and FIG. 18 is a timing diagram illustrating the operation of the combined circuits for reading the pixel charges with the shared Monitor line. During a first phase P1, the pixels are programmed with OFF voltages V01 and V03, and the OLED voltage is reset to VB0. During a second phase P2, the read signal RD is OFF, and the pixel intended for measurement is programmed with an ON voltage V1 while the other pixel stays in an OFF state. Therefore, the OLED voltage of the pixel selected for measurement is higher than its ON threshold voltage, while the other pixel connected to the Monitor line stays in the reset state. During a third phase P3, the pixel programmed with an ON voltage is also turned off by being programmed with an OFF voltage V02. During this phase, the OLED voltage of the selected pixel discharges to its ON threshold voltage. During a fourth phase P4, the OLED voltage is read back.

Figure 19:
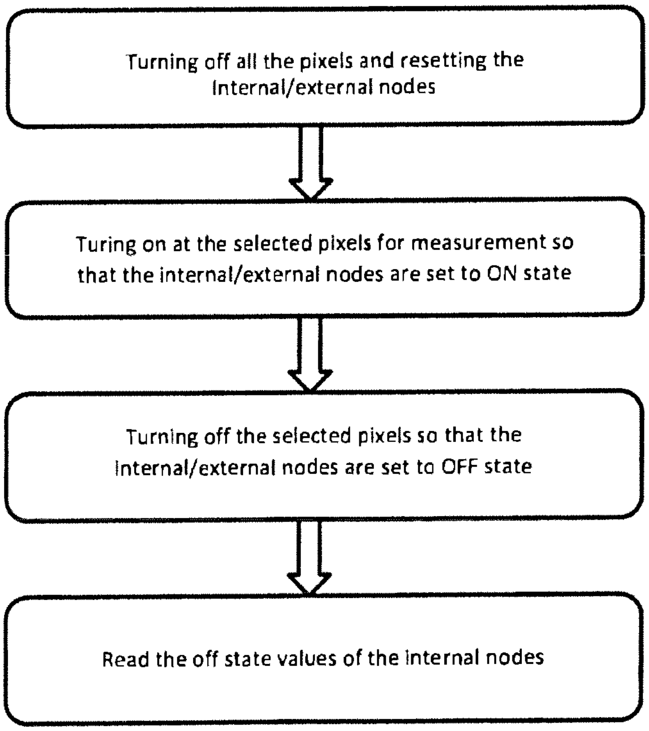
FIG. 19 is a flow diagram for reading the pixel status of a pair of circuits like the circuit of FIG. 17, with a common monitor line.

FIG. 19 is a flow chart illustrating the reading of the pixel status with a shared Monitor line. The first step turns off all the pixels and resets the internal/external nodes. The second step turns on the selected pixels for measurement so that the internal/external nodes are set to an ON state. The third step turns off the selected pixels so that the internal/external nodes settle to an OFF state. The fourth step reads the OFF state values of the internal nodes.

Figure 20A:
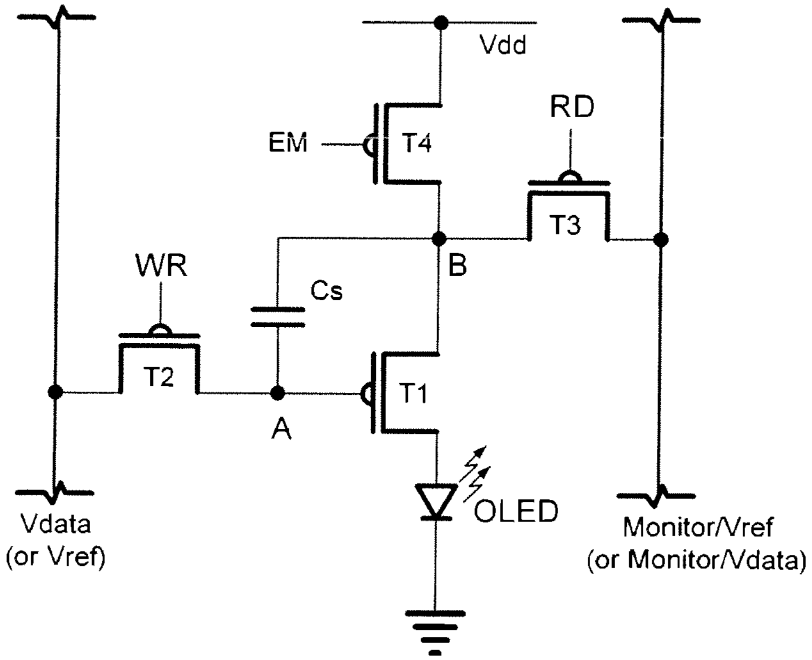
FIG. 20A is a schematic circuit diagram of a modified pixel circuit.
Figure 20B:
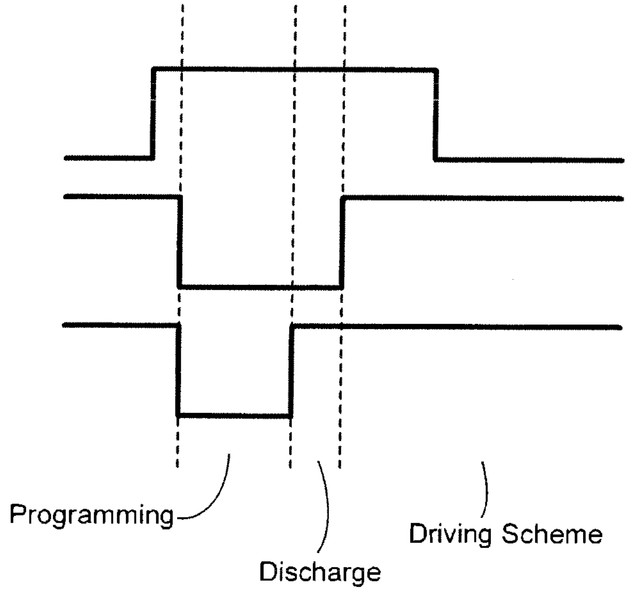
FIG. 20B is a timing diagram illustrating the operation of the pixel circuit of FIG. 20A with charge-based compensation.

FIG. 20A illustrates a pixel circuit in which a line Vdata is coupled to a node A via a switching transistor T2, and a line Monitor/Vref is coupled to a node B via a readout transistor T3. Node A is connected to the gate of a drive transistor T1 and to one side of a storage capacitor Cs. FIG. 20B is a timing diagram for operation of the circuit of FIG. 20A using charge-based compensation. Node B is connected to the source of the drive transistor T1 and to the other side of the capacitor Cs, as well as the drain of a switching transistor T4 connected between the source of the drive transistor and a supply voltage source Vdd. The operation in this case is as follows:

1. During a programming cycle, the pixel is programmed with a programming voltage $V_P$ supplied to node A from the line Vdata via the transistor T2, and node B is connected to a reference voltage Vref from line VMonitor/Vref via the transistor T3.

2. During a discharge cycle, a read signal RD turns off the transistor T3, and so the voltage at node B is adjusted to partially compensate for variation (or aging) of the drive transistor T1.

3. During a driving phase, a write signal WR turns off the transistor T2, and after a delay (that can be zero), a signal EM turns on the transistor T4 to connect the supply voltage Vdd to the drive transistor T1. Thus, the current of the drive transistor T1 is controlled by the voltage stored in a capacitor $C_S$, and the same current goes to the OLED.

In another configuration, a reference voltage Vref is supplied to node A from the line Vdata via the switching transistor T2, and node B is supplied with a programming voltage Vp from the Monitor/Vdata line via the read transistor T3. The operation in this case is as follows:

1. During the programming cycle, the node A is charged to the reference voltage Vref supplied from the line Vdata via the transistor T2, and node B is supplied with a programming voltage Vp from the line monitor/Vref via the transistor T3.

2. During the discharge cycle, the read signal RD turns off the transistor T3, and so the voltage at node B is adjusted to partially compensate for variation (or aging) of the drive transistor T1.

3. During the drive phase, the write signal WR turns off the transistor T2, and after a delay (that can be zero), the signal EM turns on the transistor T4 to connect the supply voltage Vdd to the drive transistor T1. Thus, the current of the drive transistor T1 is controlled by the voltage stored in the storage capacitor $C_S$, and the same current goes to the OLED.

Figure 21:
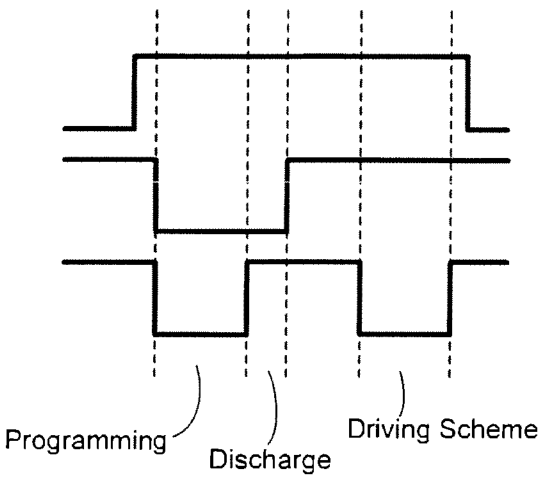
FIG. 21 is a timing diagram illustrating operation of the pixel circuit of FIG. 20A to obtain a readout of a parameter of the drive transistor.

FIG. 21 is a timing diagram for operation of the circuit of FIG. 20A to produce a readout of the current and/or the voltage of the drive transistor T1. The pixel is programmed either with or without a discharge period. If there is a discharge period, it can be a short time to partially discharge the capacitor $C_S$, or it can be long enough to discharge the capacitor $C_S$ until the drive transistor T1 is off. In the case of a short discharge time, the current of the drive transistor T1 can be read by applying a fixed voltage during the readout time, or the voltage created by the drive transistor T1 acting as an amplifier can be read by applying a fixed current from the line Monitor/Vref through the read transistor T3. In the case of a long discharge time, the voltage created at the node B as a result of discharge can be read back. This voltage is representative of the threshold voltage of the drive transistor T1.

Figure 22:
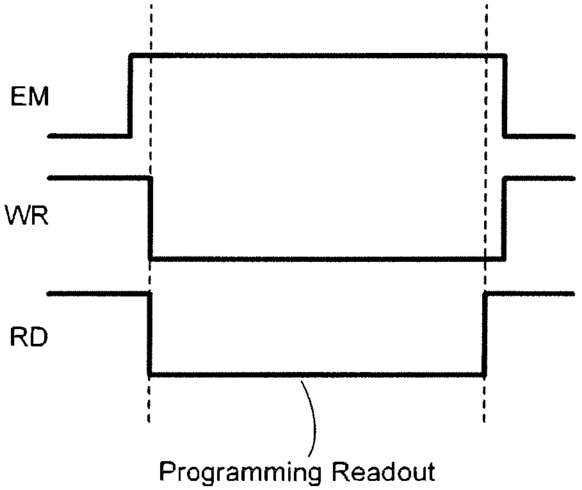
FIG. 22 is a timing diagram illustrating operation of the pixel circuit of FIG. 20A to obtain a readout of a parameter of the OLED.

FIG. 22 is a timing diagram for operation of the circuit of FIG. 20A to produce a readout of the OLED voltage. In the case depicted in FIG. 22, the pixel circuit is programmed so that the drive transistor T1 acts as a switch (with a high ON voltage), and the current or voltage of the OLED is measured through the transistors T1 and T3. In another case, several current/voltage points are measured by changing the voltage at node A and node B, and from the equation between the currents and voltages, the voltage of the OLED can be extracted. For example, the OLED voltage affects the current of the drive transistor T1 more if that transistor is operating in the linear regime; thus, by having current points in the linear and saturation operation regimes of the drive transistor T1, one can extract the OLED voltage from the voltage-current relationship of the transistor T1.

If two or more pixels share the same monitor lines, the pixels that are not selected for OLED measurement are turned OFF by applying an OFF voltage to their drive transistors T1.

Figure 23:
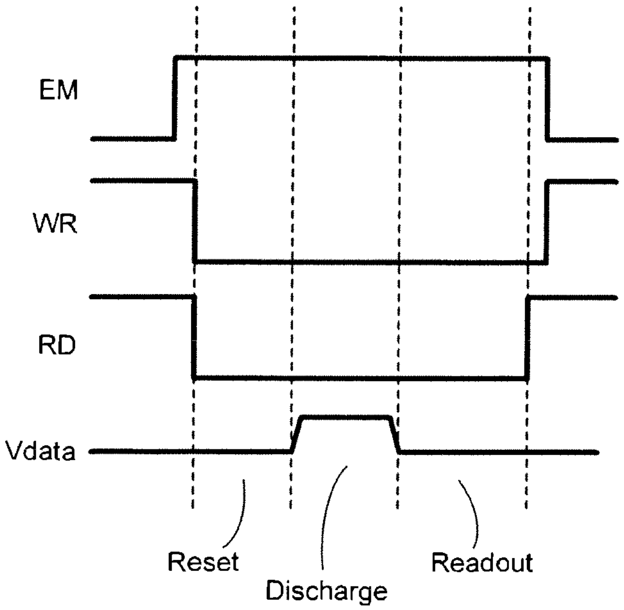
FIG. 23 is a timing diagram illustrating a modified operation of the pixel circuit of FIG. 20A to obtain a readout of a parameter of the OLED.

FIG. 23 is a timing diagram for a modified operation of the circuit of FIG. 20A to produce a readout of the OLED voltage, as follows:

1. The OLED is charged with an ON voltage during a reset phase.

2. The signal Vdata turns off the drive transistor T1 during a discharge phase, and so the OLED voltage is discharged through the OLED to an OFF voltage.

3. The OFF voltage of the OLED is read back through the drive transistor T1 and the read transistor T3 during a readout phase.

Figure 24:
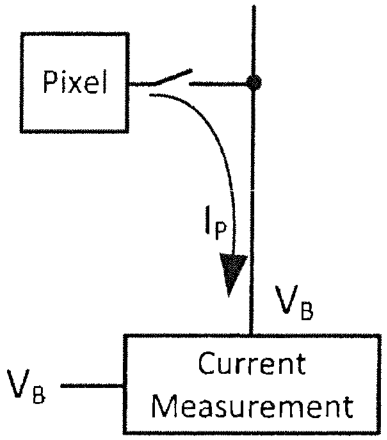
FIG. 24 is a circuit for extracting the parasitic capacitance from a pixel circuit using external compensation.

FIG. 24 illustrates a circuit for extracting the parasitic capacitance from a pixel circuit using external compensation. In most external compensation systems for OLED displays, the internal nodes of the pixels are different during the measurement and driving cycles. Therefore, the effect of parasitic capacitance will not be extracted properly.

The following is a procedure for compensating for a parasitic parameter:

1. Measure the pixel in state one with a set of voltages/currents (either external voltages/currents or internal voltages/currents).

2. Measure the pixel in state two with a different set of voltages/currents (either external voltages/currents or internal voltages/currents).

3. Based on a pixel model that includes the parasitic parameters, extract the parasitic parameters from the previous two measurements (if more measurements are needed for the model, repeat step 2 for different sets of voltages/currents).

Another technique is to extract the parasitic effect experimentally. For example, one can subtract the two set of measurements, and add the difference to other measurements by a gain. The gain can be extracted experimentally. For example, the scaled difference can be added to a measurement set done for a panel for a specific gray scale. The scaling factor can be adjusted experimentally until the image on the panel meets the specifications. This scaling factor can be used as a fixed parameter for all the other panels after that.

One method of external measurement of parasitic parameters is current readout. In this case, for extracting parasitic parameters, the external voltage set by a measurement circuit can be changed for two sets of measurements. FIG. 24 shows a pixel with a readout line for measuring the pixel current. The voltage of the readout line is controlled by a measurement unit bias voltage ($V_B$).

Figure 25:
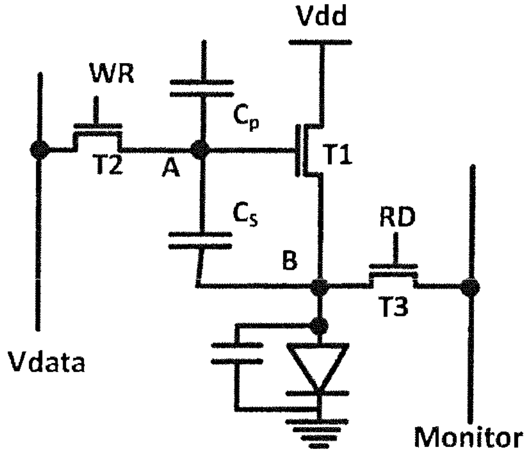
FIG. 25 illustrates a pixel circuit that can be used for current measurement.

FIG. 25 illustrates a pixel circuit that can be used for current measurement. The pixel is programmed with a calibrated programming voltage $V_{cal}$, and a monitor line is set to a reference voltage $V_{ref}$. Then the current of a drive transistor T1 is measured by turning on a transistor T3 with a control signal RD. During the driving cycle, the voltage at node B is at $V_{oled}$, and the voltage at node A changes from $V_{cal}$ to $V_{cal}+(V_{oled}-V_{ref})C_S/(C_P+C_S)$, where $V_{cal}$ is the calibrated programming voltage, $C_P$ is the total parasitic capacitance at node A, and $V_{ref}$ is the monitor voltage during programming. The gate-source voltage $V_{GS}$ of the drive transistor is different during the programming cycle $(V_P-V_{ref})$ and the driving cycle $[(V_P-V_{ref})C_S/(C_P+C_S)-V_{oled}C_P/(C_P+C_S)]$. Therefore, the current during programming and measurement is different from the driving current due to parasitic capacitance which will affect the compensation, especially if there is significant mobility variation in the drive transistor T1.

To extract the parasitic effect during the measurement, one can have a different voltage $V_B$ at the monitor line during measurement than it is during the programming cycle $(V_{ref})$. Thus, the gate-source voltage $V_{GS}$ during measurement will be $[(V_P-V_{ref})\,C_S/(C_P+C_S)-V_BC_P/(C_P+C_S)]$. Two different $V_B$'s ($V_{B1}$ and $V_{B2}$) can be used to extract the value of the parasitic capacitance $C_P$. In one case, the voltage $V_P$ is the same and the current for the two cases will be different. One can use pixel current equations and extract the parasitic capacitance $C_P$ from the difference in the two currents. In another case, one can adjust one of the $V_P$'s to get the same current as in the other case. In this condition, the difference will be $(V_{B1}-V_{B2})C_P/(C_P+C_S)$. Thus, $C_P$ can be extracted since all the parameters are known.

Figure 26:
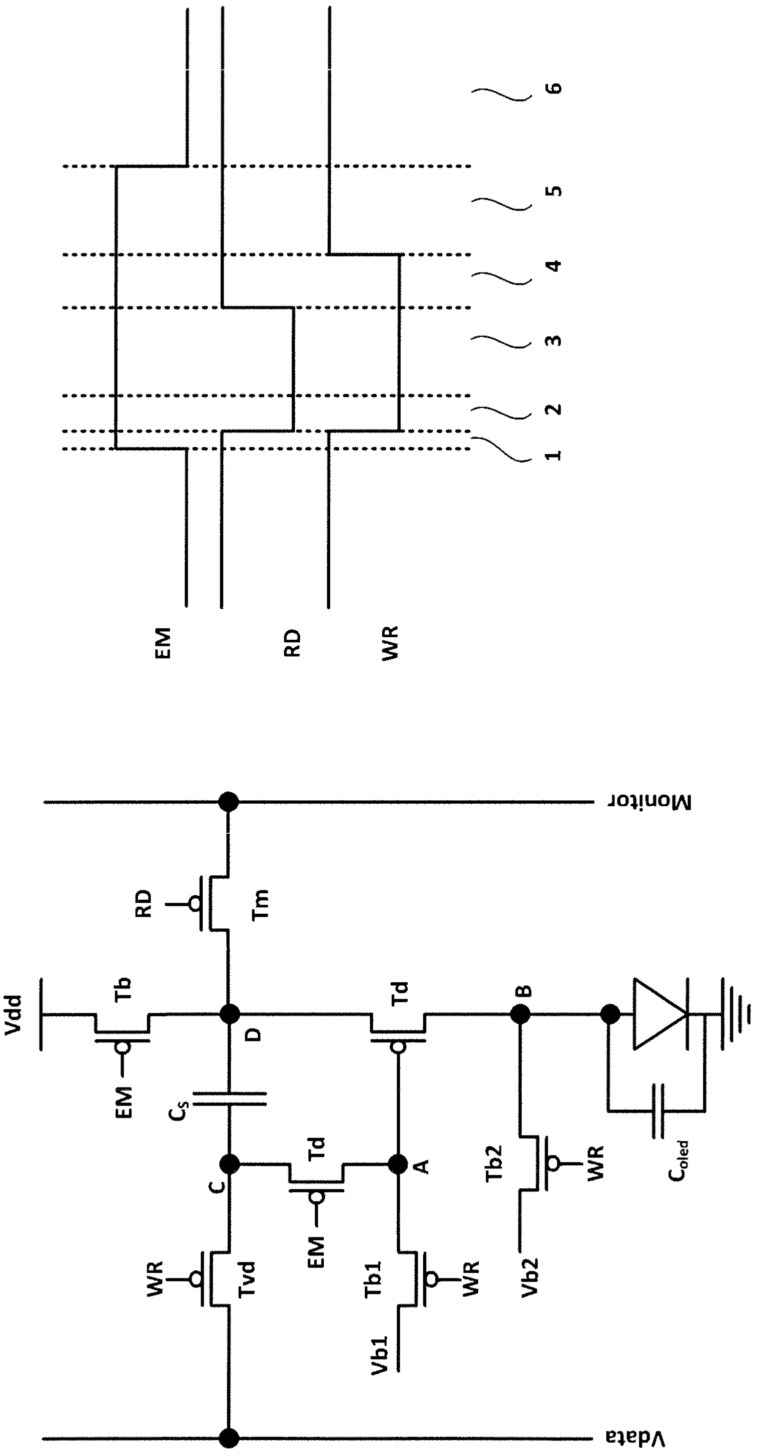
FIG. 26 is an example pixel circuit that uses a charge-based in-pixel compensation implementation and its associated timing diagram.

A pixel with charge readout capability is illustrated in FIG. 26. Here, either an internal capacitor is charged and then the charge is transferred to a charge integrator, or a current is integrated by a charge readout circuit. In the case of integrating the current, the method described above can be used to extract the parasitic capacitance.

When it is desired to read the charge integrated in an internal capacitor, two different integration times may be used to extract the parasitic capacitance, in addition to adjusting voltages directly. For example, in the pixel circuit shown in FIG. 25, the OLED capacitance can be used to integrate the pixel current internally, and then a charge-pump amplifier can be used to transfer it externally. To extract the parasitic parameters, the method described above can be used to change voltages. However, due to the nature of charge integration, one can use two different integration times when the current is integrated in the OLED capacitor.

As the voltage of node B increases, the effect of parasitic parameters on the pixel current becomes greater. Thus, the measurement with the longer integration time results in a larger voltage at node B, and thus is more affected by the parasitic parameters. The charge values and the pixel equations can be used to extract the parasitic parameters. Another method is to make sure the normalized measured charge with the integration time is the same for both cases by adjusting the programming voltage. The difference between the two voltages can then be used to extract the parasitic capacitances, as discussed above.

Charge-Based in-Pixel Compensation for Intelligent Pixels

In FIG. 26, the signals and bias voltage lines of each pixel can be shared or replaced by other signals and achieve the same functionality. The pixel circuit of FIG. 26 is merely exemplary. Also one can easily modify the position of the load (e.g., a light emitting diode). In addition, one can change each of the TFTs to n-type TFT based on complementary circuit concept.

In FIG. 26, during programming the compensation voltage is created at node D and the bias voltages are applied to node B and C and programming voltage is applied to node C.

To create the compensation circuit, one can use a discharging method as described in the timing diagram shown in FIG. 26 or apply a bias current through monitor line as described in the prior applications to which this application claims priority.

The addition of switch transistor Tb2 eliminates the unwanted emission during the programming/compensation cycle because it redirects the current to through to Vb2.

This circuit also allows reading the pixel or OLED current/voltage as described elsewhere herein.

This pixel also enables to read TFT or OLED current, voltage or charge through Tm.

For TFT readout, the pixel can be programmed with a predefined (or calculated voltage) and then turn the Tm ON. Here, voltage of the monitor line can be smaller than the OLED voltage since Tem is ON. This will make sure the OLED is off. At this point the pixel current can be read. The other method, the WR and RD are ON and EM is OFF, and a current or voltage is applied to the monitor and the current or voltage is read back. Also, the applied current or voltage to monitor line can be any value including zero.

For reading OLED, the pixel can be programmed so that the drive TFT acts as switch (for one example, Vb1 can be adjusted to turn Td to a switch). Then the OLED current or voltage can be read through monitor line.

For another reading of OLED, the EM signal can be off, and therefore no current is going through Td, and so the OLED current or voltage can be read.

For another reading of OLED, Vb1 can be selected in a way that node D goes to VOLED during programming cycle. And then the effect of OLED voltage on TFT can be read back after TFT programming.

Figure 27:
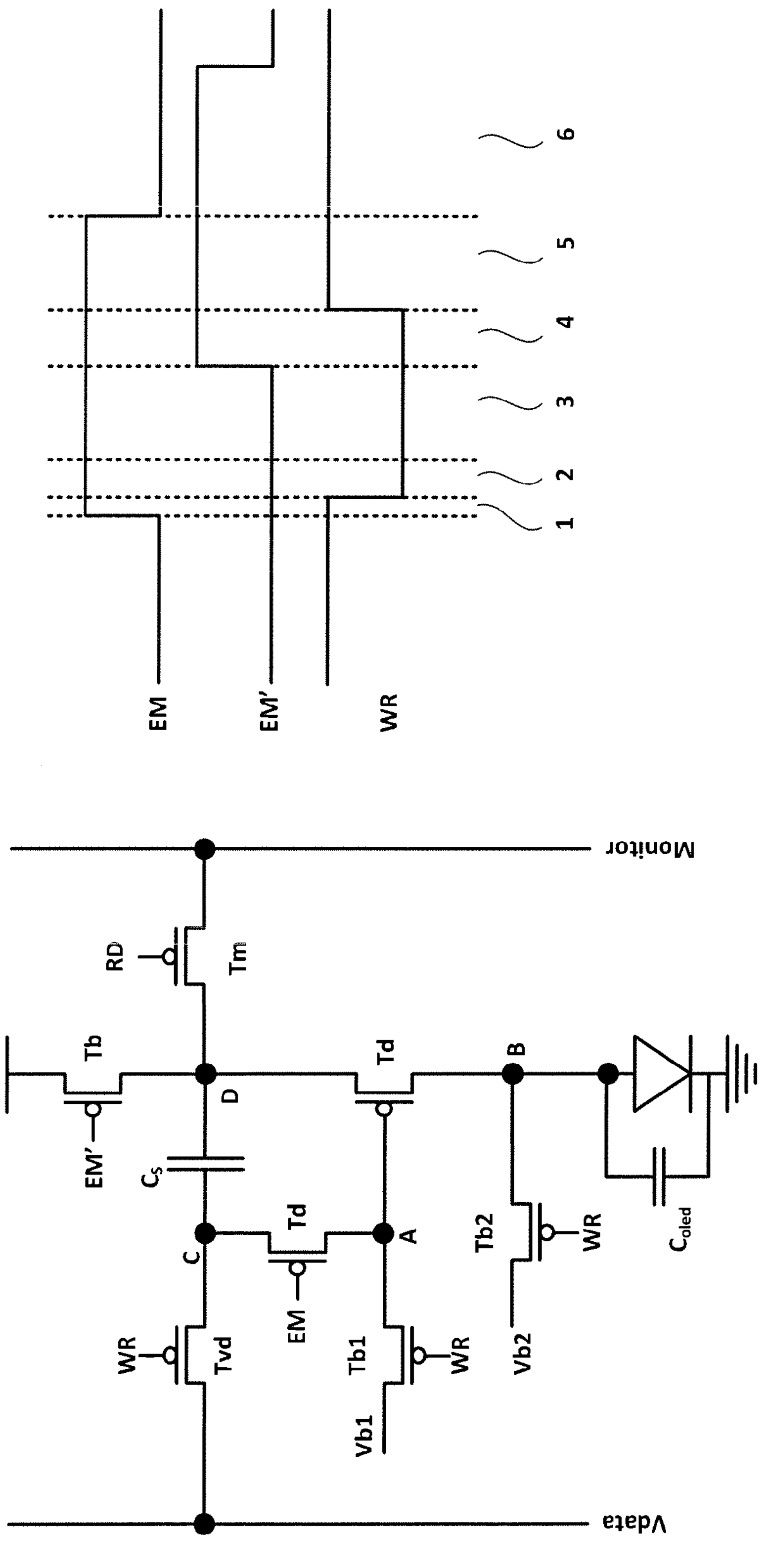
FIG. 27 shows the same pixel circuit as shown in FIG. 26 but using a different timing sequence.

In FIG. 27, for example, EM signal is divided into two signals. This allows using Tb to reset node D for compensation voltage generation based on charging/discharging function as described by waveform in FIG. 27. As can be seen EM' can be the EM signal of the next row.

This pixel also enables to read TFT or OLED current, voltage or charge through Tm.

For TFT readout, the pixel can be programmed with a predefined (or calculated voltage) and then turn the Tm ON. Here, voltage of the monitor line can be smaller than the OLED voltage since Tem is ON. This will make sure the OLED is off. At this point the pixel current can be read. The other method, the WR and RD are ON and EM is OFF, and a current or voltage is applied to the monitor and the current or voltage is read back. Also, the applied current or voltage to monitor line can be any value including zero.

For reading OLED, the pixel can be programmed so that the drive TFT acts as switch (for one example, Vb1 can be adjusted to turn Td to a switch). Then the OLED current or voltage can be read through monitor line.

For another reading of OLED, the EM' signal can be off, and therefore no current is going through Td, and so the OLED current or voltage can be read.

For another reading of OLED, Vb1 can be selected in a way that node D goes to VOLED during programming cycle. And then the effect of OLED voltage on TFT can be read back after TFT programming.

Figure 28:
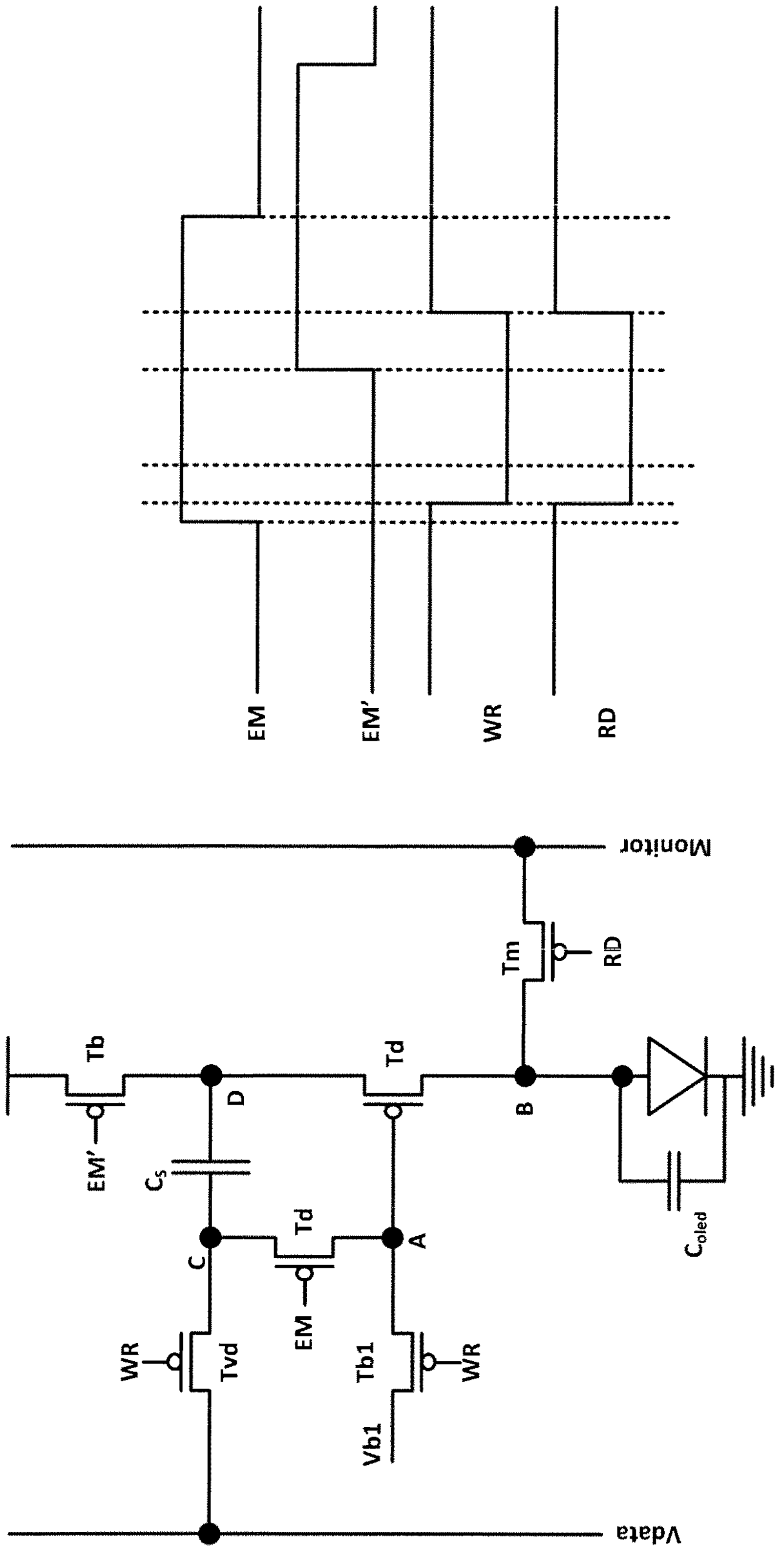
FIG. 28 is an example of another pixel circuit, in which the EM signal is divided into two signals to reset an internal node of the pixel circuit for compensation.

In FIG. 28, for example, EM signal is divided into two signals. This allows using Tb to reset node D for compensation voltage generation based on charging/discharging function as described by waveform in FIG. 28. Also, Tm and Tb2 are shared.

As can be seen EM' can be the EM signal of the next row.

This pixel circuit also enables to read TFT or OLED current, voltage, or charge through Tm.

For TFT readout, the pixel can be programmed with a predefined (or calculated voltage), and then the Tm is turned ON. In this example, the voltage of the monitor line can be smaller than the OLED voltage because Tem is ON. This will make sure the OLED is off. At this point the pixel current can be read. Alternately, the WR and RD are ON and EM is OFF, and a current or voltage is applied to the monitor and the current or voltage is read back. Also, the applied current or voltage to monitor line can be any value including zero.

For reading OLED (current/voltage/charge), the pixel can be programmed so that the TFT provide zero current. Then the OLED current or voltage can be read through monitor line.

For another reading of OLED, the EM' signal can be off, and therefore no current is going through Td, and so the OLED current or voltage can be read.

For another reading of OLED, Vb1 can be selected in a way that node D goes to VOLED during programming cycle. And then the effect of OLED voltage on TFT can be read back after TFT programming.

Figure 29:
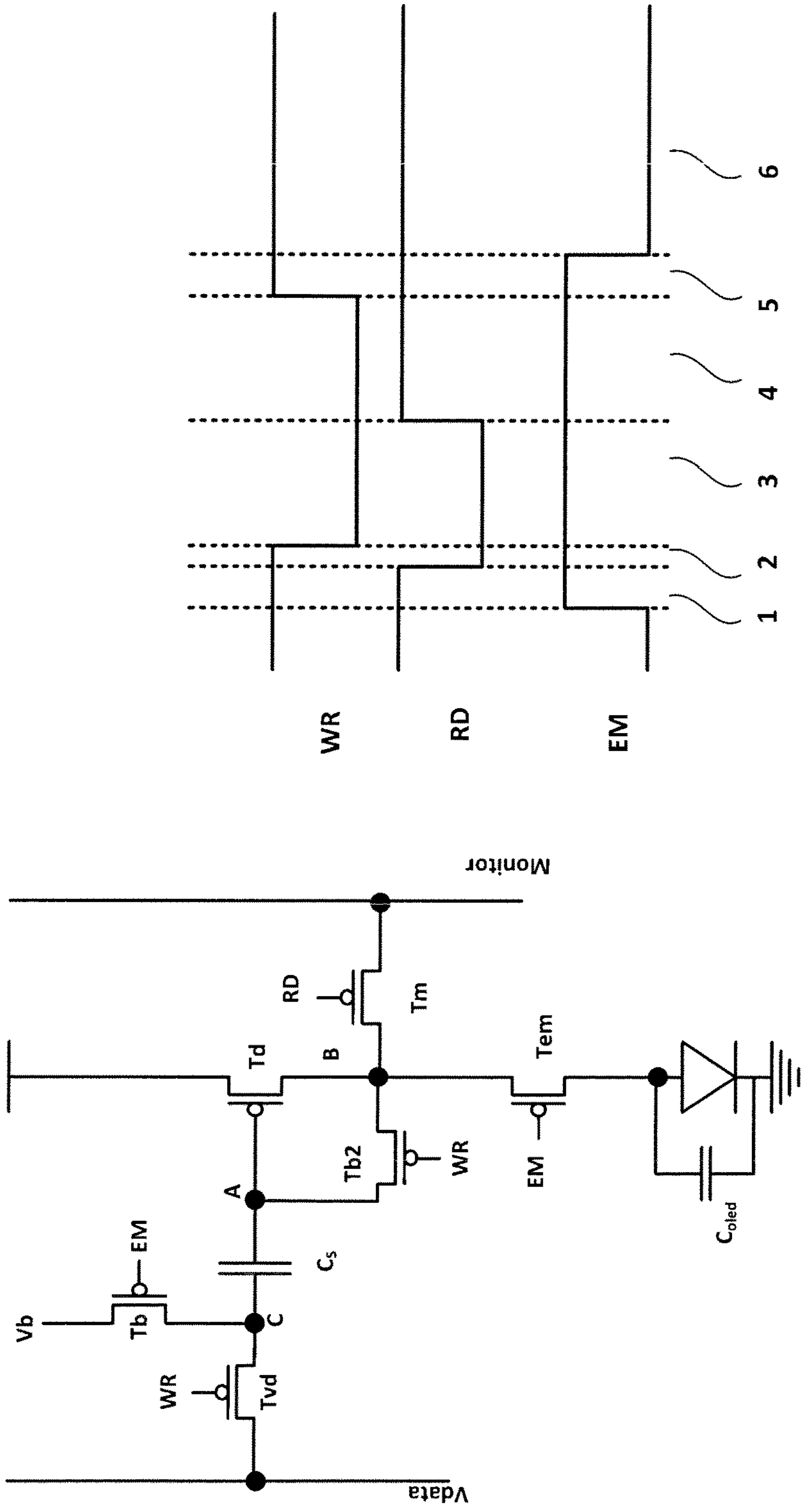
FIG. 29 is another example of a pixel circuit and timing diagram, in which the OLED current or voltage can be read via a monitor line.

For the circuit shown in FIG. 29, during the programming, node B is reset through Tm and monitor line and node C is charged to Vdata while EM is off. During compensation cycle (cycle 4) node B is charged with drive TFT (Td) to a compensation voltage which is the function of Td characteristics. During driving cycle (6), EM is on and so the gate of Td is defined by the programming voltage and compensation voltage stored in Cs.

This pixel also enables to read TFT or OLED current, voltage or charge through Tm.

For TFT readout, the pixel can be programmed with a predefined (or calculated voltage), and then Tm is turned ON. Here, voltage of the monitor line can be smaller than the OLED voltage since Tem is ON. This will make sure the OLED is off. At this point the pixel current can be read. Alternately, the WR and RD are ON and EM is OFF, and a current or voltage is applied to the monitor and the current or voltage is read back. Also, the applied current or voltage to monitor line can be any value including zero.

For reading OLED, the pixel can be programmed so that the TFT provide zero current. Then the EM is ON and the OLED current or voltage can be read through monitor line.

Programming and Driving

Figure 30:
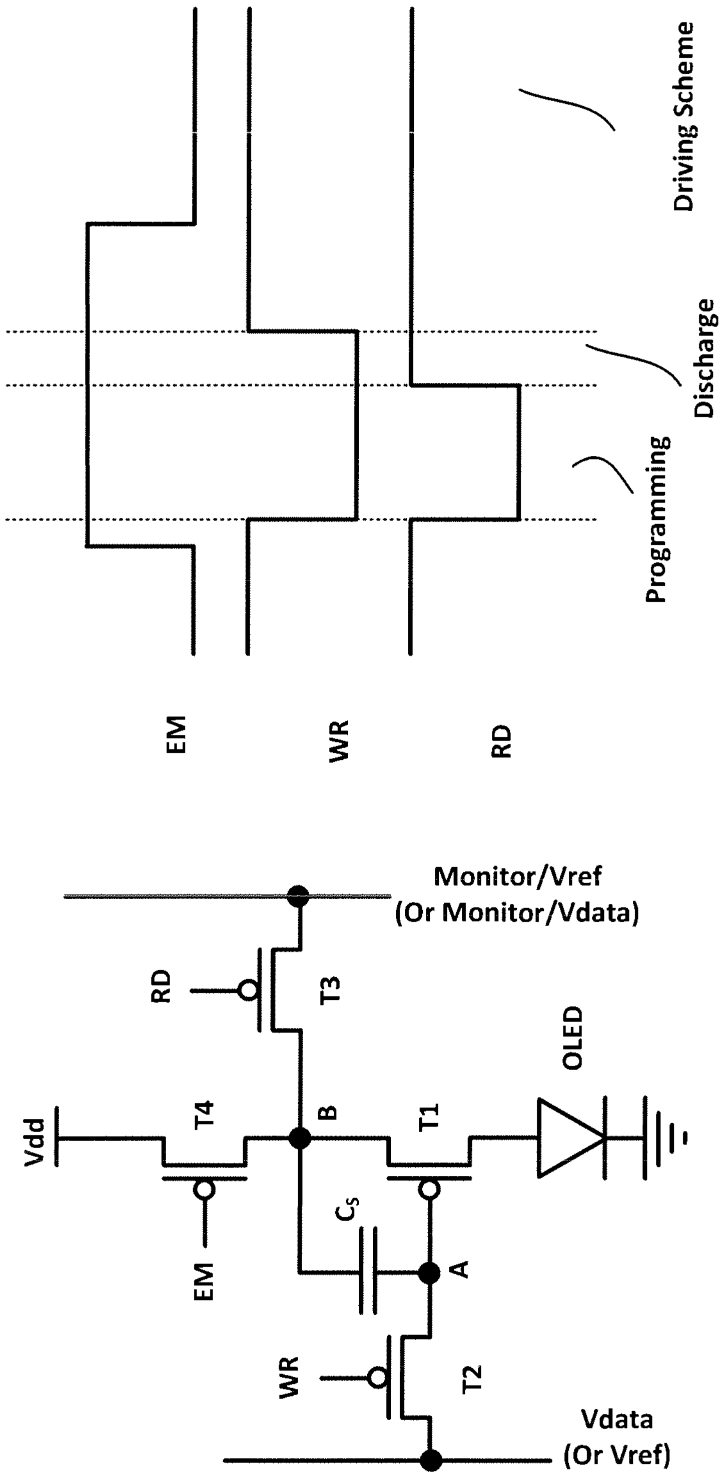
FIG. 30 is another example charge-based compensation pixel circuit and timing diagram, which compensates for variation or aging of the drive transistor.

In one configuration of a charge-based compensation pixel circuit shown in FIG. 30, the line connected to T2 is the data voltage and the line connected to T3 is the monitor/vref voltage. The operation in this case can proceed as follows:

During the first cycle, the pixel is programmed with programming voltage (VP) and node B is connected to a reference voltage.

During the second cycle, RD signal turns off and so the voltage at node B is adjusted partially to compensate for T1 variation (or aging).

During the third phase, WR signal turns off and after a delay (that can be zero), EM turns on. Thus, the current of T1 is controlled by the voltage stored in CS and the same current goes to the OLED.

In another configuration, the line connected to T2 is the reference voltage (Vref) and the line connected to T3 is Monitor/Vdata line.

During the first cycle, node A is charged to a reference voltage and node B is connected to a programming voltage (VP).

During the second cycle, RD signal turns off and so the voltage at node B is adjusted partially to compensate for T1 variation (or aging).

During the third phase, WR signal turns off and after a delay (that can be zero), EM turns on. Thus, the current of T1 is controlled by the voltage stored in CS and the same current goes to the OLED.

TFT Readout

Figure 31:
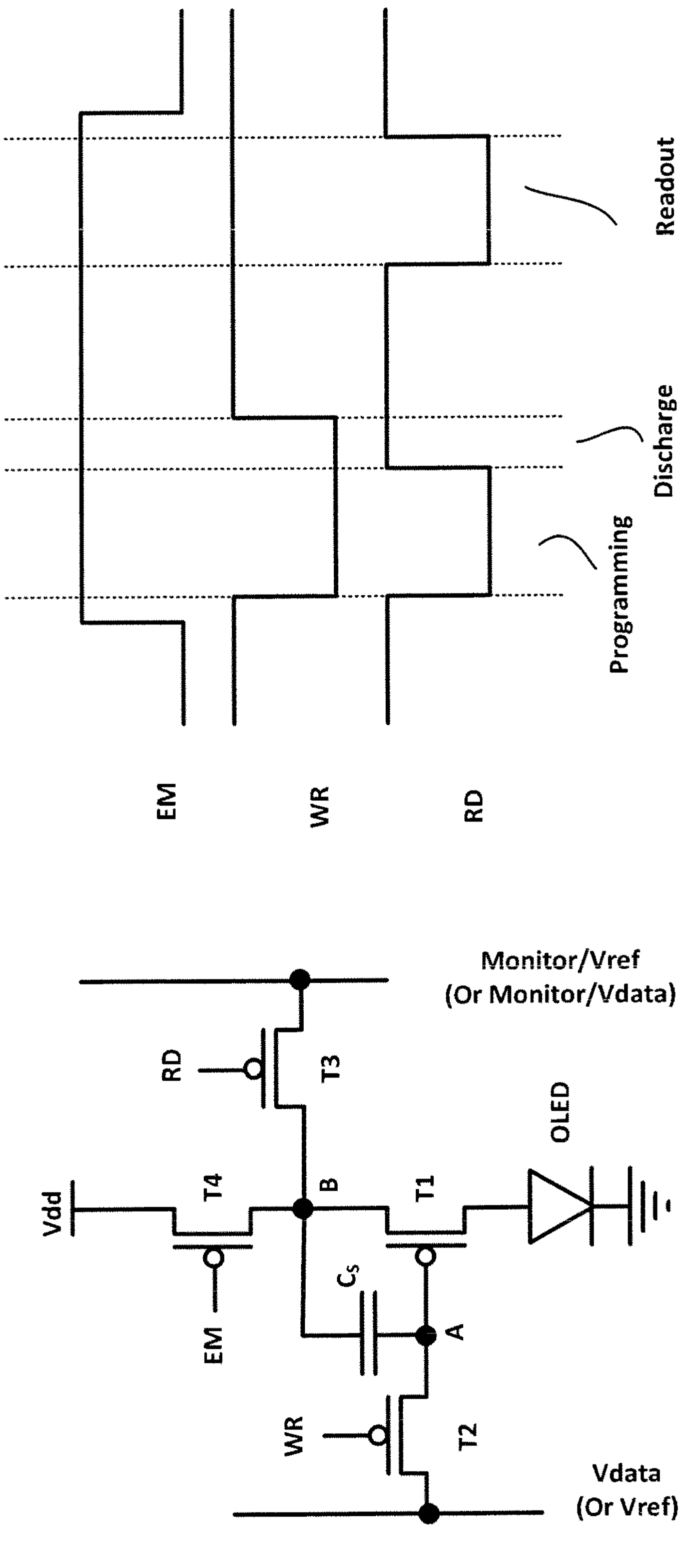
FIG. 31 is still another example of a pixel circuit and associated timing diagram having a discharge period to at least partially discharge the storage capacitor.

For TFT readout shown in FIG. 31, the pixel is programmed (either with discharge or without discharge period). If there is a discharge period, it can be short time to partially discharge the capacitor CS or it can be long to discharge the capacitor till T1 is off. In case of short discharge time, one can read the current of T1 by applying a fix voltage during readout time or read the voltage created by T1 acting as an amplifier by applying a fix current through T3. In case of long discharge time, the voltage created at node B as a result of discharge can be read back. This voltage will be representative of T1 threshold voltage.

Also, WR signal can stay on during the whole process.

OLED Readout

Figure 32:
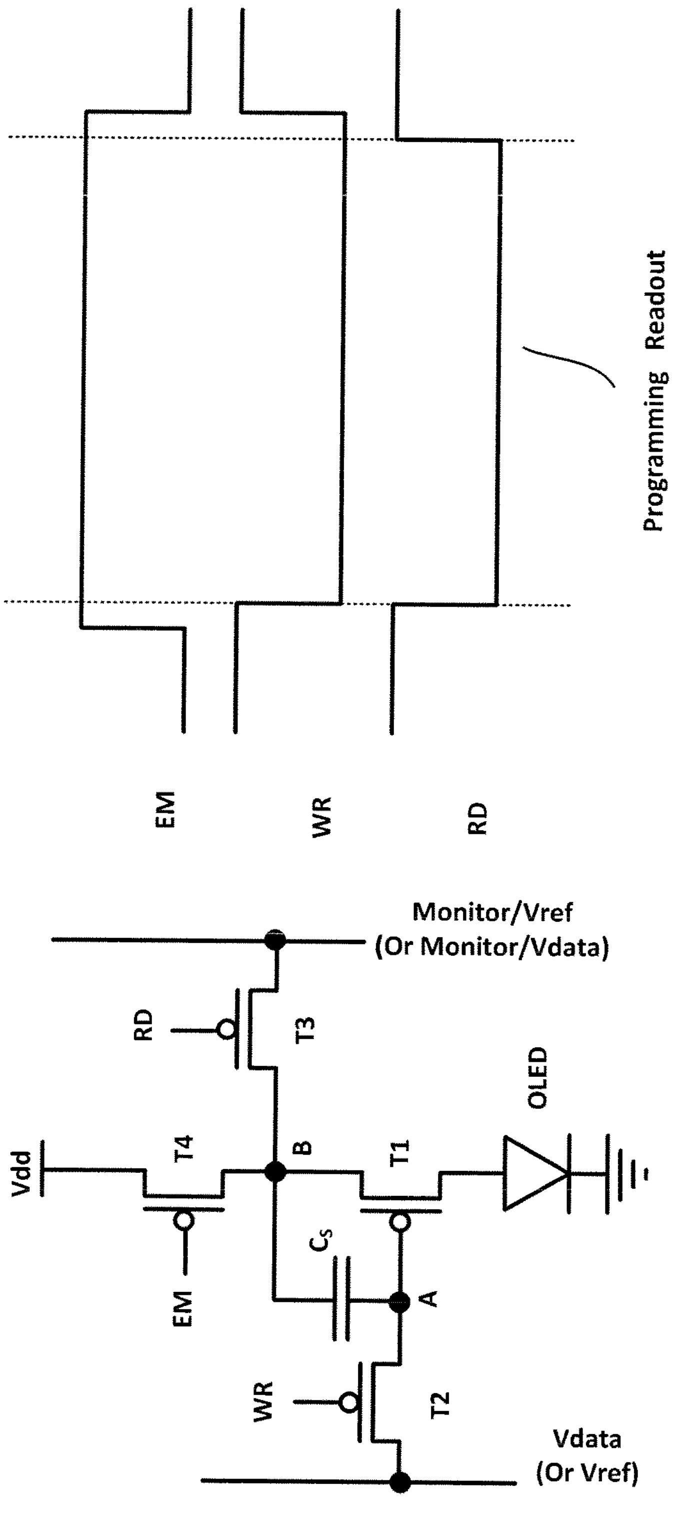
FIG. 32 is similar to FIG. 31, except that the drive transistor T1 is programmed to act like a switch.

In the pixel circuit presented in FIG. 32, T1 is programmed to act as a switch (with high ON voltage). And the current or voltage of OLED is measured through T3 and T1.

In another example, a few current/voltage points are measured by changing the voltage and Node A and Node B1, and from the equation between the currents and voltages, the voltage of OLED can be extracted. For example, the OLED voltage can affect the current of T1 more if T1 is in its linear region, thus, by having current points in linear and saturation operation regime of T1, the OLED voltage can be extracted from the T1 voltage-current relationship.

If a few pixels share the same monitor lines, the pixels that are not selected for OLED measurement will be OFF by applying and OFF voltage to T1.

Figure 33:
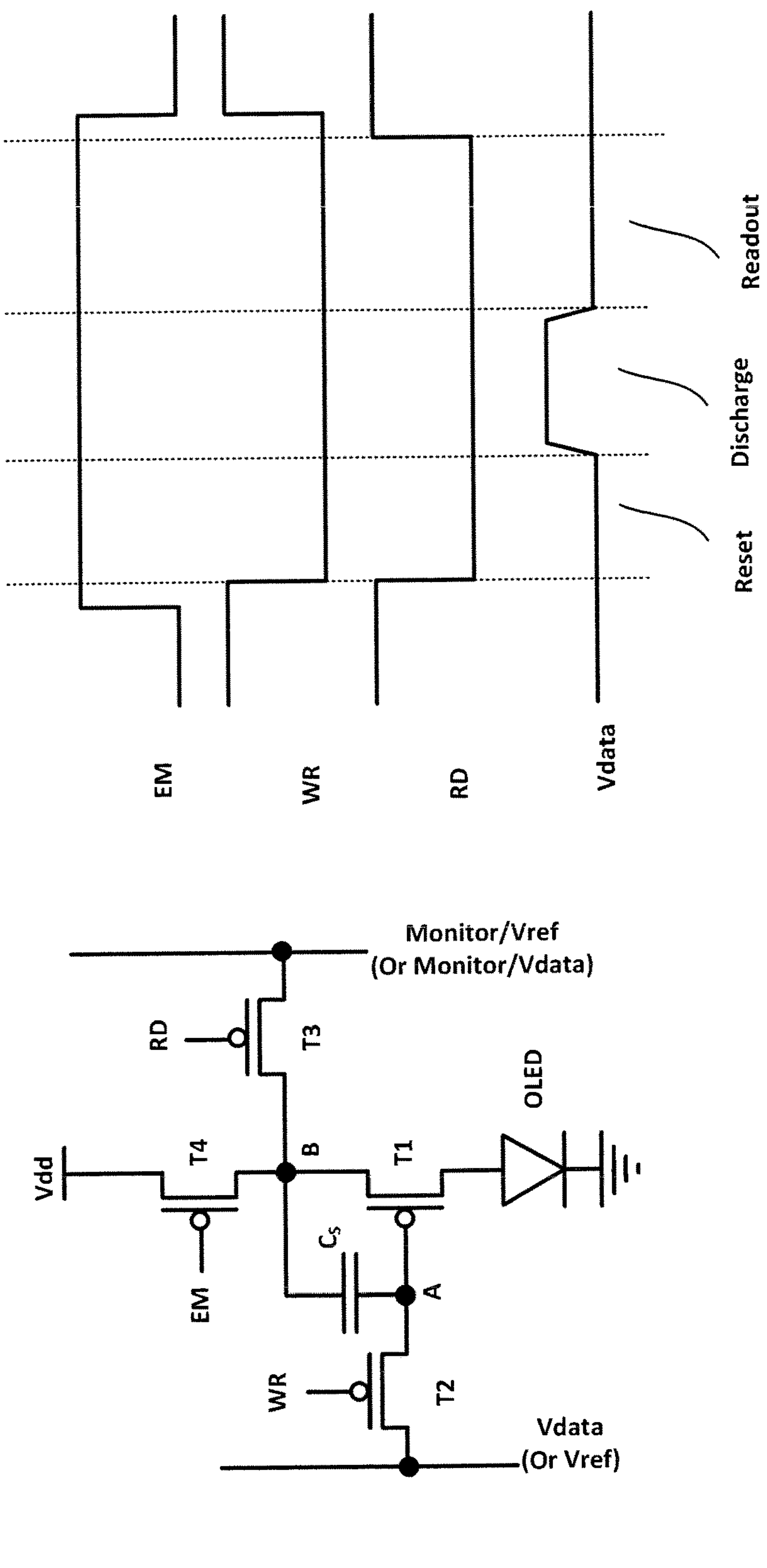
FIG. 33 is a pixel circuit in which the OLED voltage or current is read out via a monitor line, which can also function as a reference line and/or a data line for programming information, and its associated timing diagram.

In the pixel circuit presented in FIG. 33, the OLED readout is as follows:

The OLED is charged with an ON voltage during the reset phase.

T1 turns off and so the OLED voltage is discharged through OLED to an OFF voltage The off voltage is read back through T1.

In the aforementioned pixel circuit, one can use the inverse of RD or WR as the EM signal. In this case, the signal can be inverted and passed to the pixel or a complimentary TFT can be used to create the inverse function. For example, if PMOS switch is used for RD TFT, NMOS switch can be used for EM TFT.

Also, the inverse of the next RD or WR signals (or previous RD signal) can be used instead as an EM signal of the current row. Similarly, the inverse function of RD and WR can be implemented outside the pixel circuit and pass to it or complementary TFT combination can be used.

Figure 34:
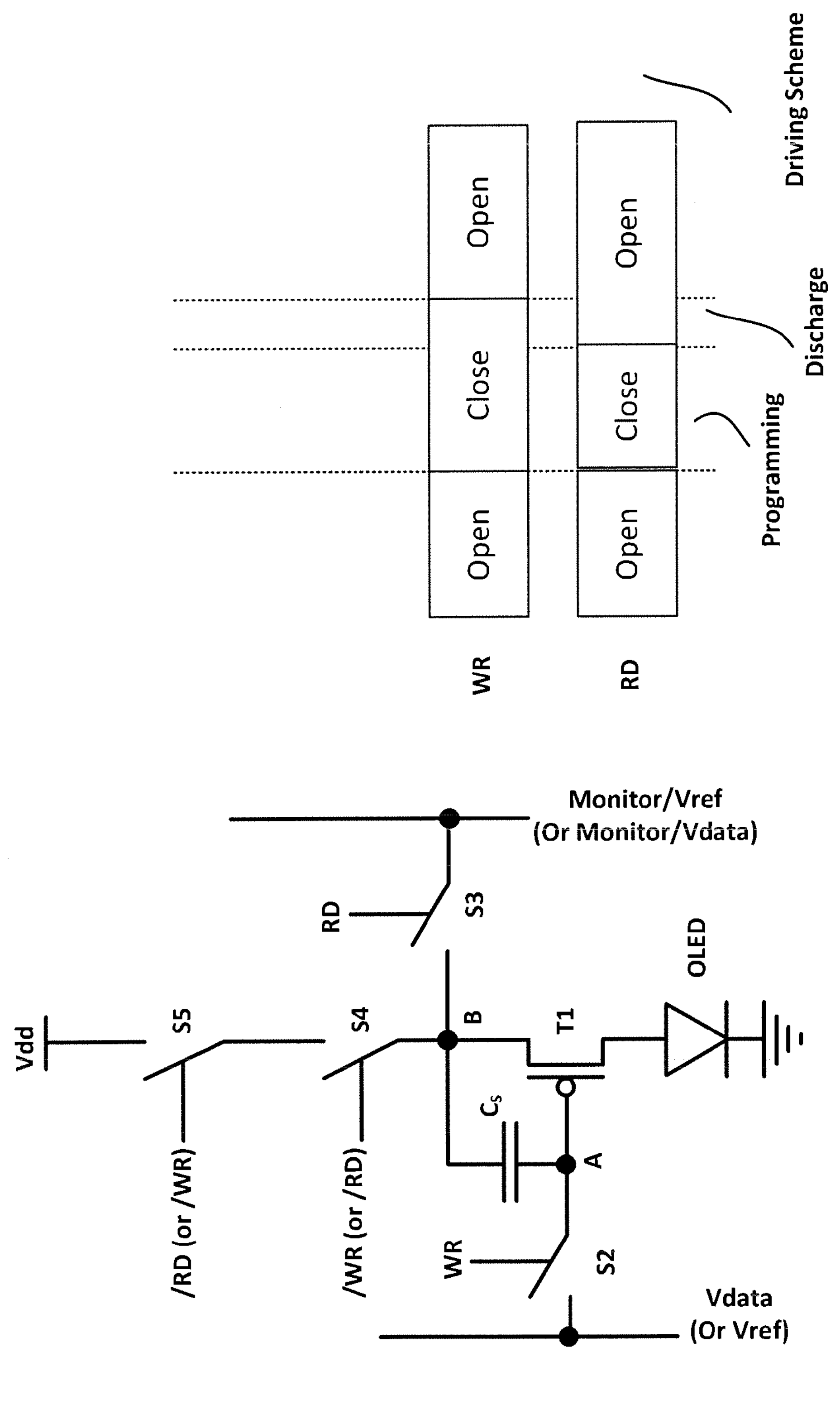
FIG. 34 is another pixel circuit demonstrating another way of implementing the EM function, along with an associated timing diagram.

FIG. 34 demonstrates another way of implementing EM function. Here, the inverse of RD and WR is used to create EM signal. As a result, if any of them is ON, the pixel will be disconnected from VDD. Similarly, the inverse function of RD and WR (/RD and/WR) can be implemented outside pixel and pass to it or complimentary TFT combination can be used. Although, NMOS TFT can work for S4 and S5, it is recommended to use PMOS for these TFTS and NMOS for WR and RD.

Sharing Switches Among Columns and/or Rows

Figure 35:
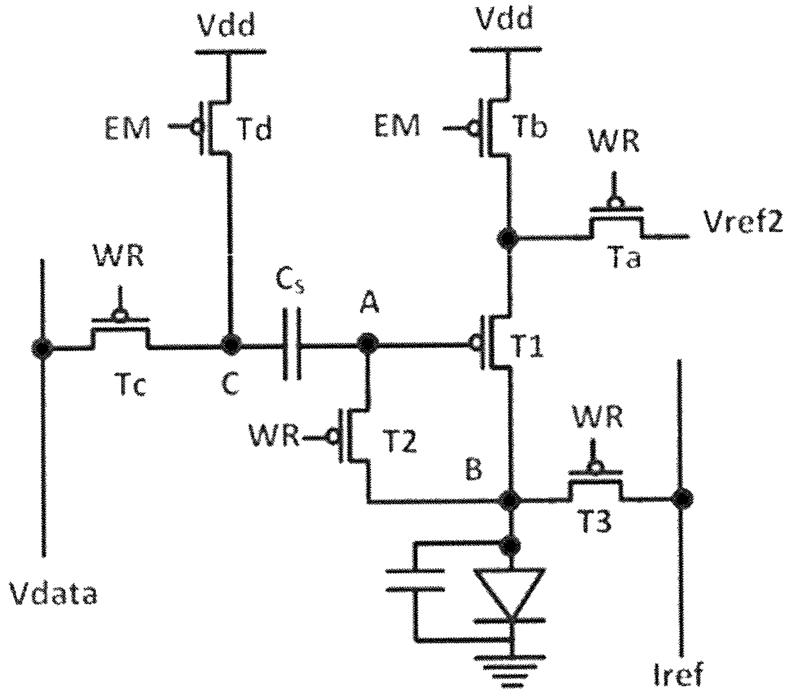
FIG. 35 (Prior Art)
FIG. 35 is a conventional pixel circuit.

FIG. 35 shows a prior-art pixel circuit. In operation, during programming, EM is off, and WR is on.

A current is applied to the pixel through Iref and a programming voltage (VP) is applied to Vdata. A bias voltage is developed at node A and B (VB) which is a function of Iref and T1 characteristics. The stored voltage in Cs is VP-VB.

During driving cycle/emission: EM is on and WR is off. Node C changes from VP to VDD. Node A is boot-strapped by Cs and moves with the same value (VDD-VP). Thus, the voltage at node A will be VB+VDD-VP. During this cycle, a current proportional to VP which is compensated with VB will pass through T1 and OLED.

The operation of the pixel circuit shown in FIG. 36 will now be described. The switches can be shared between columns and rows. Tc and Td can be shared with rows. Ta and Tb can be shared with rows and columns.

If the sharing happens only with columns, SEM and SWR can be the same as EM and WR.

In case of sharing happens with rows as well, SEM and SWR acts as global signals.

During the programming of the rows connected to the same SEM and SWR, the SEM is off and SWR is on. During the driving/emissions of those rows, SEM is on and SWR is off.

Figure 36:
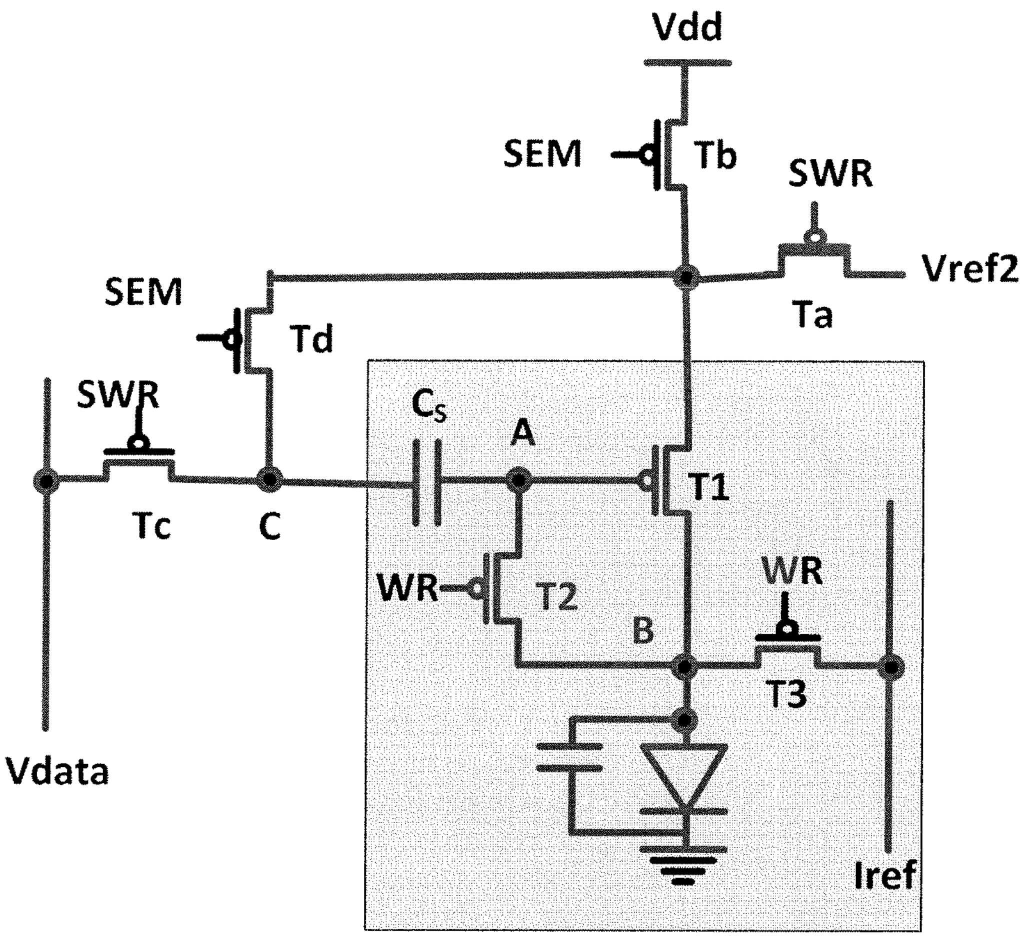
FIG. 36 is a pixel circuit in which one or more switches can be shared among rows and/or columns of the pixel array.
Figure 37:
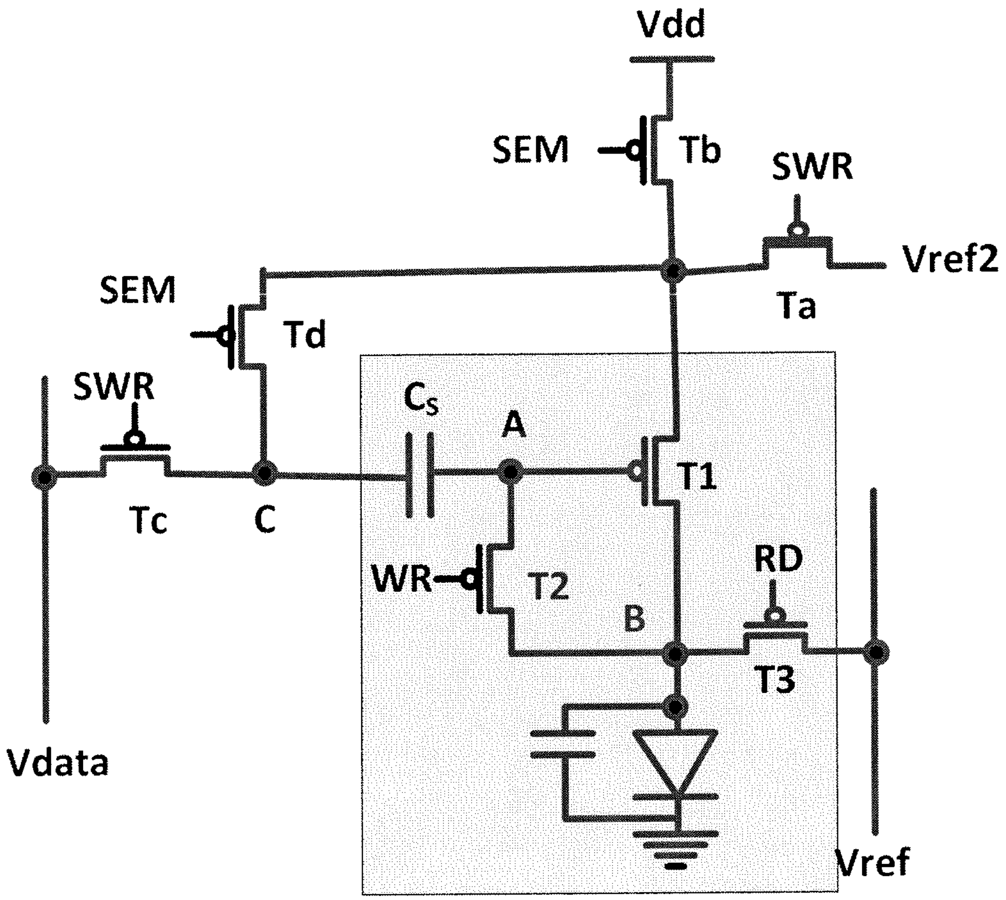
FIG. 37 shows a similar pixel circuit to FIG. 36, but which uses a different programming operation.
Figure 38:
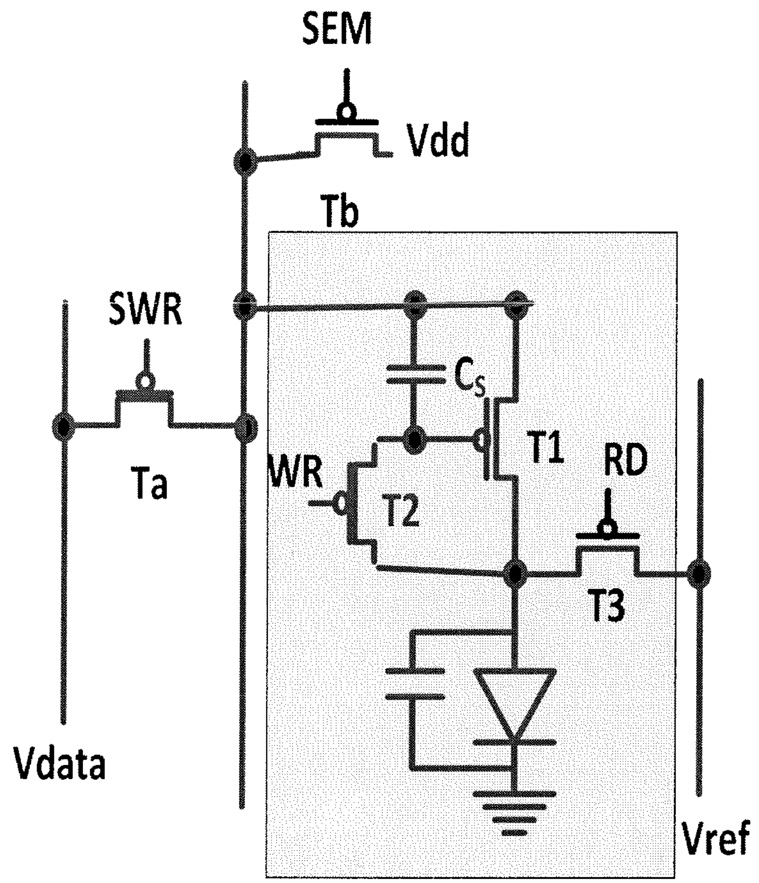
FIG. 38 illustrates another pixel circuit that shares one or more switches.
Figure 39A:
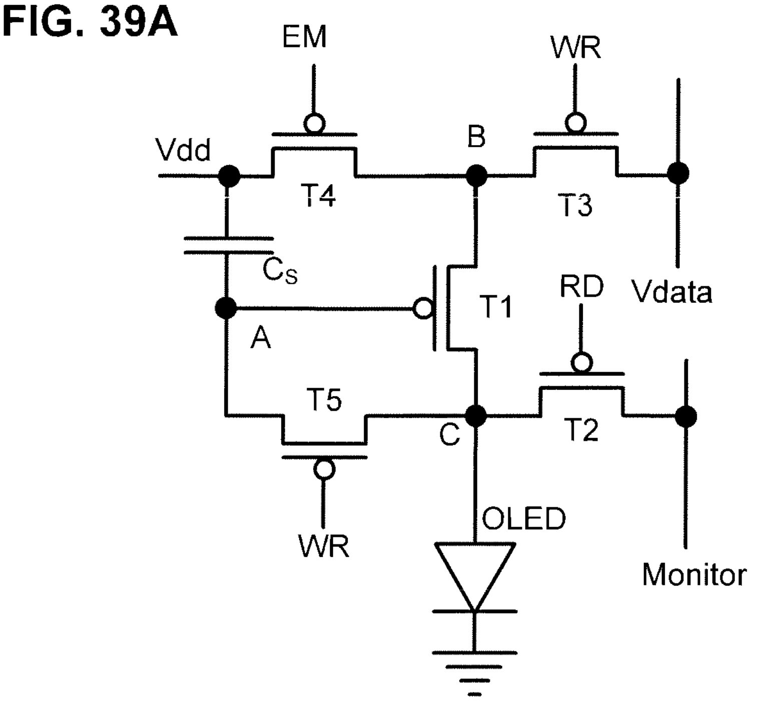
FIGS. 39A and 39B illustrate a pixel circuit and associated timing diagram having a discharge cycle.
Figure 39B:
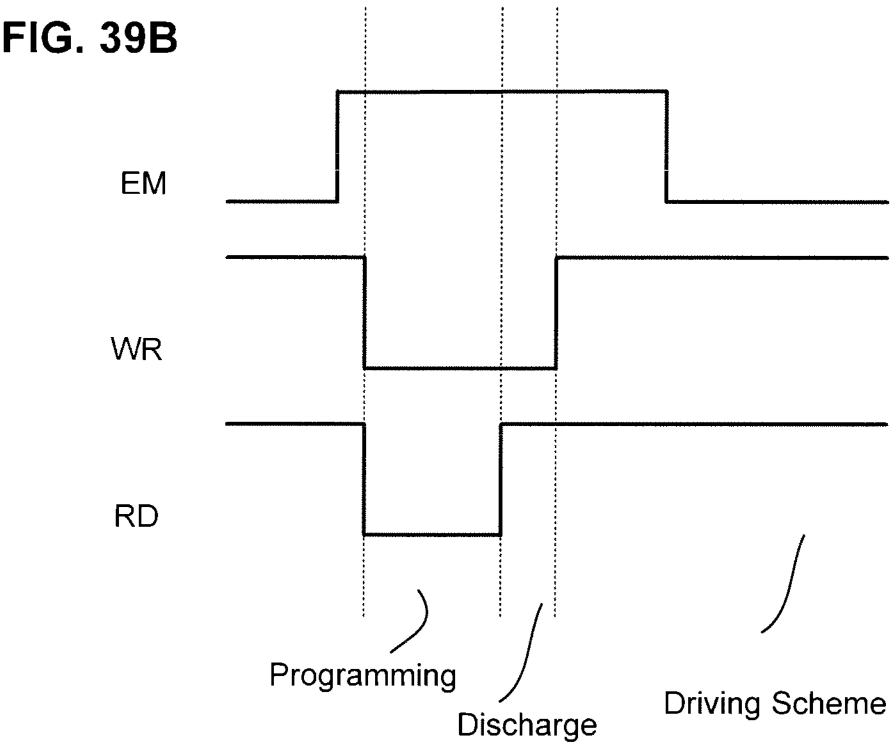
Figure 40A:
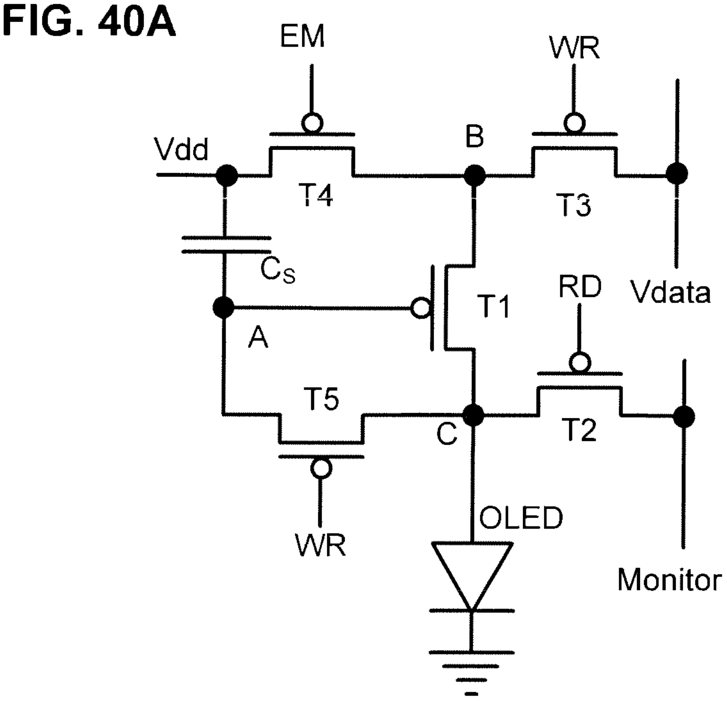
FIGS. 40A and 40B illustrate another pixel circuit and associated timing diagram having a reset cycle.
Figure 40B:
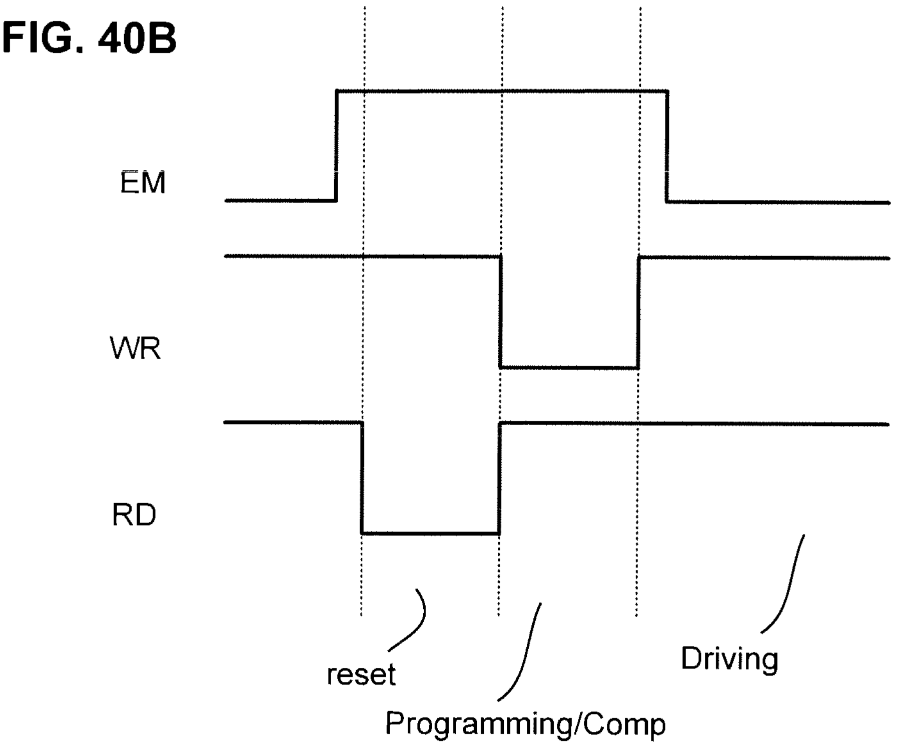
Figure 41A:
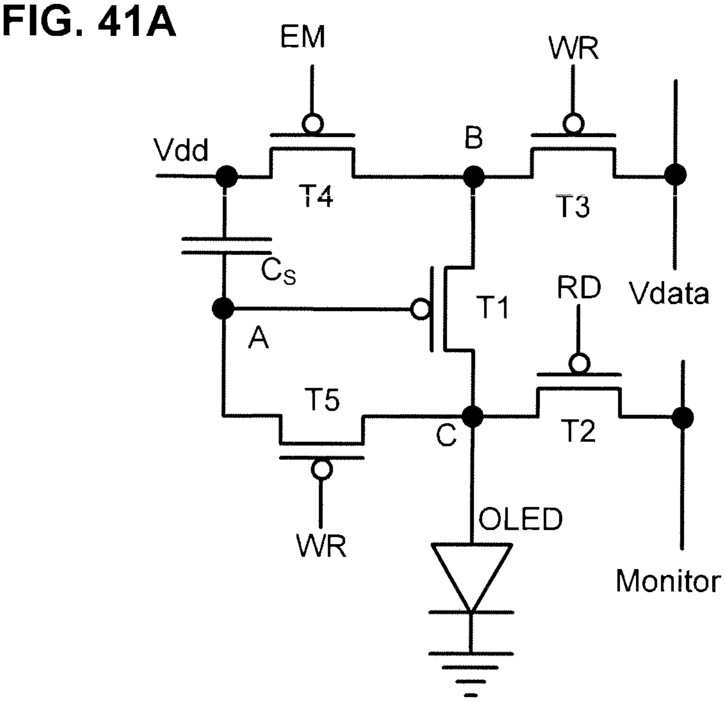
FIGS. 41A and 41B illustrate yet another pixel circuit and associated timing diagram having a reset and readout cycle.
Figure 41B:
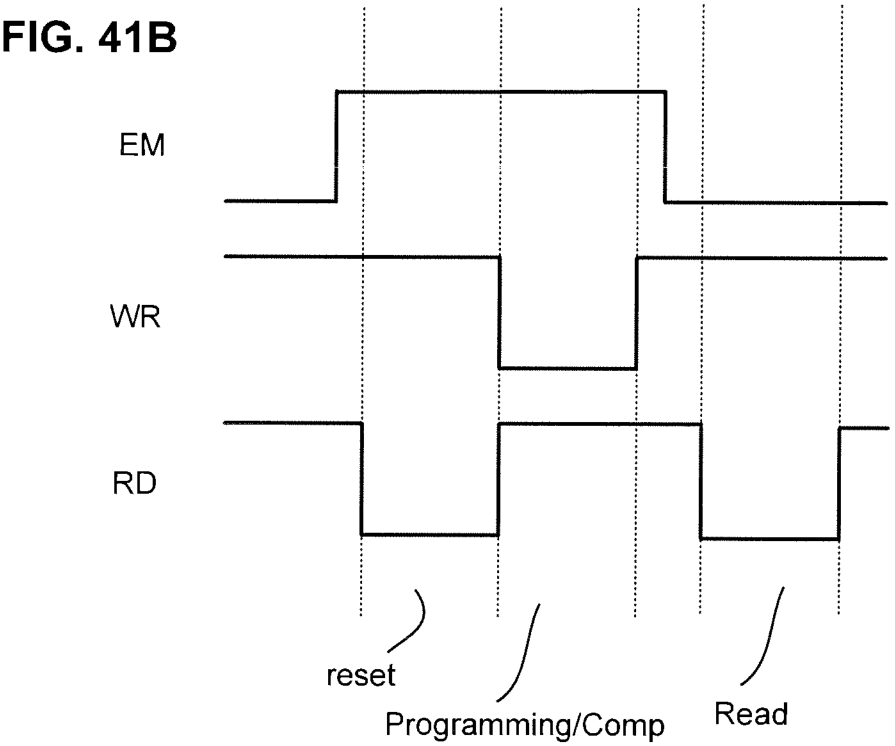
Figure 42A:
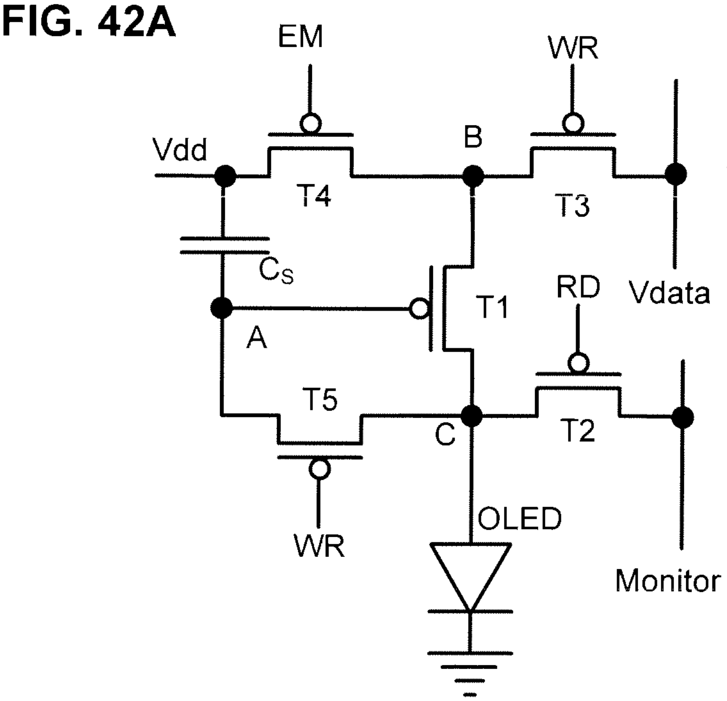
FIGS. 42A and 42B illustrate still another pixel circuit and associated timing diagram having a reset and readout cycle.
Figure 42B:
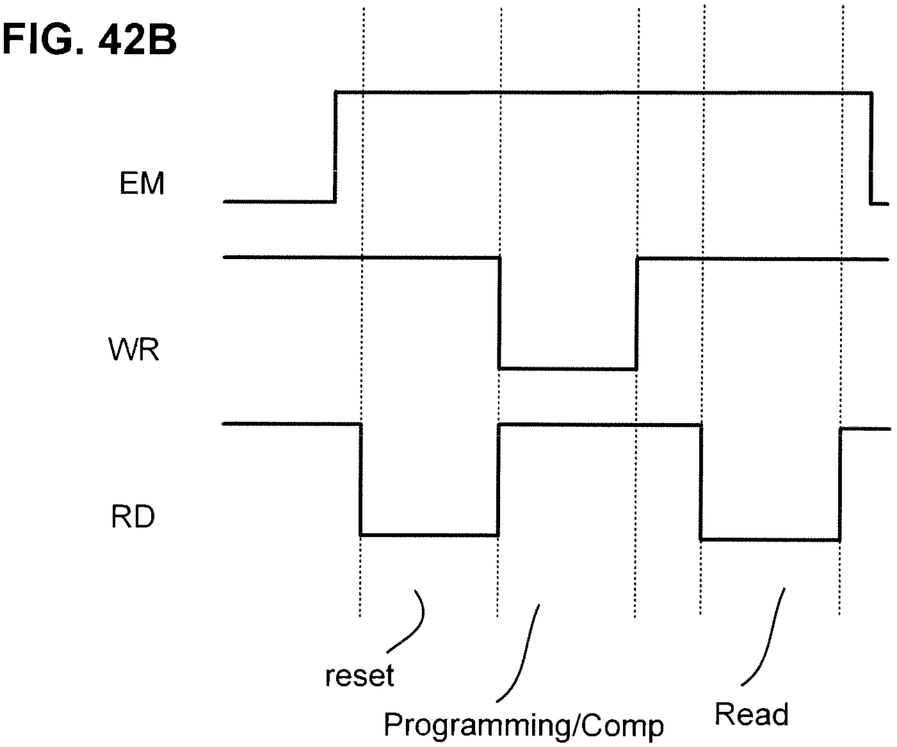
Figure 43A:
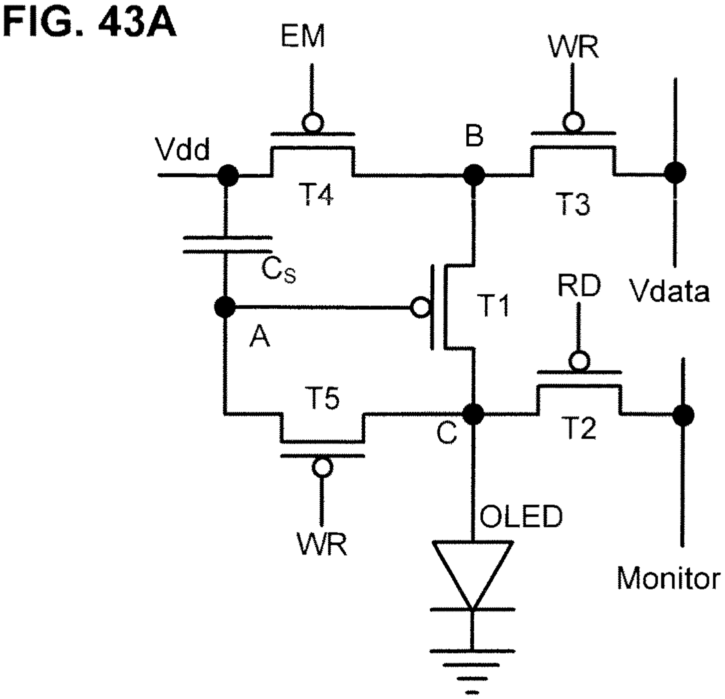
FIGS. 43A and 43B illustrate another pixel circuit and associated timing diagram having a readout cycle following a programming cycle.
Figure 43B:
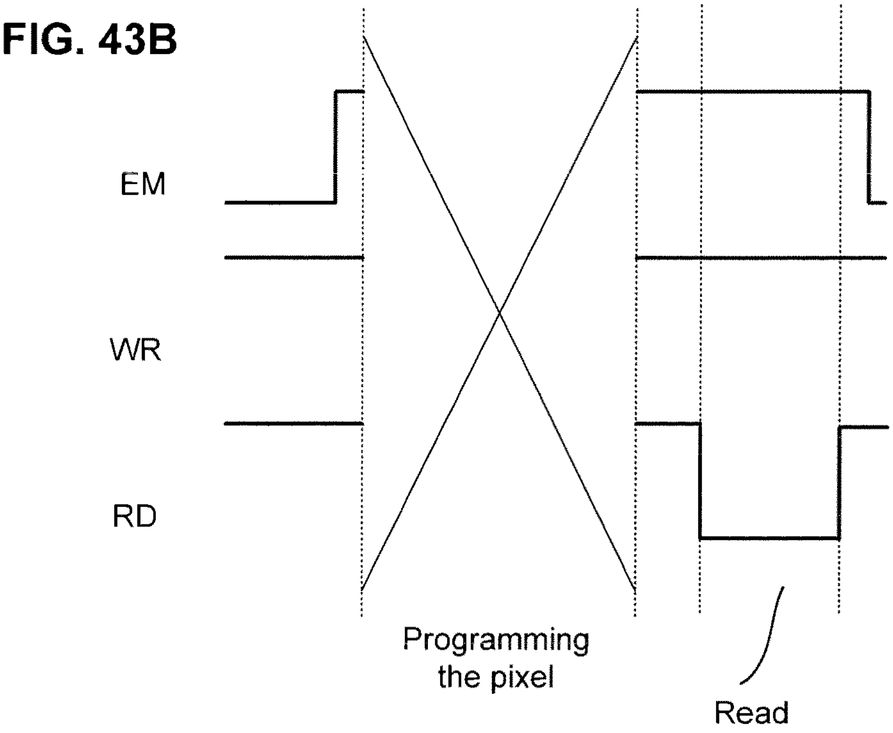
Figure 44A:
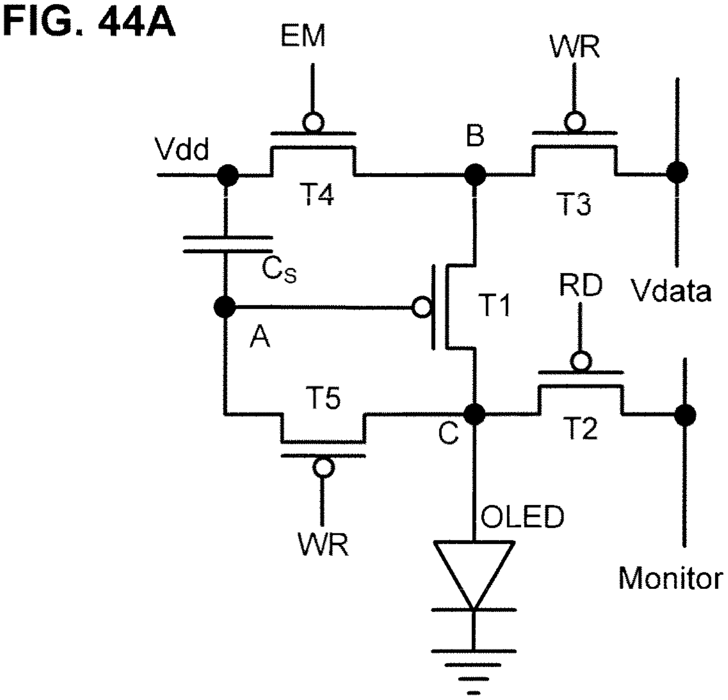
FIGS. 44A and 44B illustrate a further pixel circuit and associated timing diagram having a readout cycle following a programming cycle in which the pixel circuit is programmed with off current.
Figure 44B:
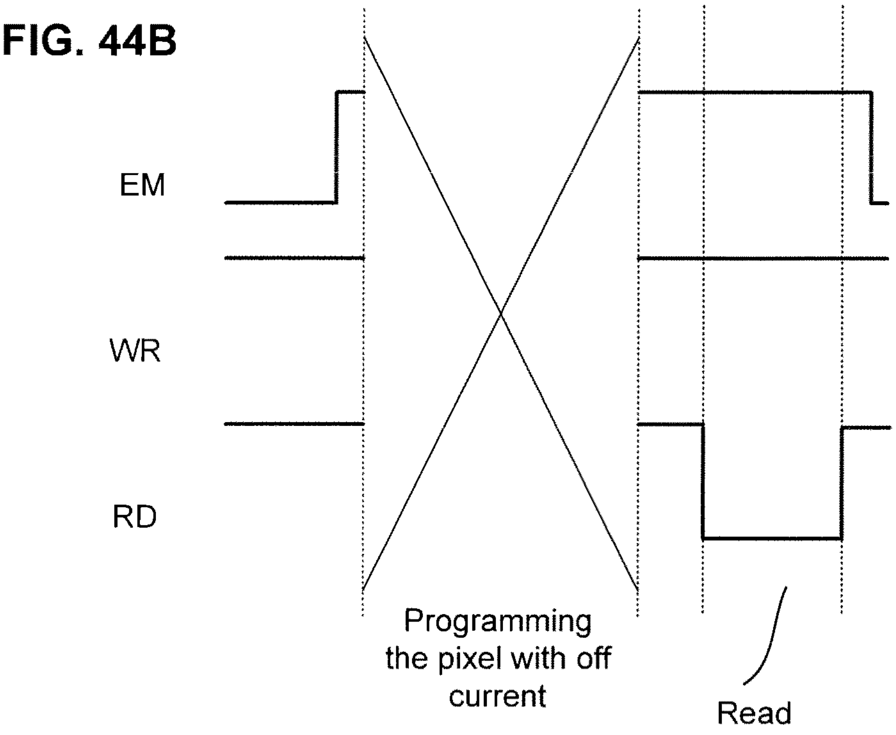
Figure 45A:
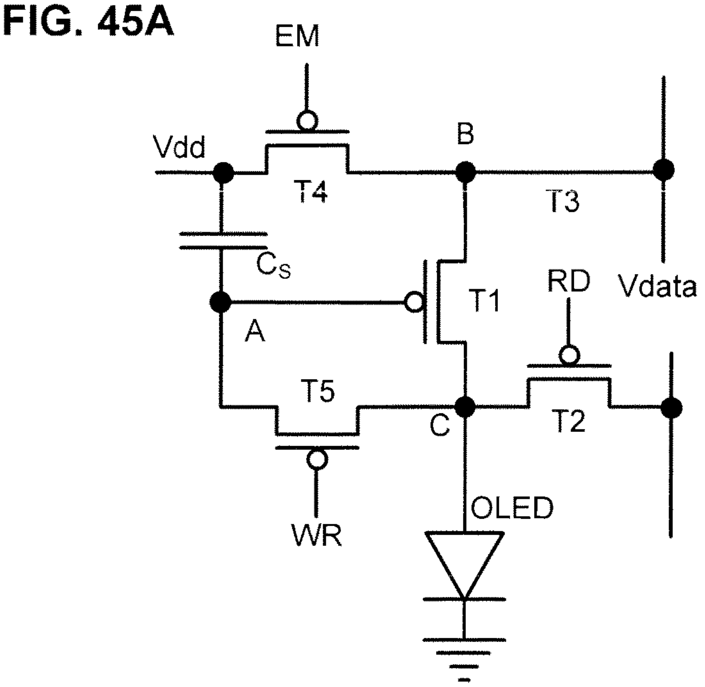
FIGS. 45A and 45B illustrate a still further pixel circuit and associated timing diagram having a discharge cycle.
Figure 45B:
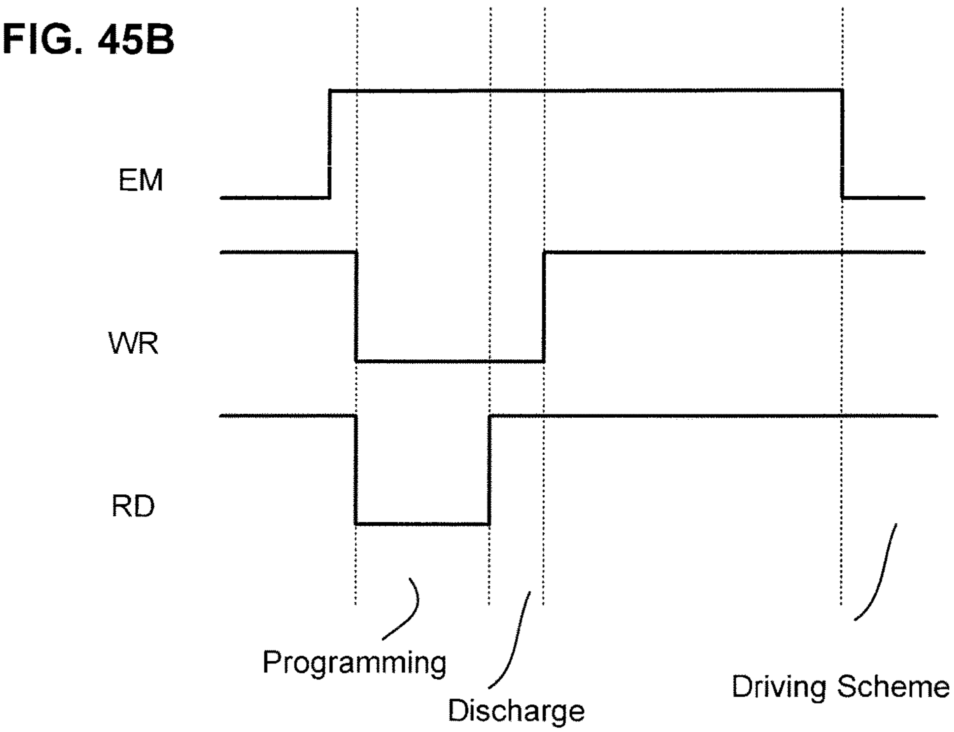
Figure 46A:
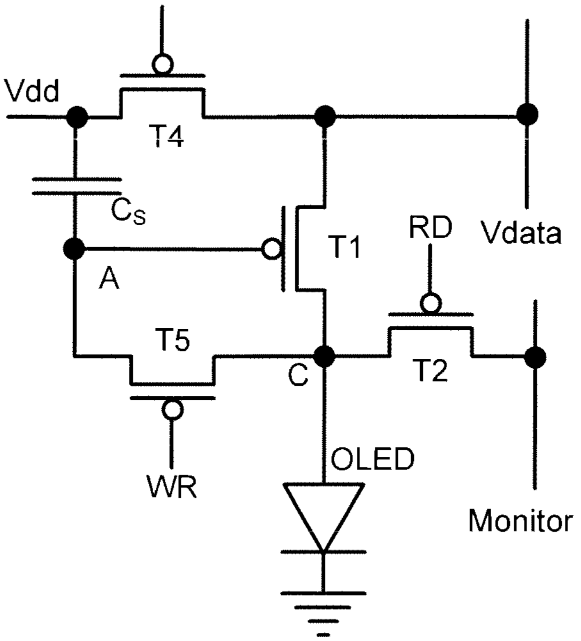
FIGS. 46A and 46B illustrate another pixel circuit and associated timing diagram having a reset cycle.
Figure 46B:
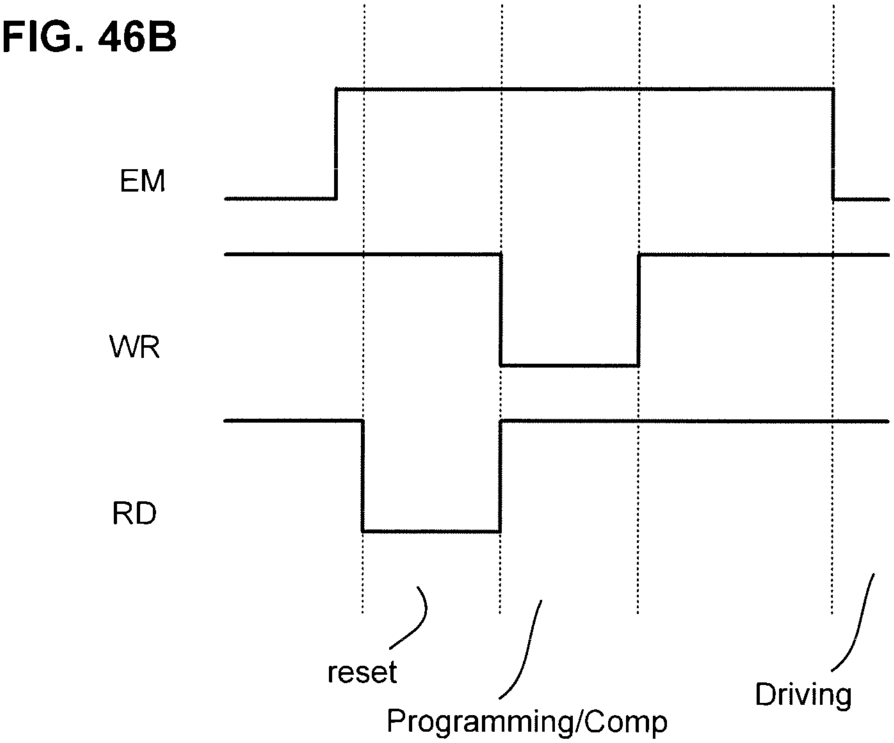
Figure 47A:
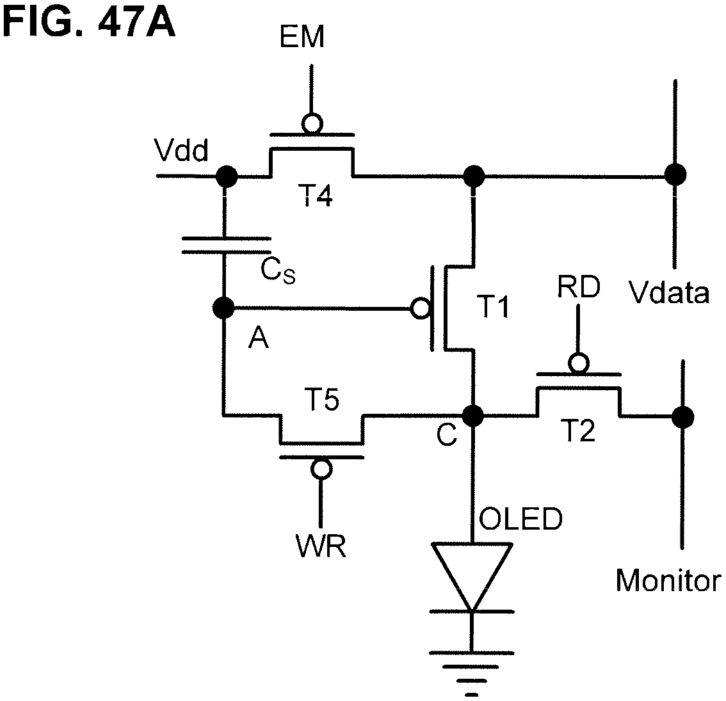
FIGS. 47A and 47B illustrate yet another pixel circuit and associated timing diagram having a reset and readout cycle.
Figure 47B:
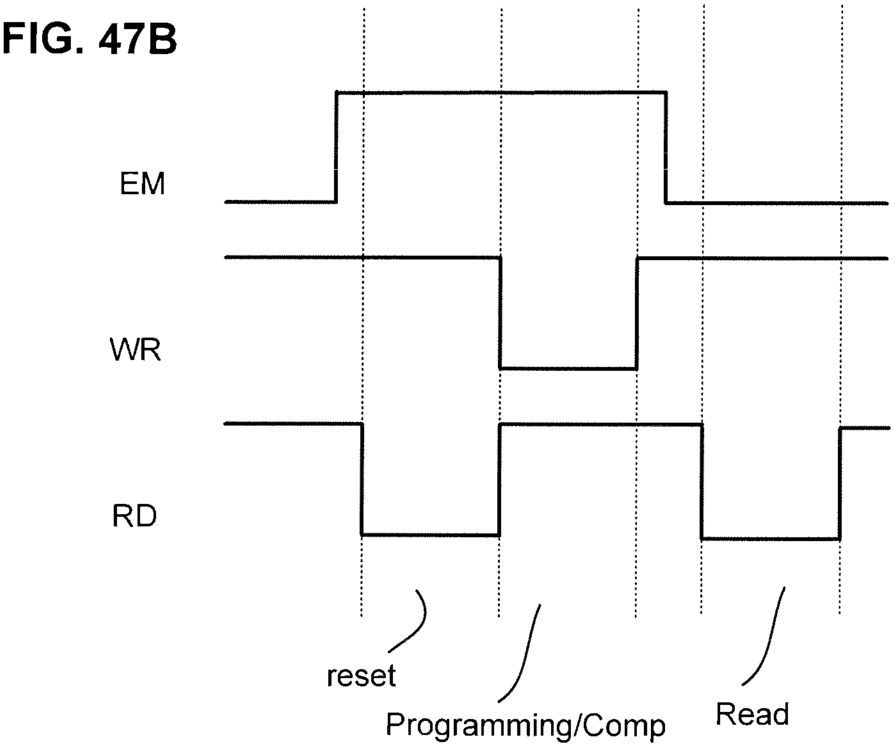
Figure 48A:
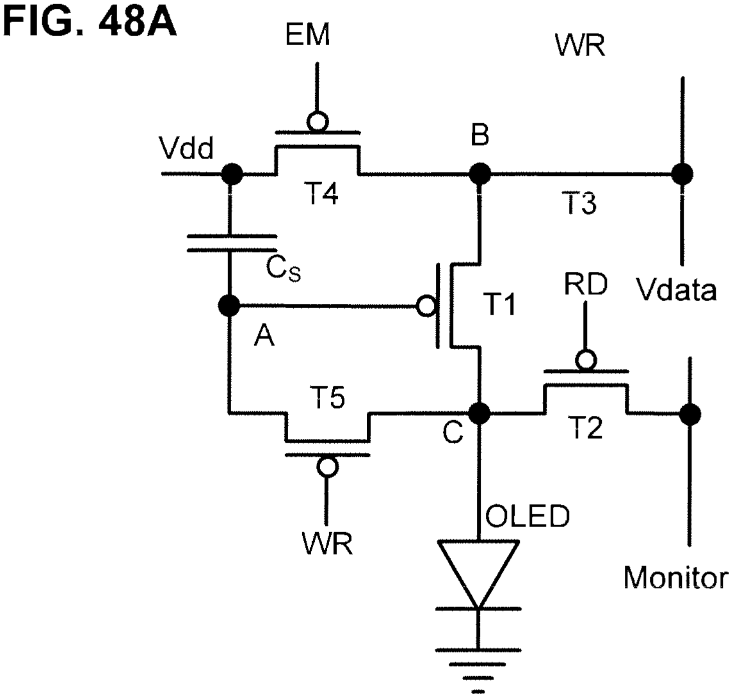
FIGS. 48A and 48B illustrate still another pixel circuit and associated timing diagram having a reset and readout cycle.
Figure 48B:
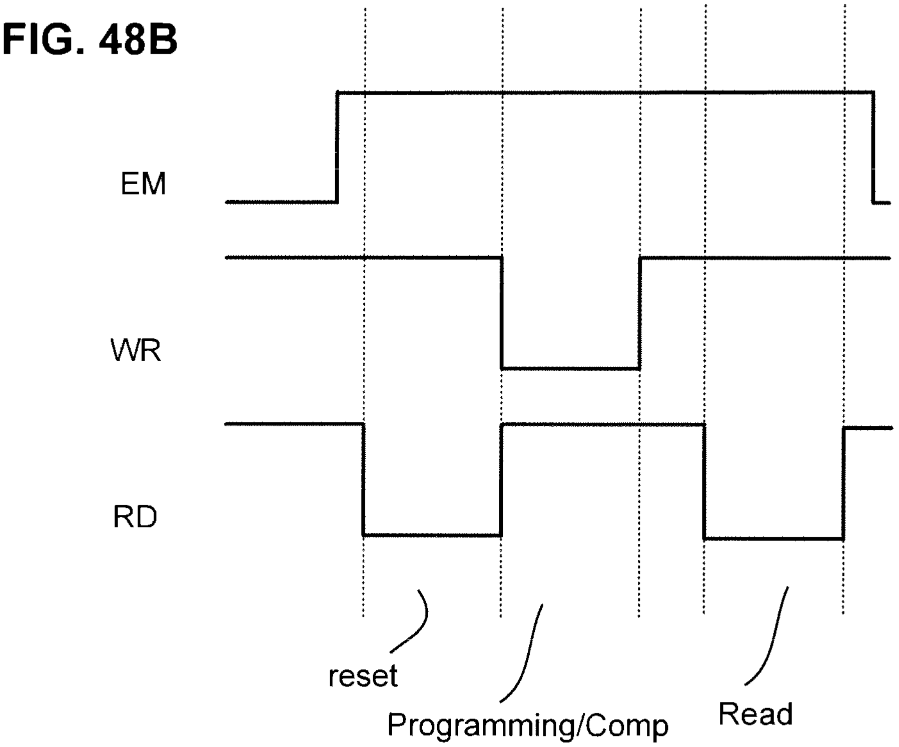
Figure 49A:
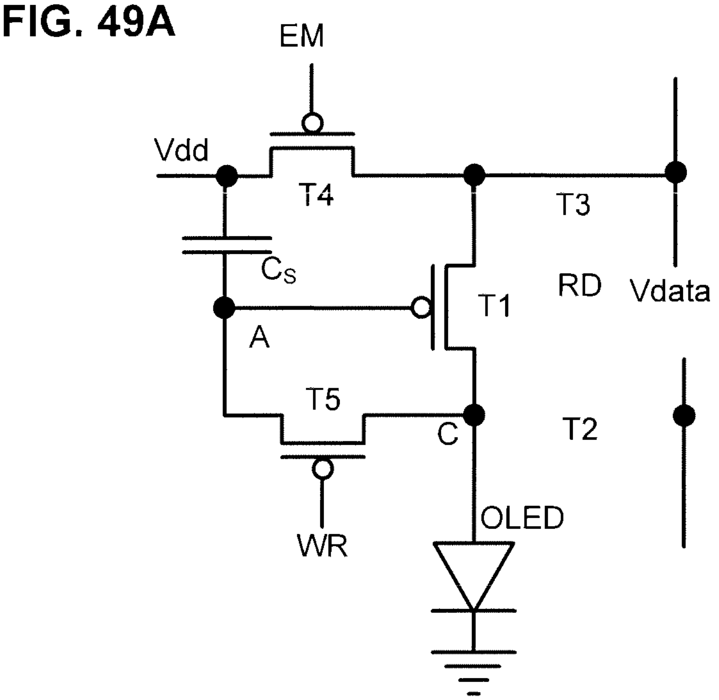
FIGS. 49A and 49B illustrate yet another pixel circuit and associated timing diagram having a readout cycle following a programming cycle.
Figure 49B:
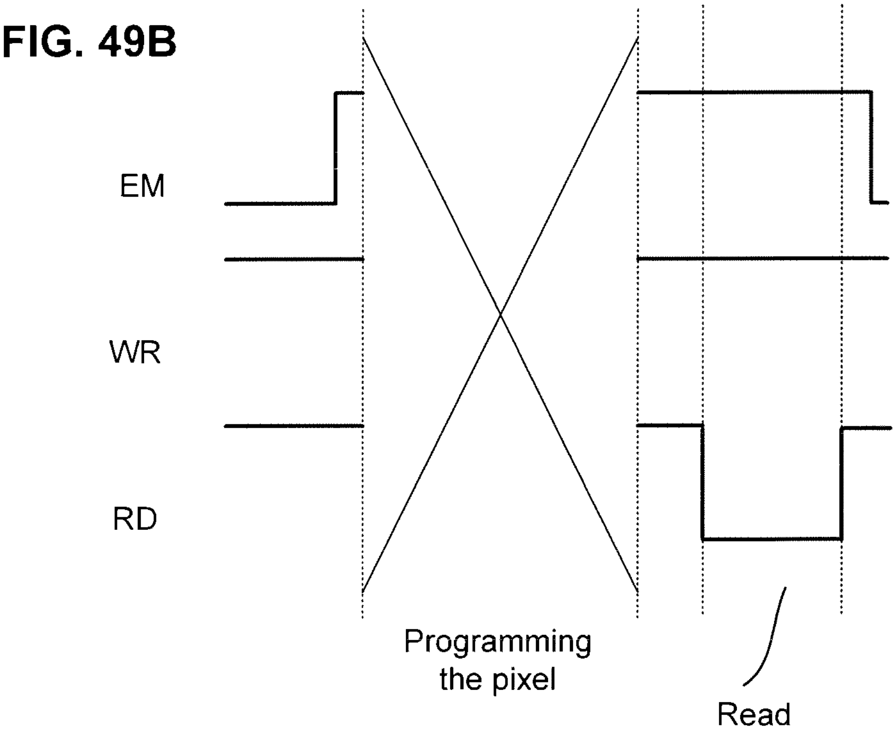

The sharing condition in FIG. 37 is the same as the pixel circuit in FIG. 36, but the programming cycle is different. During the programming cycle, SEM/EM are off, SWR/WR are ON. RD is on at the beginning resetting node B and A to Vref. RD turns off after that and node B and A are charged with T1. The charging amount is a function of T1 parameters. Thus the voltage developed at node A is a function of T1 and will compensate for its non-uniformity/aging during driving/emission cycle.

The operation of the pixel circuit in FIG. 36 and sharing principal is the same as FIG. 37.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of extracting a circuit parameter from a pixel circuit and providing in-pixel compensation for variation or aging of the pixel circuit, the pixel circuit including a light emitting device, a drive transistor to provide a programmable drive current to the light emitting device, a programming input, and a storage device to store a programming signal, the method comprising the steps of:

causing an in-pixel compensation of the pixel circuit by applying a reference voltage from a first line to a storage device in the pixel circuit and redirecting to a second line current from a first node between the drive transistor and the light emitting device to charge the storage device based on the reference voltage to self-compensate for a variation or aging of the drive transistor or the light emitting device or both in the pixel circuit;

extracting, using a circuit external to the pixel circuit, the circuit parameter from the pixel circuit; and subsequently driving the pixel circuit using programming information that has been compensated based on at least the extracted circuit parameter.

2. The method of claim 1, wherein extracting the circuit parameter comprises reading a voltage or a current of at least the drive transistor or at least the light emitting device or at least the drive transistor and the light emitting device.

3. The method of claim 1, wherein the storage device is a capacitor and is connected across a gate and a first terminal of the drive transistor.

4. The method of claim 3, wherein a second terminal of the drive transistor is directly connected to the light emitting device.

5. The method of claim 1, where the pixel circuit internally compensates for variations in a threshold voltage of the drive transistor by charging a second node connected to the drive transistor to the reference voltage and discharging through the drive transistor to the first node to store a charge in the storage device indicative of the threshold voltage of the drive transistor.

6. The method of claim 1, wherein causing the in-pixel compensation of the pixel circuit further comprises supplying a programming voltage to the storage device such that at least some of the programming voltage is used to cause the light emitting device to emit light according to the at least some of the programming voltage.

7. The method of claim 2, wherein extracting the circuit parameter comprises reading a voltage or a current of at least the drive transistor, wherein a voltage of a monitor line connected to a second node connected to the drive transistor for reading the voltage or current of at least the drive transistor is held at a low enough magnitude to keep the light emitting device off.

8. The method of claim 2, wherein extracting the circuit parameter comprises reading a voltage or a current of at least the light emitting device, wherein a voltage applied to the gate of the drive transistor is held at a high enough magnitude so that the drive transistor acts as a switch enabling the reading of the voltage or current of at least the light emitting device over a monitor line connected to a second node connected to the drive transistor.

9. The method of claim 2, wherein extracting the circuit parameter comprises reading the voltage or the current of at least the drive transistor or at least the light emitting device or at least the drive transistor and the light emitting device over the second line.

10. A pixel circuit having a light emitting device, comprising:

a drive transistor connected to the light emitting device;

a storage device coupled to the drive transistor and storing programming information to cause the light emitting device to emit light according to the programming information via the drive transistor;

a first transistor connected between the storage device and a first line for applying a reference voltage from the first line to the storage device; and a second transistor connected between a second line and a first node between the drive transistor and the light emitting device for redirecting to the second line current from the first node;

wherein said applying the reference voltage from the first line to the storage device and said redirecting to the second line current from the first node are for charging the storage device based on the reference voltage to self-compensate for a variation or aging of the drive transistor or the light emitting device or both in the pixel circuit causing an in-pixel compensation of the pixel circuit.

11. The pixel circuit of claim 10, further comprising a third transistor connected between the pixel circuit and a monitor line for extracting a circuit parameter of the pixel circuit and storing the circuit parameter externally to the pixel circuit, wherein the pixel circuit is compensated externally to the pixel circuit for variations or aging of the pixel circuit with use of the extracted circuit parameter.

12. The pixel circuit of claim 11, wherein the third transistor for extracting the circuit parameter is for reading a voltage or a current of at least the drive transistor or at least the light emitting device or at least the drive transistor and the light emitting device.

13. The pixel circuit of claim 10, wherein the storage device comprises a capacitor and is connected across a gate and a first terminal of the drive transistor.

14. The pixel circuit of claim 13, wherein a second terminal of the drive transistor is directly connected to the light emitting device.

15. The pixel circuit of claim 10, wherein the in-pixel compensation of the pixel circuit internally compensates for variations in a threshold voltage of the drive transistor by charging a second node connected to the drive transistor to the reference voltage and discharging through the drive transistor to the first node to store a charge in the storage device indicative of the threshold voltage of the drive transistor.

16. The pixel circuit of claim 10, further comprising a fourth transistor connected between the storage device and a data line for supplying a programming voltage to the storage device such that at least some of the programming voltage is used to cause the light emitting device to emit light according to the at least some of the programming voltage.

17. The pixel circuit of claim 12, wherein the third transistor for extracting the circuit parameter is for reading a voltage or a current of at least the drive transistor, wherein a voltage of a monitor line connected to a second node connected to the drive transistor for reading the voltage or current of at least the drive transistor is held at a low enough magnitude to keep the light emitting device off.

18. The pixel circuit of claim 12, wherein the third transistor for extracting the circuit parameter is for reading a voltage or a current of at least the light emitting device, wherein a voltage applied to the gate of the drive transistor is held at a high enough magnitude so that the drive transistor acts as a switch enabling the reading of the voltage or current of at least the light emitting device over a monitor line connected to a second node connected to the drive transistor.

19. The pixel circuit of claim 12, wherein the third transistor for extracting the circuit parameter is for reading the voltage or the current of at least the drive transistor or at least the light emitting device or at least the drive transistor and the light emitting device over the second line.

* * * * *